(12) United States Patent
Nishimura et al.

(10) Patent No.: US 9,236,551 B2
(45) Date of Patent: Jan. 12, 2016

(54) LIGHT EMITTING DEVICE AND LUMINAIRE

(71) Applicant: Toshiba Lighting & Technology Corporation, Yokosuka-shi, Kanagawa-ken (JP)

(72) Inventors: Kiyoshi Nishimura, Yokosuka (JP); Kazuo Shimokawa, Yokosuka (JP); Nobuhiko Betsuda, Yokosuka (JP); Akihiro Sasaki, Yokosuka (JP); Miho Watanabe, Yokosuka (JP); Hirotaka Tanaka, Yokosuka (JP); Takuya Honma, Yokosuka (JP); Katsuhisa Matsumoto, Yokosuka (JP); Hideki Okawa, Yokosuka (JP)

(73) Assignee: Toshiba Lighting & Technology Corporation, Yokosuka-shi, Kanagawa-ken (JP)

( * ) Notice: Subject to any disclaimer, the term of this patent is extended or adjusted under 35 U.S.C. 154(b) by 0 days.

(21) Appl. No.: 14/014,809

(22) Filed: Aug. 30, 2013

(65) Prior Publication Data

US 2014/0153238 A1    Jun. 5, 2014

(30) Foreign Application Priority Data

Dec. 4, 2012  (JP) ................ 2012-265568
Dec. 7, 2012  (JP) ................ 2012-268465
May 20, 2013  (JP) ................ 2013-106645

(51) Int. Cl.
  *H01L 33/00*   (2010.01)
  *H01L 33/48*   (2010.01)
  (Continued)

(52) U.S. Cl.
  CPC .......... *H01L 33/644* (2013.01); *H01L 25/0753* (2013.01); *H05K 1/0209* (2013.01);
  (Continued)

(58) Field of Classification Search
  CPC . H01L 33/644; H01L 33/505; H01L 25/0753; H01L 25/075
  USPC ............... 257/99, 100, E33.05; 362/237, 293
  See application file for complete search history.

(56) References Cited

U.S. PATENT DOCUMENTS 8,368,113 B2   2/2013  Matsuda et al.
8,616,732 B2   12/2013  Shibusawa et al.
(Continued)

FOREIGN PATENT DOCUMENTS

EP   2360417 A2   8/2011
EP   2390917 A2   11/2011
(Continued)

OTHER PUBLICATIONS

European search report issued in corresponding European Patent Application No. 13182264.5 mailed Feb. 26, 2014.

*Primary Examiner* — Julio J Maldonado
*Assistant Examiner* — Moazzam Hossain
(74) *Attorney, Agent, or Firm* — Banner & Witcoff, Ltd.

(57) ABSTRACT

According to one embodiment, there is provided a light-emitting device including a light-emitting section, a thermal radiation member, and a heat conduction layer. The light-emitting section includes a mounting substrate section and a light-emitting element section. The mounting substrate section includes a substrate, a first metal layer, and a second metal layer. The substrate includes a first principal plane including a mounting region and a second principal plane. The first metal layer includes mounting patterns provided in the mounting region. The light-emitting element section includes semiconductor light-emitting elements and a wavelength conversion layer. The semiconductor light-emitting elements are connected to the mounting patterns. The luminous existence of the light-emitting element section is equal to or higher than 10 lm/mm$^2$ and equal to or lower than 100 lm/mm$^2$. The thermal radiation member has an area equal to or larger than five times the area of the mounting region.

16 Claims, 16 Drawing Sheets

(51) Int. Cl.
  *H01L 23/42* (2006.01)
  *H01L 33/64* (2010.01)
  *H01L 25/075* (2006.01)
  *H05K 1/02* (2006.01)
  *H05K 3/00* (2006.01)
  *F21Y 101/02* (2006.01)
  *H01L 33/50* (2010.01)
  *H05K 1/03* (2006.01)
  *H05K 3/28* (2006.01)

(52) U.S. Cl.
  CPC ........... *H05K3/0061* (2013.01); *F21Y 2101/02* (2013.01); *H01L 33/505* (2013.01); *H01L 33/642* (2013.01); *H01L 2224/16225* (2013.01); *H05K 1/0306* (2013.01); *H05K 3/284* (2013.01); *H05K 2201/0305* (2013.01); *H05K 2201/10106* (2013.01)

(56) References Cited

U.S. PATENT DOCUMENTS

| | | | |
|---|---|---|---|
| 2005/0030760 A1* | 2/2005 | Capello et al. | 362/545 |
| 2005/0139851 A1* | 6/2005 | Sato | 257/99 |
| 2007/0177380 A1* | 8/2007 | Schultz et al. | 362/249 |
| 2009/0251864 A1* | 10/2009 | Saga et al. | 361/704 |
| 2010/0038662 A1* | 2/2010 | Fushimi et al. | 257/98 |
| 2011/0199772 A1 | 8/2011 | Shibusawa et al. | |
| 2011/0215697 A1 | 9/2011 | Tong et al. | |
| 2011/0279015 A1 | 11/2011 | Negley et al. | |
| 2011/0291151 A1* | 12/2011 | Matsuda et al. | 257/99 |

FOREIGN PATENT DOCUMENTS

| | | |
|---|---|---|
| JP | 2011-171320 A | 9/2011 |
| JP | 2012-009886 A | 1/2012 |
| JP | 2012-084733 A | 4/2012 |
| WO | 2011/109088 A2 | 9/2011 |

* cited by examiner

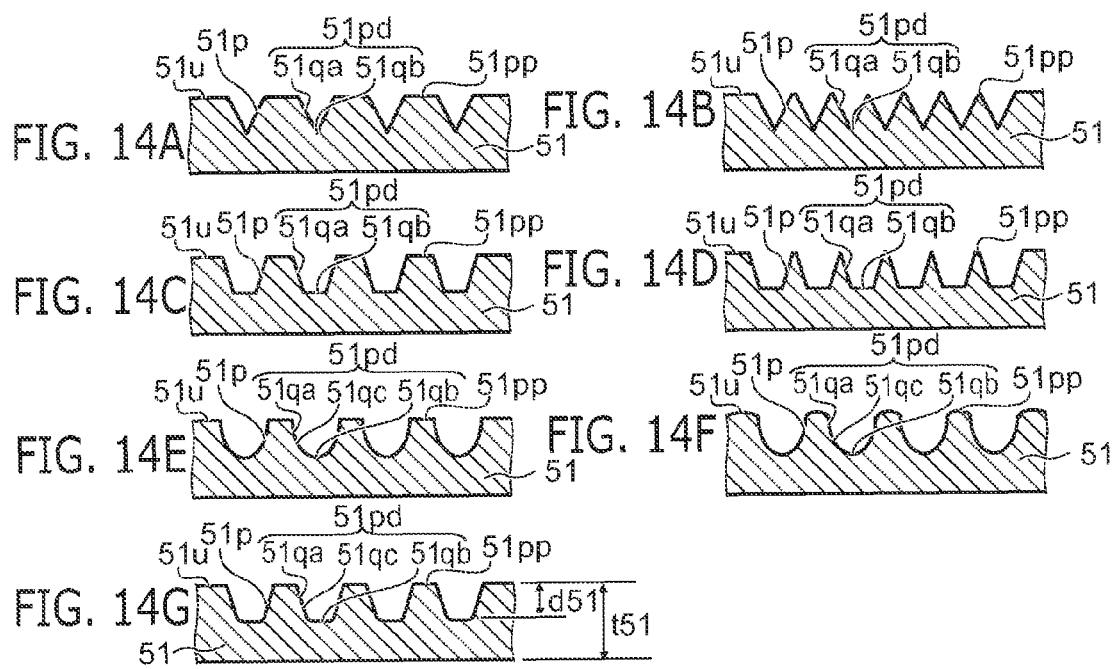
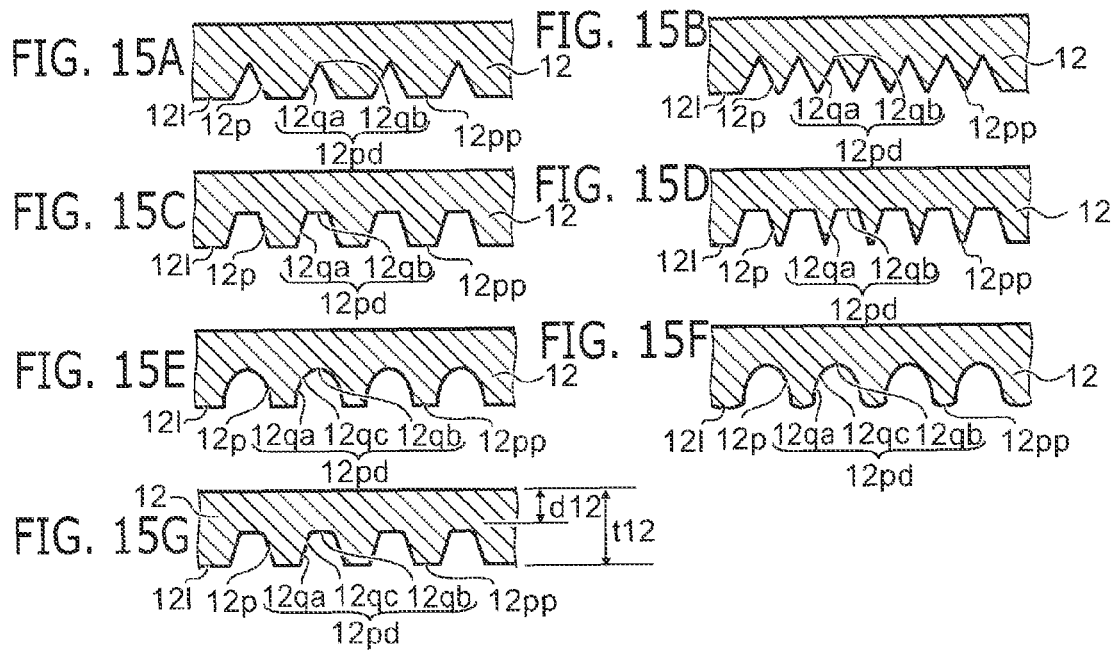

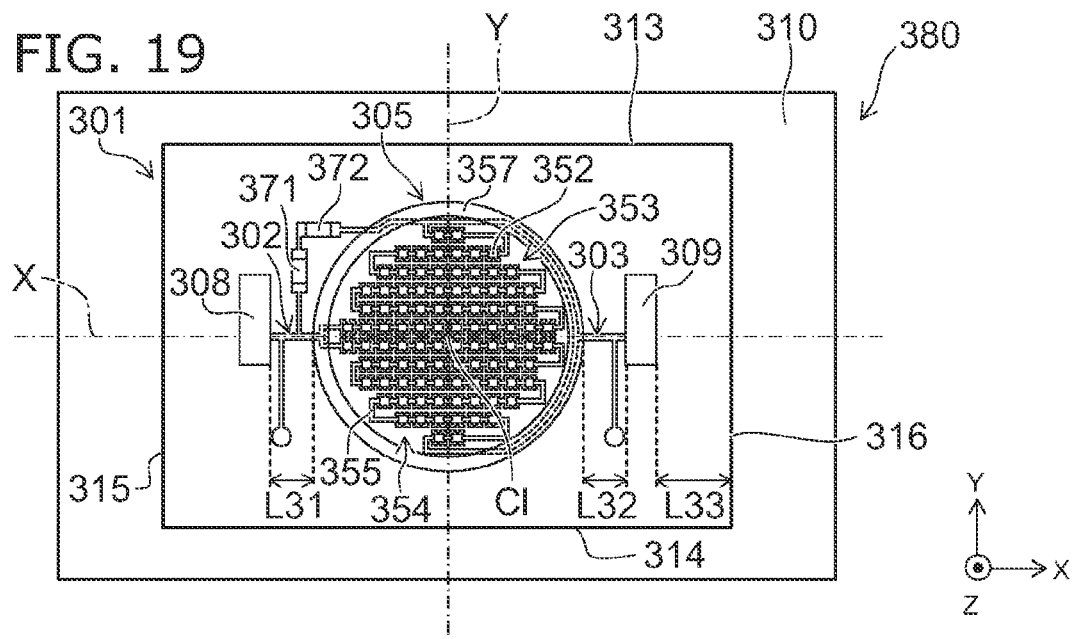
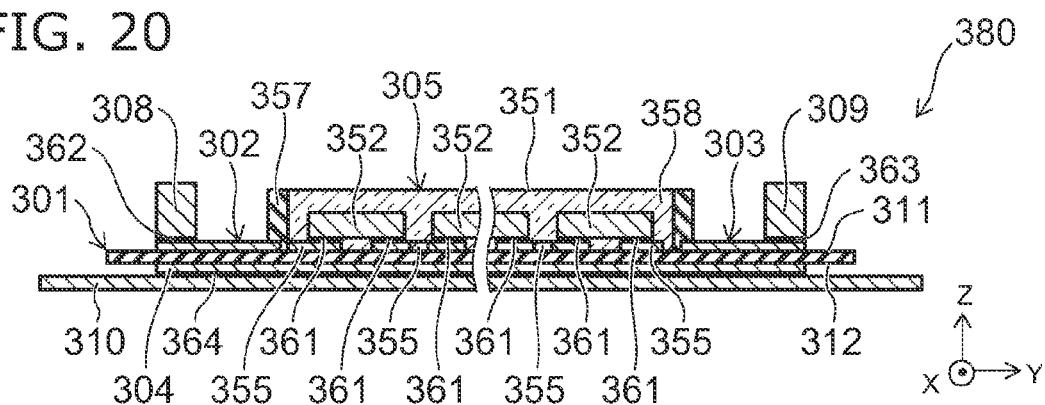
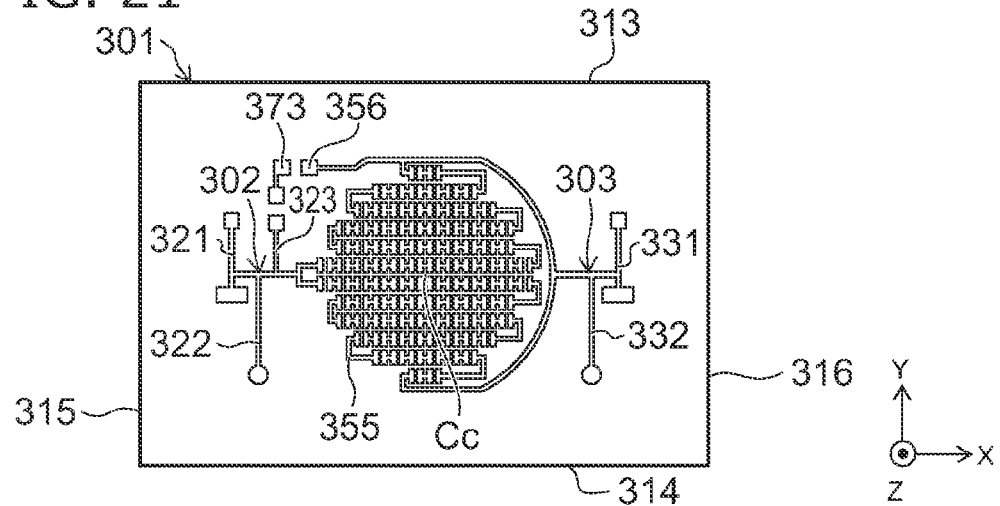

LIGHT EMITTING DEVICE AND LUMINAIRE

CROSS-REFERENCE TO RELATED APPLICATIONS

This application is based upon and claims the benefit of priorities from Japanese Patent Application No. 2012-265568, filed on Dec. 4, 2012, Japanese Patent Application No. 2012-268465, filed on Dec. 7, 2012 and Japanese Patent Application No. 2013-106645, filed on May 20, 2013; the entire contents of which are incorporated herein by reference.

FIELD

Embodiments described herein generally relate to a light-emitting device and a luminaire.

BACKGROUND

For example, there is a light-emitting device in which a semiconductor light-emitting element that emits blue light and a phosphor that converts the wavelength of the light are combined to emit white light. The light-emitting device can be applied to, for example, a luminaire such as a floodlight. In such an application, a light amount per unit area is high. It is necessary to improve thermal radiation properties.

BRIEF DESCRIPTION OF THE DRAWINGS

FIGS. 14A to 14G are schematic sectional views illustrating the light-emitting device;
FIGS. 15A to 15G are schematic sectional views illustrating the light-emitting device;
FIG. 19 is a diagram for explaining a light-emitting device according to an eighth embodiment;
FIG. 20 is a diagram for explaining the cross section of the light-emitting device;
FIG. 21 is a diagram for explaining a state in which members such as light-emitting elements and connectors are removed in the light-emitting device.

DETAILED DESCRIPTION

Figure 1A:
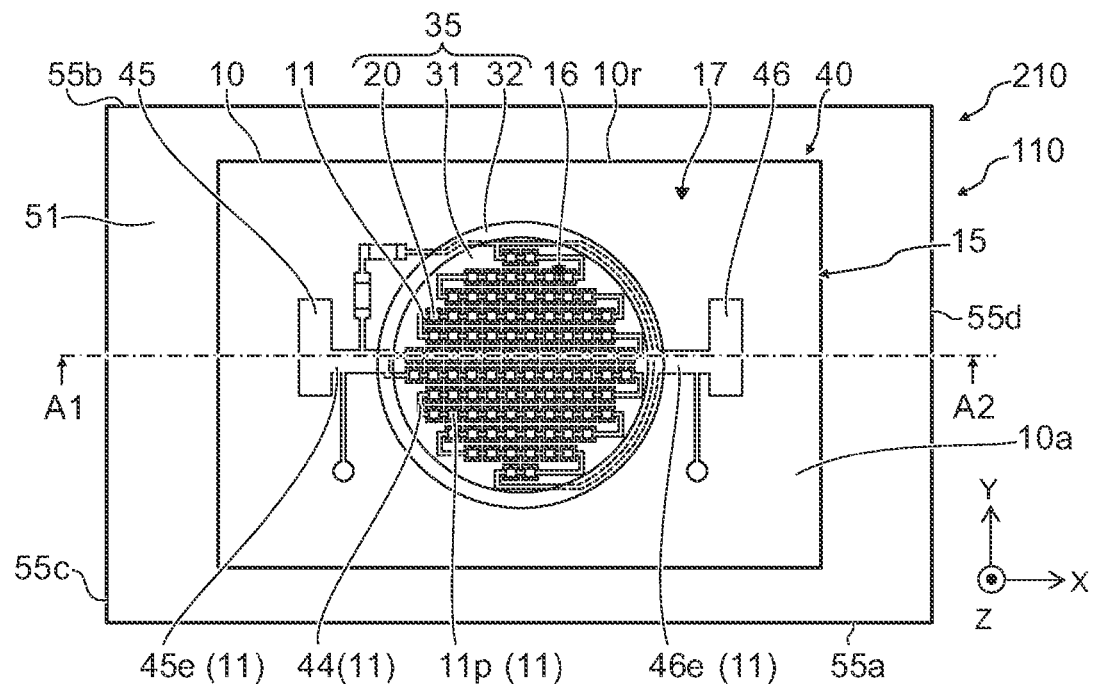
FIGS. 1A and 1B are schematic diagrams illustrating a light-emitting device and a luminaire according to a first embodiment.

In general, according to one embodiment, there is provided a light-emitting device including a light-emitting section, a thermal radiation member, and a heat conduction layer. The light-emitting section includes a mounting substrate section and a light-emitting element section. The mounting substrate section includes a substrate, a first metal layer, and a second metal layer. The substrate includes a first principal plane including a mounting region and a second principal plane on the opposite side of the first principal plane and is insulative. The first metal layer is provided on the first principal plane. The first metal layer includes a plurality of mounting patterns provided in the mounting region. The second metal layer is provided on the second principal plane and electrically insulated from the first metal layer. At least a part of the second metal layer overlaps the mounting region when projected on a first plane parallel to the first principal plane. The light-emitting element section includes a plurality of semiconductor light-emitting elements and a wavelength conversion layer. The plurality of semiconductor light-emitting elements are provided on the first principal plane. Each of the plurality of semiconductor light-emitting elements is electrically connected to any one mounting pattern among the plurality of mounting patterns and another one mounting pattern adjacent to the mounting pattern among the plurality of mounting patterns. The wavelength conversion layer covers at least parts of the plurality of semiconductor light-emitting elements, absorbs at least a part of first light emitted from the plurality of semiconductor light-emitting elements, and emits second light having a wavelength different from the wavelength of the first light. The luminous existence of light emitted from the light-emitting element section is equal to or higher than 10 $lm/mm^2$ and equal to or lower than 100 $lm/mm^2$. The thermal radiation member is opposed to the second principal plane. The thermal radiation member has an area equal to or larger than five times the area of the mounting region when projected on the first plane. The heat conduction layer is provided between the thermal radiation member and the second metal layer.

According to another embodiment, there is provided a luminaire including a luminaire member and a light-emitting device provided on the luminaire member. The light-emitting device includes a light-emitting section, a thermal radiation member, and a heat conduction layer. The light-emitting section includes a mounting substrate section and a light-emitting element section. The mounting substrate section includes an insulative substrate including a first principal plane including a mounting region and a second principal plane on an opposite side of the first principal plane; a first metal layer provided on the first principal plane and including a plurality of mounting patterns provided in the mounting region; and a second metal layer provided on the second principal plane and electrically insulated from the first metal layer, at least a part of the second metal layer overlapping the mounting region when projected on a first plane parallel to the first principal plane. The light-emitting element section includes a plurality of semiconductor light-emitting elements provided on the first principal plane, each of the plurality of semiconductor light-emitting elements being electrically connected to any one mounting pattern among the plurality of mounting patterns and another one mounting pattern adjacent to the mounting pattern among the plurality of mounting patterns; and a wavelength conversion layer configured to cover at least parts of the plurality of semiconductor light-emitting elements, absorb at least a part of first light emitted from the plurality of semiconductor light-emitting elements, and emit second light having a wavelength different from a wavelength of the first light. Luminous existence of light emitted from the light-emitting element section is equal to or higher than 10 lm/mm$^2$ and equal to or lower than 100 lm/mm$^2$. The thermal radiation member is opposed to the second principal plane and having an area equal to or larger than five times an area of the mounting region when projected on the first plane. The heat conduction layer is provided between the thermal radiation member and the second metal layer. Heat conductivity of the thermal radiation member is larger than heat conductivity of the luminaire member and equal to or higher than 300 W/(m·K).

According to another embodiment, there is provided a light-emitting device including a ceramic substrate, a first metal layer, a second metal layer, a third metal layer, a light-emitting section, a first connector, a second connector, and a thermal radiation plate. The ceramic substrate includes a first surface and a second surface. The second surface is located on the opposite side of the first surface. The ceramic substrate has a pair of first end sides and a pair of second end sides. The pair of second end sides are orthogonal to the first end sides. The pair of second end sides have length equal to or smaller than the length of the first end sides. The first metal layer and the second metal layer are formed on the first surface. The third metal layer is formed on the second surface. One end of the light-emitting section is electrically connected to one end side of the first metal layer. The other end of the light-emitting section is electrically connected to one end side of the second metal layer. The first connector is provided on the other end side of the first metal layer. The second connector is provided on the other end side of the second metal layer. The thermal radiation plate is made of metal. The thermal radiation plate is connected to the third metal layer to be opposed to the ceramic substrate via a solder layer. When an axis passing the center of the ceramic substrate and extending along the first end sides is represented as first axis and an axis passing the center of the ceramic substrate and extending along the second end sides is represented as second axis, the light-emitting section is arranged such that the center of the light-emitting section substantially coincides with the center of the ceramic substrate. The center of the light-emitting section, the first connector, and the second connector are arranged on the first axis. The first connector and the second connector are arranged to hold the light-emitting section therebetween.

Embodiments are explained below with reference to the drawings.

Note that the drawings are schematic or conceptual. Relations between the thicknesses and the widths of sections, ratios of sizes among the sections, and the like are not always the same as real ones. Even when the same sections are illustrated, the sections are illustrated in different dimensions and ratios depending on the drawings.

In this specification and the drawings, components same as those already described with reference to the drawings are denoted by the same reference numerals and signs and detailed explanation of the components is omitted.

First Embodiment

Figure 1B:
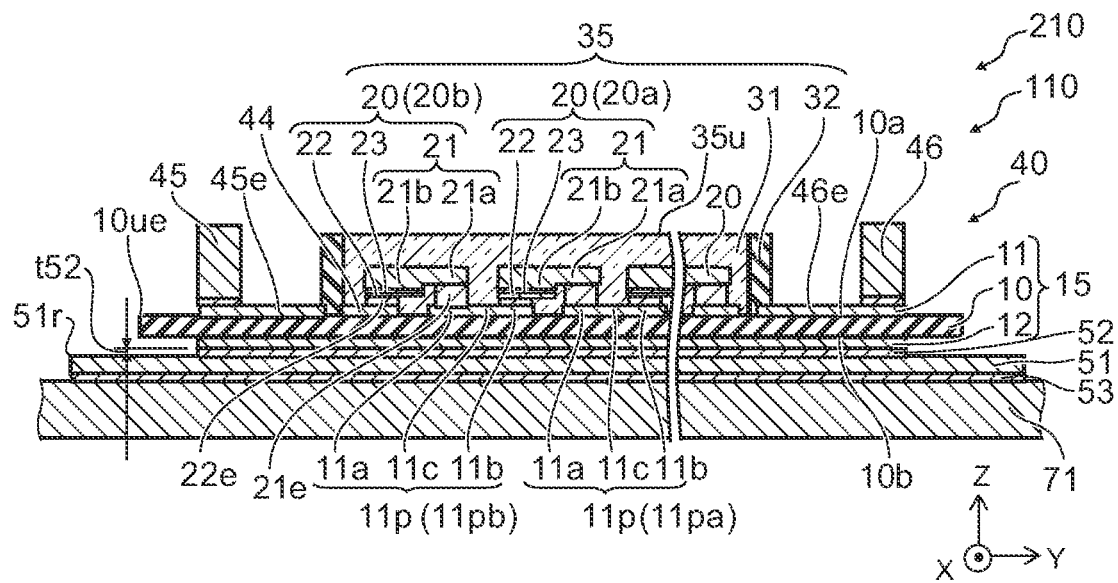

FIGS. 1A and 1B are schematic diagrams illustrating a light-emitting device and a luminaire according to a first embodiment.

FIG. 1A is a plan view, FIG. 1B is a sectional view illustrating a part of an A1-A2 cross section of FIG. 1A.

As illustrated in FIGS. 1A and 1B, a light-emitting device 110 according to this embodiment includes a light-emitting section 40, a thermal radiation member 51, and a heat conduction layer 52.

The light-emitting section 40 is provided on the thermal radiation member 51. The heat conduction layer 52 is provided between the thermal radiation member 51 and the light-emitting section 40.

That is, the heat conduction layer 52 is provided on the thermal radiation member 51 and the light-emitting section 40 is provided on the heat conduction layer 52. In this example, one light-emitting section 40 is provided on the thermal radiation member 51. As explained below, a plurality of the light-emitting sections 40 may be provided on one thermal radiation member 51.

In this specification, a state in which a component is provided on the other component includes a state in which the component is directly provided on the other component and a state in which another component is inserted between the component and the other component.

A direction extending from the thermal radiation member 51 to the light-emitting section 40 is referred to as superimposing direction. In this specification, a state in which components are superimposed includes a state in which the components are directly superimposed in contact with each other and a state in which the components are superimposed with another component inserted therebetween.

The superimposing direction is represented as Z-axis direction. One axis direction perpendicular to the Z-axis direction is represented as X-axis direction. A direction perpendicular to the Z-axis direction and perpendicular to the X-axis direction is represented as Y-axis direction.

The thermal radiation member 51 is, for example, tabular. The principal plane of the thermal radiation member 51 is, for example, substantially parallel to an X-Y plane. A plane shape of the thermal radiation member 51 is, for example, a rectangular shape. The thermal radiation member 51 has, for example, first to fourth sides 55a to 55d. The second side 55b is separated from the first side 55a. The third side 55c connects one end of the first side 55a and one end of the second side 55b. The fourth side 55d is separated from the third side 55c and connects the other end of the first side 55a and the other end of the second side 55b. A corner portion of the plane shape of the thermal radiation member 51 may be curved. The plane shape of the thermal radiation member 51 does not have to be the rectangular shape and is arbitrary.

A substrate made of metal or the like is used as the thermal radiation member 51. Copper, aluminum, or the like is used as the thermal radiation member 51.

The light-emitting section 40 emits light. At the same time, the light-emitting section 40 emits heat. The heat conduction layer 52 efficiently conducts the heat generated by the light-emitting section 40 to the thermal radiation member 51. Solder or the like is used as the heat conduction layer 52. That is, the heat conduction layer 52 includes the solder. In this case, the heat conduction layer 52 joins the light-emitting section 40 and the thermal radiation member 51. For example, an AuSn alloy or the like is used as the heat conduction layer 52.

Liquid or solid lubricant (grease) or the like may be used as the heat conduction layer 52. In order to further improve heat conductivity than the heat conductivity of the lubricant (the grease), lubricant having conductivity obtained by mixing metal powder of alumina or the like in silicone (conductive grease) or the like may be used as the heat conduction layer 52.

The light-emitting section 40 includes a mounting substrate section 15 and a light-emitting element section 35.

The mounting substrate section 15 includes a substrate 10, a first metal layer 11, and a second metal layer 12.

The substrate 10 includes a first principal plane 10a and a second principal plane 10b. The second principal plane 10b is a surface on the opposite side of the first principal plane 10a. The thermal radiation member 51 is opposed to the second principal plane 10b of the substrate 10. In other words, the second principal plane 10b is a surface on the thermal radiation member 51 side.

In this specification, a state in which a component is opposed to the other component includes a state in which the components directly face each other and a state in which another component is inserted between the components.

The first principal plane 10a includes a mounting region 16. For example, the mounting region 16 is separated from an outer edge 10r of the first principal plane 10a. In this example, the mounting region 16 is provided in the center portion of the first principal plane 10a. The first principal plane 10a further includes a peripheral region 17. The peripheral region 17 is provided around the mounting region 16. An example of the mounting region 16 is explained below.

The substrate 10 is insulative. A ceramic substrate or the like is used as the substrate 10. For example, the substrate 10 includes alumina. For example, a ceramic substrate containing alumna as a main component is used as the substrate 10.

The first metal layer 11 is provided on the first principal plane 10a. The first metal layer 11 includes a plurality of mounting patterns 11p. The plurality of mounting patterns 11p are provided in the mounting region 16. At least any two or more of the plurality of mounting patterns 11p are separated from one another. For example, at least any one of the plurality of mounting patterns 11p is islet. Two of the plurality of mounting patterns 11p are independent from each other. The plurality of mounting patterns 11p includes, for example, a first mounting pattern 11pa and a second mounting pattern 11pb.

Each of the plurality of mounting patterns 11p includes, for example, a first mounting portion 11a and a second mounting portion 11b. In this example, the mounting pattern 11p further includes a third mounting portion 11c. The third mounting portion 11c is provided between the first mounting portion 11a and the second mounting portion 11b and connects the first mounting portion 11a and the second mounting portion 11b. An example of the mounting portions is explained below.

The first metal layer 11 may further includes a connecting section 44 configured to connect the plurality of mounting patterns 11p one another. In this example, the first metal layer 11 further includes an electrode section for first connector 45e and an electrode section for second connector 46e. The electrode section for first connector 45e is electrically connected to one of the plurality of mounting patterns 11p. The electrode section for second connector 46e is electrically connected another one of the plurality of mounting patterns 11p. As explained below, a semiconductor light-emitting element is arranged on a part of one mounting pattern 11p. The electrode section for first connector 45e is electrically connected to one of the mounting patterns 11p by the semiconductor light-emitting element. Further, a semiconductor light-emitting element is arranged on a part of another one mounting pattern 11p. The electrode section for second connector 46e is electrically connected to another one of the mounting patterns 11p.

An example of the first metal layer 11 is explained below.

In this example, the light-emitting section 40 further includes a first connector 45 and a second connector 46 provided on the first principal plane 10a. The first connector 45 is electrically connected to the electrode section for first connector 45e. The second connector 46 is electrically connected to the electrode section for second connector 46e. In this example, the first connector 45 is provided on the electrode section for first connector 45e. The second connector 46 is provided on the electrode section for second connector 46e. The light-emitting element section 35 is arranged between the first connector 45 and the second connector 46. Electric power is supplied to the light-emitting section 40 via the connectors.

The second metal layer 12 is provided on the second principal plane 10b. The second metal layer 12 is electrically insulated from the first metal layer 11. At least a part of the second metal layer 12 overlaps the mounting region 16 when projected on an X-Y plane (a first plane parallel to the first principal plane 10a).

As explained above, the first metal layer 11 is provided on the upper surface (the first principal plane 10a) of the substrate 10 and the second metal layer 12 is provided on the lower surface (the second principal plane 10b) of the substrate 10.

The light-emitting element section 35 is provided on the first principal plane 10a of the substrate 10. The light-emitting element section 35 includes a plurality of semiconductor light-emitting elements 20 and a wavelength conversion layer 31.

The plurality of semiconductor light-emitting elements 20 are provided on the first principal plane 10a. Each of the plurality of semiconductor light-emitting elements 20 emits light. The semiconductor light-emitting element 20 includes, for example, a nitride semiconductor. The semiconductor light-emitting element 20 includes, for example, $In_yAl_zGa_{1-x-y}N$ ($0 \le x \le 1$, $0 \le y \le 1$, $x+y \le 1$). However, in this embodiment, a semiconductor light-emitting element is arbitrary.

The plurality of semiconductor light-emitting elements 20 include, for example, a first semiconductor light-emitting element 20a and a second semiconductor light-emitting element 20b. Each of the plurality of semiconductor light-emitting elements 20 is electrically connected to any one mounting pattern 11p among the plurality of mounting patterns 11p and another one mounting pattern 11p adjacent to the mounting pattern 11p among the plurality of mounting patterns 11p.

For example, the first semiconductor light-emitting element 20a is electrically connected to the first mounting pattern 11pa and the second mounting pattern 11pb among the plurality of mounting patterns 11p. The second mounting pattern 11*pb* is equivalent to another mounting pattern 11*p* adjacent to the first mounting pattern 11*pa*.

For example, each of the plurality of semiconductor light-emitting elements 20 includes a first semiconductor layer 21 of a first conduction type, a second semiconductor layer 22 of a second conduction type, and a light-emitting layer 23. For example, the first conduction type is an n type and the second conduction type is a p type. The first conduction type may be the p type and the second conduction type may be the n type.

The first semiconductor layer 21 includes a first portion (a first semiconductor portion 21*a*) and a second portion (a second semiconductor portion 21*b*). The second semiconductor portion 21*b* is parallel to the first semiconductor portion 21*a* in the direction (e.g., the X-axis direction) crossing the superimposing direction (the Z-axis direction extending from the thermal radiation member 51 to the light-emitting section 40).

The second semiconductor layer 22 is provided between the second semiconductor portion 21*b* and the mounting substrate portion 15. The light-emitting layer 23 is provided between the second semiconductor portion 21*b* and the second semiconductor layer 22.

The semiconductor light-emitting element 20 is, for example, an LED of a flip-chip type.

For example, the first semiconductor portion 21*a* of the first semiconductor layer 21 is opposed to the first mounting portion 11*a* of the mounting pattern 11*p*. The second semiconductor layer 22 is opposed to the second mounting portion 11*b* of the mounting pattern 11*p*. The first semiconductor portion 21*a* of the first semiconductor layer 21 is electrically connected to the first mounting portion 11*a*. The second semiconductor layer 22 is electrically connected to the second mounting portion 11*b*. Solder, a gold bump, or the like is used for the connection. The connection is performed by, for example, metal melting or solder joining. Alternatively, the connection is performed by, for example, an ultrasonic thermo-compression bonding method using a gold bump.

That is, for example, the light-emitting element section 35 further includes a first joining metal member 21*e* and a second joining metal member 22*e*. The first joining metal member 21*e* is provided between the first semiconductor portion 21*a* and any one of the mounting patterns 11*p* (e.g., the first mounting portion 11*a*). The second joining metal member 22*e* is provided between the second semiconductor layer 22 and another mounting pattern 11*p* (e.g., the second mounting pattern 11*pb*). At least one of the first joining metal member 21*e* and the second joining metal member 22*e* includes solder or a gold bump. Consequently, a sectional area (a sectional area cut along the X-Y plane) of each of the first joining metal member 21*e* and the second joining metal member 22*e* can be increased. Consequently, it is possible to efficiently transfer heat to the mounting substrate section 15 via the first joining metal member 21*e* and the second joining metal member 22*e*, and thereby improving heat radiation properties.

The wavelength conversion layer 31 covers at least parts of the plurality of semiconductor light-emitting elements 20. The wavelength conversion layer 31 absorbs at least a part of light (e.g., first light) emitted from the plurality of semiconductor light-emitting elements 20 and emits second light. The wavelength (e.g., peak wavelength) of the second light is different from the wavelength (e.g., peak wavelength) of the first light. The wavelength conversion layer 31 includes a plurality of wavelength conversion particles such as phosphors and light transmissive resin in which the plurality of wavelength conversion particles are dispersed. The first light includes, for example, blue light. The second light includes light having wavelength larger than the wavelength of the first light. The second light includes, for example, at least one of yellow light and red light.

In this example, the light-emitting element section 35 further includes a reflecting layer 32. The reflecting layer 32 surrounds the wavelength conversion layer 31 in the X-Y plane. The reflecting layer 32 includes a plurality of particles such as metal oxides and light transmissive resin in which the particles are dispersed. The particles of the metal oxide or the like have light-reflectance. As the particles of the metal oxide or the like, for example, at least one of $TiO_2$ and $Al_2O_3$ can be used. Since the reflecting layer 32 is provided, light emitted from the semiconductor light-emitting elements 20 can be efficiently emitted along a direction (e.g., the upper direction) parallel to the superimposing direction.

The light-emitting section 40 is, for example, an LED module of a chip-on-board (COB) type.

In this embodiment, the luminous existence of light emitted from the light-emitting element section 35 is equal to or higher than 10 $lm/mm^2$ (lumen/square millimeter) and equal to or lower than 100 $lm/mm^2$. Desirably, the luminous existence is equal to or higher than 20 $lm/mm^2$. That is, in this embodiment, a ratio of the light emitted from the light-emitting element section 35 to a light emission area (luminous existence) is extremely high. In this specification, the light emission area substantially corresponds to the area of the mounting region 16.

The light-emitting device 110 according to this embodiment is used for, for example, a floodlight.

As illustrated in FIG. 1B, the light-emitting device 110 is arranged, for example, on a luminaire member 71. In FIG. 1A, the luminaire member 71 is omitted. The luminaire member 71 is a part of a luminaire. A connecting member for luminaire 53 is provided between the luminaire member 71 and the light-emitting device 110. For example, solder or grease is used as the connecting member for luminaire 53. For example, the heat of the light-emitting device 110 is conducted to the luminaire member 71 by the connecting member for luminaire 53 and radiated.

FIGS. 1A and 1B also illustrate the configuration of a luminaire 210 including the light-emitting device 110. The luminaire 210 includes the luminaire member 71 and the light-emitting device 110. The light-emitting device 110 is provided on the luminaire member 71. The luminaire 210 may further include the connecting member for luminaire 53. The connecting member for luminaire 53 is provided between the luminaire member 71 and the light-emitting device 110 and set in contact with the thermal radiation member 51 of the light-emitting device 110 and the luminaire member 71. The connecting member for luminaire 53 may be included in the light-emitting device 110.

In the light-emitting device 110 according to this embodiment, the thermal radiation member 51 has an area equal to or larger than five times the area of the mounting region 16 when projected on the X-Y plane (the first plane).

That is, in this embodiment, the area of the thermal radiation member 51 is set extremely large with respect to the area of the mounting region 16. Consequently, heat generated in the light-emitting element section 35 provided on the mounting region 16 is spread in an in-plane direction (an in-X-Y plane direction) by the thermal radiation member 51 having the large area. The heat spread in the in-plane direction is transmitted to, for example, the luminaire member 71, to which the light-emitting device 110 is attached, and efficiently radiated.

An example of the mounting region 16, the first metal layer 11, and the second metal layer 12 is explained.

Figure 2A:
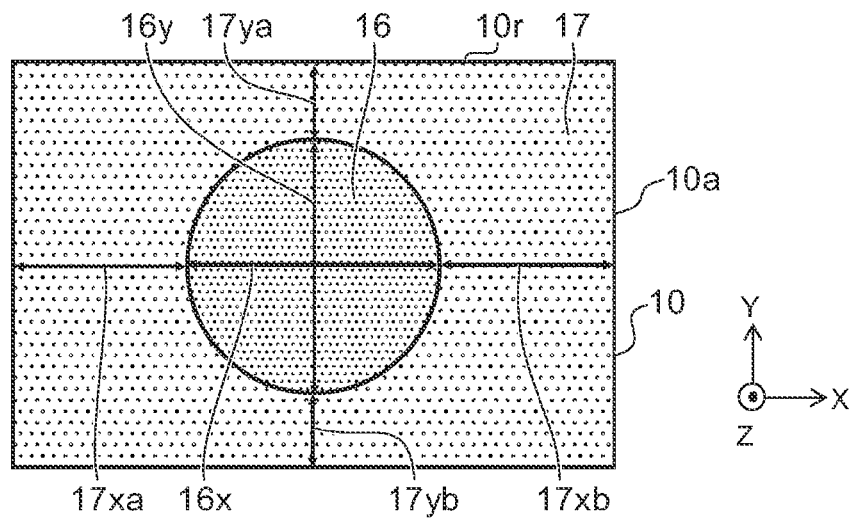
FIGS. 2A to 2C are schematic plan views illustrating the light-emitting device.
Figure 2B:
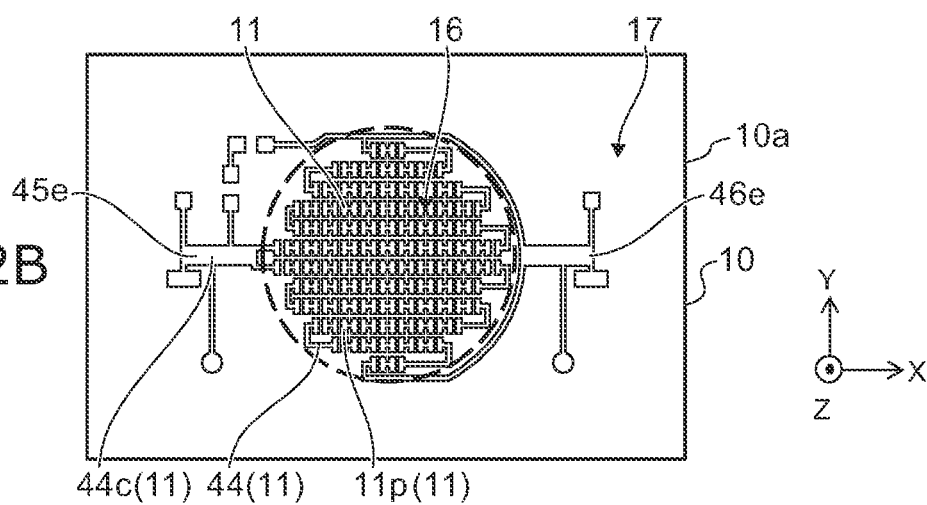
Figure 2C:
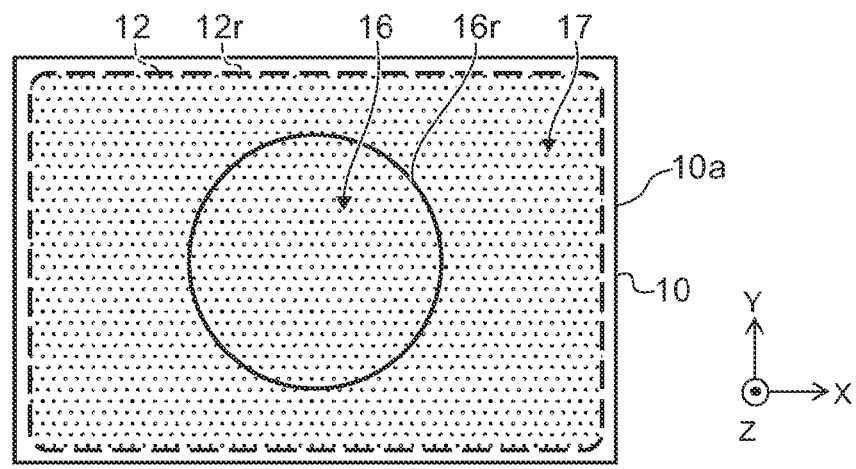

FIGS. 2A to 2C are schematic plan views illustrating the light-emitting device according to the first embodiment.

FIG. 2A is a plan view illustrating a first principal plane 10a of the substrate 10. FIG. 2B is a plan view illustrating a pattern of the first metal layer 11. FIG. 2C is a plan view illustrating a pattern of the second metal layer 12.

As illustrated in FIG. 2A, the first principal plane 10a includes the mounting region 16 and the peripheral region 17. In this example, a pattern of the mounting region 16 is substantially circular. The center of the mounting region 16 is provided to substantially coincide with the center of the substrate 10. The peripheral region 17 is a region around the mounting region 16.

The area of the peripheral region 17 is larger than the area of the mounting region 16. The area of the peripheral region 17 is equal to or larger than four times the area of the mounting region 16. The area of the peripheral region 17 is preferably equal to or smaller than nine times the area of the mounting region 16.

For example, a distance (a shortest distance) between an end (the outer edge 10r) of the first principal plane 10a extending along one direction (e.g., the X-axis direction) parallel to the first principal plane 10a and passing the center of the mounting region 16 and the mounting region 16 is equal to or larger than ½ of the width of the mounting region 16 extending along the direction (the X-axis direction) passing the center. For example, a distance 17xa (a shortest distance) between the outer edge 10r extending along the X-axis direction and the mounting region 16 is equal to or larger than ½ of width 16x of the mounting region 16. For example, a distance 17xb (a shortest distance) between the outer edge 10r extending along the X-axis direction and the mounting region 16 is equal to or larger than ½ of the width 16x of the mounting region 16. For example, a distance 17ya (a shortest distance) between the outer edge 10r extending along the Y-axis direction and the mounting region 16 is equal to or larger than ½ of width 16y of the mounting region 16. For example, a distance 17yb (a shortest distance) between the outer edge 10r extending along the Y-axis direction and the mounting region 16 is equal to or larger than ½ of the width 16y of the mounting region 16.

Consequently, the area of the peripheral region 17 is larger than the area of the mounting region 16. Since the area of the peripheral region 17 is set larger than the area of the mounting region 16 in which heat is generated, the generated heat efficiently spreads along the in-plane direction. Consequently, thermal radiation properties are improved.

As illustrated in FIG. 2B, the plurality of mounting patterns 11p, which are parts of the first metal layer 11, are provided in the mounting region 16. In this example, the plurality of mounting patterns 11p are provided in a circular region. In other words, a region where the plurality of mounting patterns 11p are provided is the mounting region 16. The mounting region 16 is a region including the plurality of mounting patterns 11p when projected on the X-Y plane. Regions among the plurality of mounting patterns 11p are included in the mounting region 16. The inner side of a line connecting, in a shortest distance, the outer edges of the mounting patterns 11p arranged on the outer side among the plurality of mounting patterns 11p is the mounting region 16.

In order to improve the luminous exitance, the plurality of mounting patterns 11p are arranged, for example, in a substantially circular region. In this case, practically, a substantially circular region including the plurality of mounting patterns 11p may be used as the mounting region 16.

The mounting region 16 includes a region where the plurality of mounting patterns 11p projected on the X-Y plane are provided. The mounting region 16 does not include, when projected on the X-Y plane, a region where the connecting section 44, the electrode section for first connector 45e, and the electrode section for second connector 46e are provided. The area is included in the peripheral region 17.

As explained above and illustrated in FIG. 2B, parts of the plurality of mounting patterns 11p are independent from one another, independent two mounting patterns 11p adjacent to each other are electrically connected by the semiconductor light-emitting elements 20 arranged on the mounting patterns 11p. Parts of the plurality of semiconductor light-emitting elements 20 are, for example, connected in series. The plurality of semiconductor light-emitting elements 20 connected in series are, for example, arranged side by side along the X-axis direction.

Further, for example, two of the plurality of mounting patterns 11p are connected by the connecting section 44. Consequently, a group of the plurality of semiconductor light-emitting elements 20 connected in series is further connected. A group of the plurality of semiconductor light-emitting elements arranged side by side along the X axis and connected in series are arranged side by side along the Y-axis direction. A group of the plurality of semiconductor light-emitting elements arranged connected in series are connected in parallel to each other.

Further, the mounting pattern 11p is electrically connected to the electrode section for first connector 45e or the electrode section for second connector 46e via a wiring pattern 44c. An electric current is supplied to the mounting pattern 11p via the first connector 45 provided on the electrode section for first connector 45e and the second connector 46 provided on the electrode section for second connector 46e. The electric current is supplied to the semiconductor light-emitting elements 20 and light is generated.

As illustrated in FIG. 2C, the area of the second metal layer 12 is designed large. The area of the second metal layer 12 is larger than the area of the mounting region 16. The area of the second metal layer 12 projected on the X-Y plane (the first plane parallel to the superimposing direction) is equal to or larger than 95% of the area of the second principal plane 10b. The efficiency of radiation of heat is improved by setting the area of the second metal layer 12 large.

A plane pattern of the heat conductive layer 52 substantially extends along a pattern of the second metal layer 12. It is possible to expand the area of the heat conduction layer 52 by setting the area of the second metal layer 12 large. Consequently, it is possible to improve the efficiency of heat conduction via the heat conduction layer 52.

For example, an outer edge 12r of the second metal layer 12 projected on the X-Y plane (the first plane) is located on the outer side of an outer edge 16r of the mounting region 16.

The area of the second metal layer 12 projected on the X-Y plane (the first plane) may be smaller than the area of the mounting region 16. In this case, the area of the second metal layer 12 projected on the X-Y plane (the first plane) is still larger than 80% of the area of the mounting region 16. If the area of the second metal layer 12 is smaller than 80% of the area of the mounting region 16, the efficiency of thermal radiation falls.

Figure 3:
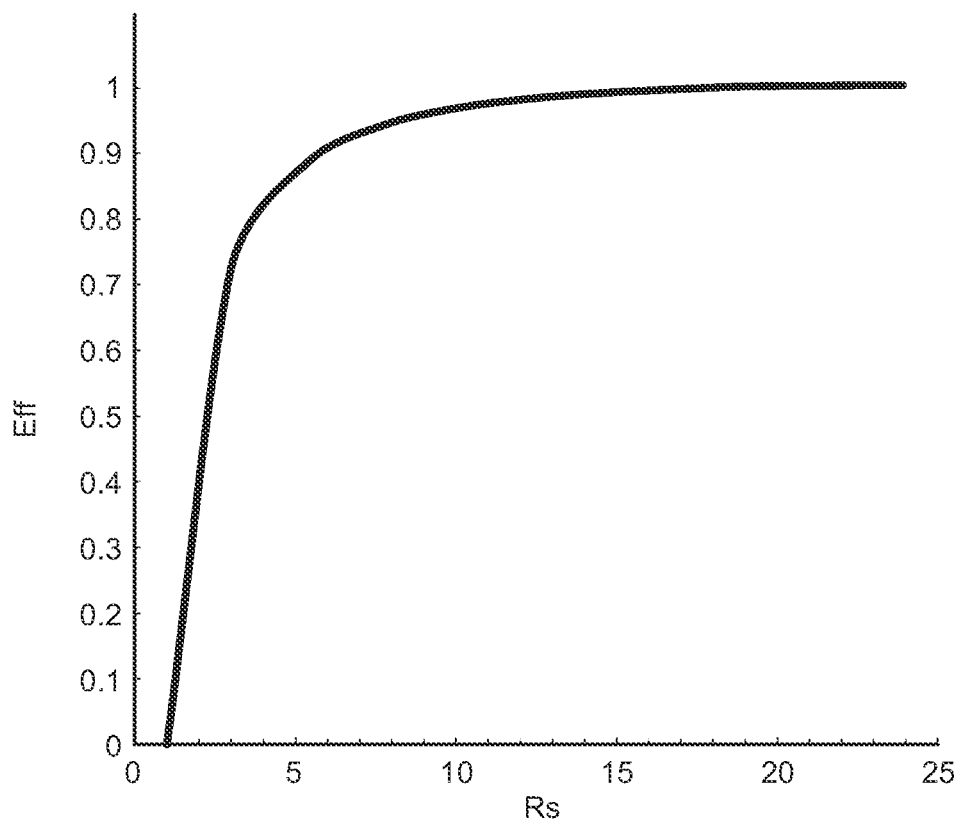
FIG. 3 is a graph illustrating the light-emitting device.

FIG. 3 is a graph illustrating the light-emitting device according to the first embodiment.

FIG. 3 is an example of a change in light emission efficiency of the semiconductor light-emitting elements 20 that occurs when the area of the thermal radiation member 51 is changed. The abscissa of FIG. 3 indicates a ratio Rs (Rs=S1/S2) of an area S1 of the thermal radiation member 51 to an area S2 of the mounting region 16. The area S1 is an area of the thermal radiation member 51 projected on the X-Y plane (the first plane). The area S2 is an area of the mounting region 16 projected on the X-Y plane. The ordinate of FIG. 3 indicates light emission efficiency Eff (in an arbitrary unit). The light emission efficiency Eff of the semiconductor light-emitting elements 20 tends to fall when the temperature of the semiconductor light-emitting elements 20 rises. The light emission efficiency Eff corresponds to a temperature rise of the semiconductor light-emitting elements 20. That is, when the light emission efficiency Eff is high, the temperature of the semiconductor light-emitting elements 20 is maintained low. When the light emission efficiency Eff is low, the temperature of the semiconductor light-emitting elements 20 rises. In the example illustrated in FIG. 3, the luminous existence of light emitted from the light-emitting element section 35 is equal to or higher than about 20 lm/mm$^2$. The second metal layer 12 is provided on the substrate 10. The second metal layer 12 is connected to the thermal radiation member 51 via the heat conduction layer 52.

As illustrated in FIG. 3, the light emission efficiency Eff is low when the ratio Rs of the area S1 of the thermal radiation member 51 to the area S2 of the mounting region 16 is low. The light emission efficiency Eff is high when the ratio Rs is high. When the ratio Rs is lower than 5, the light emission efficiency Eff suddenly falls. This is because, when the area S1 of the thermal radiation member 51 is smaller than five times the area S2 of the mounting region 16, heat generated in the light-emission element section 35 including the semiconductor light-emitting elements 20 and the wavelength conversion layer 31 is not sufficiently radiated in the thermal radiation member 51. Therefore, in this embodiment, the ratio Rs is set to be equal to or higher than 5. That is, the area S1 of the thermal radiation member 51 is set to be equal to or larger than five times the area S2 of the mounting region 16.

As illustrated in FIG. 3, in a region where the ratio Rs is larger than 10, the light emission efficiency Eff tends to be saturated. When the ratio Rs is excessively high and the area S1 of the thermal radiation member 51 is excessively large, the size of the light-emitting device is excessively large. Therefore, when the light-emitting device is reduced in size, the area S1 of the thermal radiation member 51 is set to be equal to or larger than nine times the area S2 of the mounting region 16. As illustrated in FIG. 3, when the ratio Rs is equal to or larger than a fixed ratio, the light emission efficiency Eff does not substantially change and disadvantages such as an increase in size and an increase in cost occurs. Therefore, the ratio Rs is desirably equal to or smaller than twenty-two times.

The tendency illustrated in FIG. 3 that the light emission efficiency Eff suddenly falls when the ratio Rs of the area S1 of the thermal radiation member 51 to the area S2 of the mounting region 16 is low is not conspicuous when the luminous existence of light emitted from the light-emitting element section 35 is low. For example, when the luminous existence is 2 lm/mm$^2$, a fall in the light emission efficiency Eff involved in a decrease of the ratio Rs is gentle. When the luminous existence is equal to or higher than 10 lm/mm$^2$, when the ratio Rs decreases, the light emission efficiency Eff suddenly falls. Therefore, in this embodiment, when the luminous existence is equal to or higher than 10 lm/mm$^2$, the ratio Rs is set to be equal to or higher than 5.

Originally, the size of the light-emitting device is preferably small. However, when the luminous existence is high luminous existence equal to or higher than 10 lm/mm$^2$, even if the size of the light-emitting device increases, the ratio Rs is set to be equal to or higher than 5 to obtain high light emission efficiency Eff. In this way, this embodiment has a configuration specially applied to a light-emitting device having high luminous existence like a floodlight. According to this embodiment, even when the luminous existence is high, it is possible to provide a light-emitting device with improved thermal radiation properties.

As explained above, the area S1 of the thermal radiation member 51 is set to be equal to or larger than five times the area S2 of the mounting region 16. Similarly, the area of the substrate 10 is preferably set to be equal to or larger than five times the area S2 of the mounting region 16. That is, in this embodiment, the area of the peripheral region 17 is set to be equal to or larger than four times the area of the mounting region 16. Consequently, it is possible to obtain high light emission efficiency Eff.

In this embodiment, the second metal layer 12 insulated from the first metal layer 11 is provided on the lower surface of the substrate 10. The second metal layer 12 is not, for example, a route of an electric current supplied to the semiconductor light-emitting elements 20. The second metal layer 12 is provided to obtain high thermal radiation properties.

For example, there is a configuration in which electrodes are provided in both the upper surface and the lower surface of the substrate 10 and the electrodes provided on the lower surface and the electrodes provided on the upper surface are electrically connected by a through-hole that pierces through the substrate 10. For example, a semiconductor light-emitting element is connected to the electrodes provided on the upper surface. An electric current supplied to the semiconductor light-emitting element is supplied via the electrodes provided on the lower surface. In such a configuration, the electrodes provided on the lower surface form a route of the electric current supplied to the semiconductor light-emitting element. Therefore, (at least one of) the electrodes provided on the lower surface cannot be set in contact with the thermal radiation member 51 provided on the lower side of the electrodes. Therefore, thermal radiation via the electrodes provided on the lower surface is insufficient.

Such a configuration is considered to be applicable to a light-emitting device having low luminous existence (e.g., a light-emitting device having luminous existence lower than 10 lm/mm$^2$). However, when such a configuration is applied to a light-emitting device having high luminous existence (e.g., a light-emitting device having luminous existence equal to or higher than 10 lm/mm$^2$), thermal radiation becomes insufficient. As a result, sufficient thermal radiation properties are not obtained.

In this way, the configuration in which the second metal layer 12 insulated from the first metal layer 11 is provided on the lower surface of the substrate 10 is specially applied to the light-emitting device having high luminous exitance like a floodlight. Consequently, even when luminous exitance is high, it is possible to improve the thermal radiation properties.

In this embodiment, the heat conductivity of the thermal radiation member 51 is equal to or higher than 300 W/(m·k) (watt/(meter·Kelvin)). The heat conductivity of the heat conduction layer 52 is equal to or higher than 5 W/(m·k) and desirably equal to or higher than 20 W/(m·K). Thickness t52 (see FIG. 1B) of the heat conductance layer 52 extending along the Z-axis direction (the superimposing direction extending from the thermal radiation member 51 to the light-emitting section 40) is equal to or smaller than 10 μm (micrometers).

Usually, aluminum is used as the luminaire member 71. The heat conductivity of the luminaire member 71 is lower than the heat conductivity of the thermal radiation member 51. Since the heat conductivity of the thermal radiation member 51 is set to be equal to or higher than 300 W/(m·K), it is possible to sufficiently spread heat in the in-plane direction (in the in-X-Y plane direction) to the luminaire member 71. Consequently, the thermal radiation properties are improved.

Thermal resistance between a portion of highest temperature on an upper surface 35*u* (see FIG. 1B) of the light-emitting element section 35 and an edge portion 10*ue* (see FIG. 13) of the first principal plane 10*a* (the upper surface) of the substrate 10 is equal to or lower than 0.4° C./W (degree/watt).

Consequently, since a junction temperature of the semiconductor light-emitting elements 20 falls, it is possible to improve the light emission efficiency.

Thermal resistance between an edge portion 51*r* of the thermal radiation member 51 and the edge portion 10*ue* of the first principal plane 10*a* (the upper surface) of the substrate 10 is equal to or lower than 0.1° C./W.

Consequently, since the junction temperature of the semiconductor light-emitting elements 20 falls, it is possible to improve the light emission efficiency. Further, when solder is used as the heat conduction layer 52, it is possible to suppress a warp of the substrate 10 due to a difference in a coefficient of expansion.

In the light-emitting device 110 according to this embodiment, a ratio of a voltage applied to the light-emitting element section 35 to an electric current supplied to the light-emitting element section 35 is equal to or higher than 100 V/A (volt/ampere) and equal to or lower than 1000 V/A. Since the ratio of the voltage to the electric current is set to be equal to or higher than 100 V/A, for example, it is possible to improve conversion efficiency of an inverter included in a lighting device. When the ratio of the voltage to the electric current exceeds 1000 V/A, the ratio is too high and an element is sometimes broken. Therefore, the ratio is not practical.

An example of the configuration of the mounting patterns 11*p* and the semiconductor light-emitting elements 20 is explained.

Figure 4A:
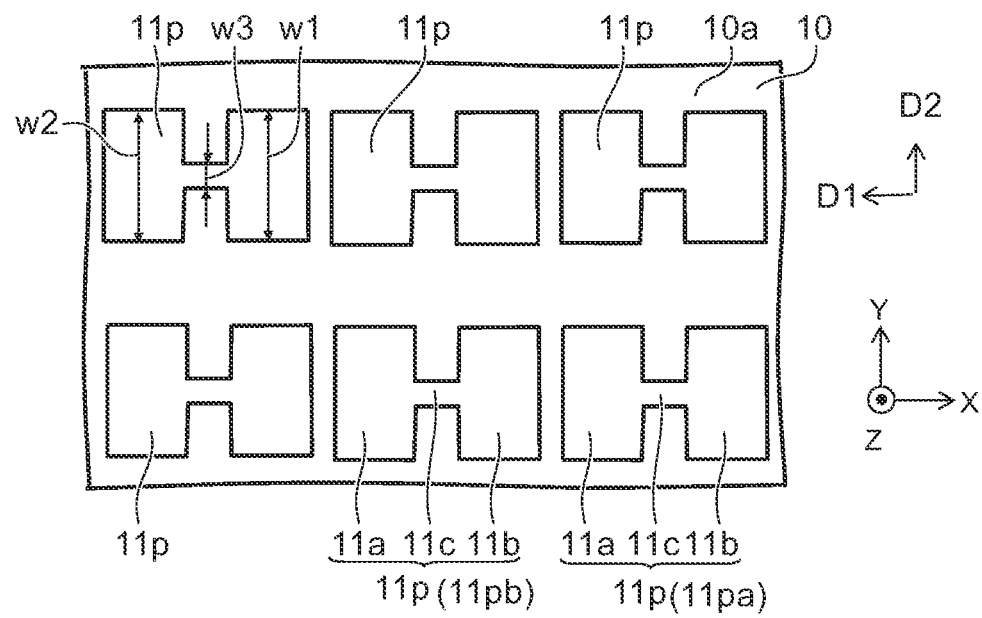
FIGS. 4A and 4B are schematic plan views illustrating the light-emitting device.
Figure 4B:
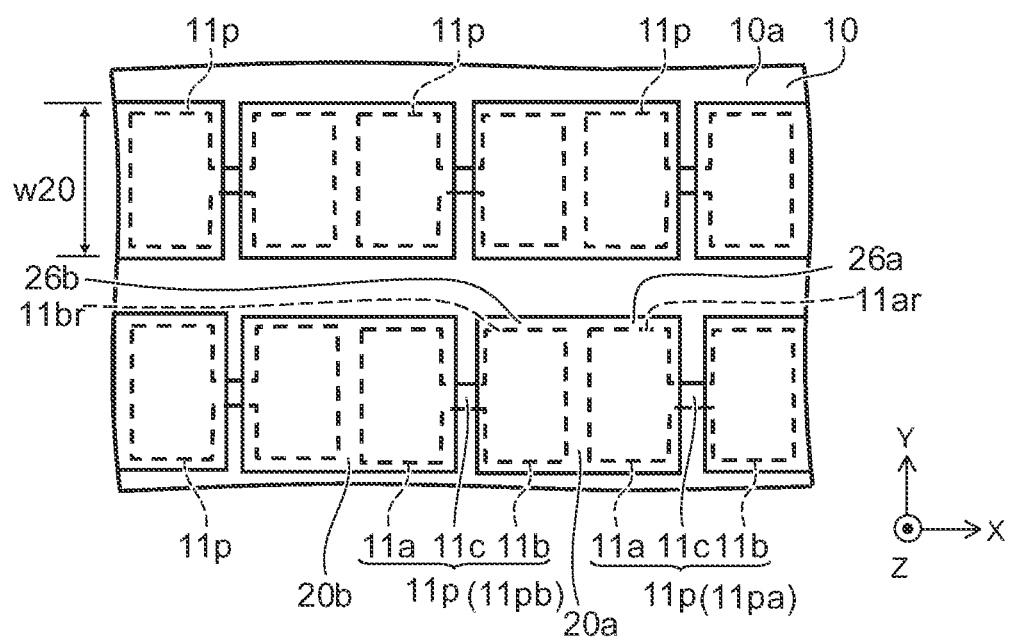

FIGS. 4A and 4B are schematic plan views illustrating the light-emitting device according to the first embodiment.

FIG. 4A illustrates a pattern shape of the mounting patterns 11*p*. FIG. 4B illustrates an arrangement of the semiconductor light-emitting elements 20.

As illustrated in FIG. 4A, parts of the plurality of mounting patterns 11*p* are arranged side by side along the X-axis direction. Further, a group of the plurality of mounting patterns 11*p* arranged in the X-axis direction is arranged side by side along the Y-axis direction.

Each of the plurality of mounting patterns 11*p* includes the first mounting portion 11.*a*, the second mounting portion 11*b*, and the third mounting portion 11*c*. The third mounting portion 11*c* is provided between the first mounting portion 11*a* and the second mounting portion 11*b* and connects the first mounting portion 11*a* and the second mounting portion 11*b*.

In one mounting pattern 11*p*, width w3 of the third mounting portion 11*c* extending along a traverse direction D2 perpendicular to a direction (an extending direction D1) extending from the first mounting portion 11*a* to the second mounting portion 11*b* is smaller than width w1 of the first mounting portion 11*a* extending along the traverse direction D2. The width w3 of the third mounting portion 11*c* extending along the traverse direction D2 is smaller than width w2 of the second mounting portion 11*b* extending along the traverse direction D2.

As illustrated in FIG. 4B, the semiconductor light-emitting elements 20 are arranged on the mounting patterns 11*p*. A part of the semiconductor light-emitting elements 20 is arranged, for example, on a part of the first mounting pattern 11*pa*. Another part of the semiconductor light-emitting elements 20 is arranged, for example, on a part of the second mounting pattern 11*pb*. For example, in one mounting pattern 11*p* (e.g., the first mounting pattern 11*pa*), the first mounting portion 11*a* is electrically connected to any one of the semiconductor light-emitting elements 20 (e.g., the first semiconductor light-emitting element 20*a*). The second mounting portion 11*b* is electrically connected to the second semiconductor light-emitting element 20*b*. The second semiconductor light-emitting element 20*b* is the semiconductor light-emitting element 20 adjacent to the first semiconductor light-emitting element 20*a* among the plurality of semiconductor light-emitting elements 20.

For example, the first mounting portion 11*a* and the second mounting portion 11*b* of the mounting pattern 11*p* are covered by the semiconductor light-emitting elements 20. For example, the third mounting portion 11*c* of the mounting pattern 11*p* is not covered by the semiconductor light-emitting elements 20.

For example, as illustrated in FIGS. 1B and 4B, any one of the mounting patterns 11*p* (e.g., the first mounting pattern 11*pa*) includes the first mounting portion 11*a* joined to any one of the semiconductor light-emitting elements 20 (e.g., the first semiconductor light-emitting element 20*a*). Another mounting pattern 11*p* (the second mounting pattern 11*pb* adjacent to the first mounting pattern 11*pa*) includes the second mounting portion 11*b* joined to any one of the semiconductor light-emitting elements 20 (e.g., the first semiconductor light-emitting element 20*a*).

As illustrated in FIG. 4B, when projected on the X-Y plane (the first plane), any one of the semiconductor light-emitting elements 20 (e.g., the first semiconductor light-emitting element 20*a*) includes a portion 26*a* further on the outer side than an outer edge liar of the first mounting portion 11*a* and a portion 26*b* further on the outer side than an outer edge 11*br* of the second mounting portion 11*b*.

For example, width w20 extending along the traverse direction D2 of each of the plurality of semiconductor light-emitting elements 20 is larger than the width w1 of the first mounting portion 11*a* extending along the traverse direction D2 and larger than the width w2 of the second mounting portion 11*b* extending along the traverse direction D2.

For example, when projected on the X-Y plane (the first plane), each of the plurality of semiconductor light-emitting elements 20 overlaps at least a part of the third mounting portion 11*c*.

Consequently, the first mounting portion 11*a* and the second mounting portion 11*b* of the mounting pattern 11*p* are covered by the semiconductor light-emitting element 20.

As explained above, for example, a ceramic substrate mainly containing alumina is used as the substrate 10. The light-reflectance of the ceramic substrate is relatively high. For example, the reflectance of the surface (e.g., the first principal plane 10*a*) of the substrate 10 is higher than the reflectance of the surface of each of the plurality of mounting patterns 11*p*. For example, the reflectance of the surface of the mounting pattern 11*p* is relatively low.

Since the first mounting portion 11*a* and the second mounting portion 11*b* of the mounting pattern 11*p* are covered by the semiconductor light-emitting elements 20, an area of the mounting pattern 11*p* having relatively low reflectance exposed to the surface can be reduced. Therefore, high reflectance can be obtained as a whole. In this configuration, even when solder is used as the first joining metal member 21*e* and the second joining metal member 22*e*, the solder less easily spreads to the side surfaces of the semiconductor light-emitting elements 20 when the semiconductor light-emitting elements 20 are mounted. In an LED of the flit-chip type, a semiconductor layer is sometimes exposed to the side surface because of a manufacturing method. By using this configuration, it is possible to suppress a short circuit from being caused by the solder.

The plurality of semiconductor light-emitting elements 20 are separated from one another. Therefore, in the positions among the plurality of semiconductor light-emitting elements 20, the third mounting portions 11c of the mounting patterns 11p are not covered by the semiconductor light-emitting elements 20.

As explained above, the width w3 of the third mounting portion 11c extending along the traverse direction D2 is set smaller than the width w1 of the first mounting portion 11a and smaller than the width w2 of the second mounting portion 11b. Therefore, an exposed area of the substrate 10 having high reflectance can be increased. Consequently, high reflectance can be obtained as a whole.

For example, when the light-emitting element section 35 is removed, average light-reflectance in the mounting region 16 of the mounting substrate section 15 is equal to or higher than 70%. Since the arrangement explained above is adopted, such high light-reflectance can be obtained.

Figure 5:
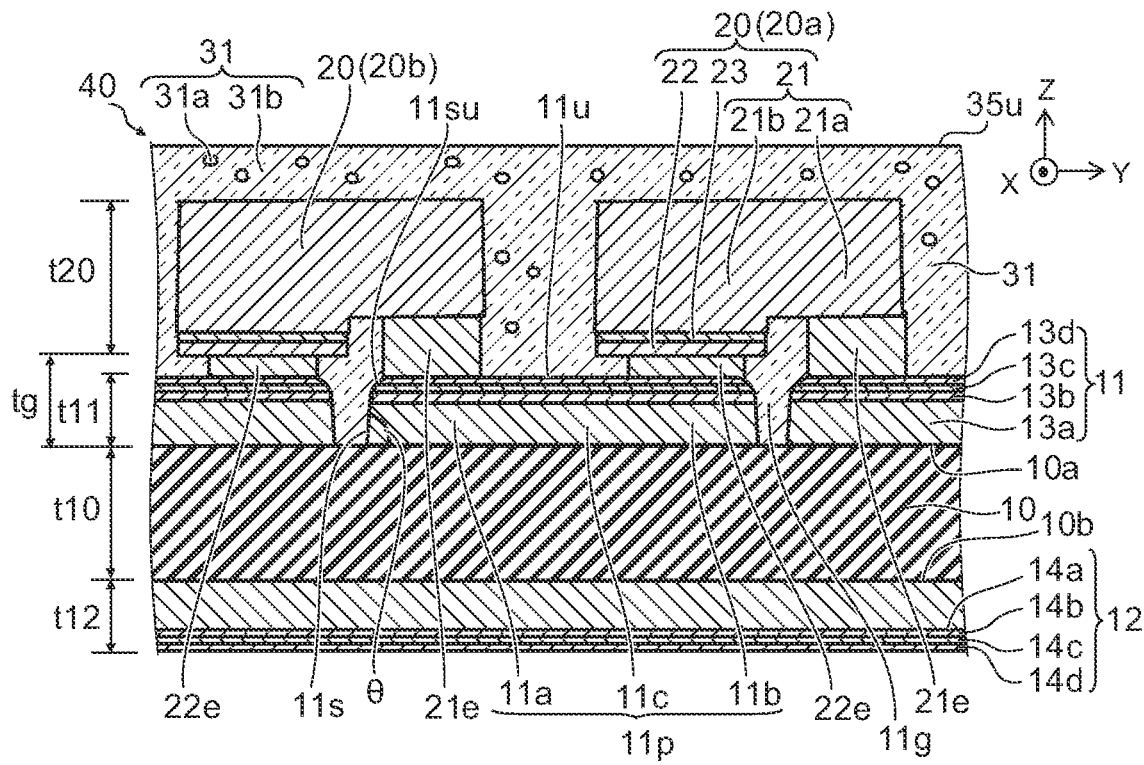
FIG. 5 is a schematic sectional view illustrating the light-emitting device.

FIG. 5 is a schematic sectional view illustrating the light-emitting device according to the first embodiment.

FIG. 5 illustrates a part of the light-emitting section 40.

As illustrated in FIG. 5, the first metal layer 11 includes a copper layer 13a (a Cu layer). The metal layer 11 may further include a gold layer 13d (an Au layer). The copper layer 13a is provided between the gold layer 13d and the substrate 10. In this example, the first metal layer 11 further includes a nickel layer 13b (an Ni layer) provided between the copper layer 13a and the gold layer 13d and a palladium layer 13c (a Pd layer) provided between the nickel layer 13b and the gold layer 13d. In this way, in this example, the first metal layer 11 has a superimposed structure of Cu/Ni/Pd/Au.

On the other hand, the second metal layer 12 includes a copper layer 14a. The second metal layer 12 may further include a gold layer 14d. The copper layer 14a is provided between the gold layer 14d and the substrate 10. In this example, the second metal layer 12 further includes a nickel layer 14b provided between the copper layer 14a and the gold layer 14d and a palladium layer 14c provided between the nickel layer 14b and the gold layer 14d. In this way, in this example, the second metal layer 12 has a superimposed structure of Cu/Ni/Pd/Au.

In the above explanation, boundaries among the copper layer, the nickel layer, the palladium layer, and the gold layer sometimes are not clear. Parts of these layers may have a mixed state of these kinds of metal (e.g., an alloy state).

For the second metal layer 12, for example, a material same as the material of the first metal layer 11 can be used. A superimposed structure same as the superimposed structure of the first metal layer 11 can be applied to the second metal layer 12. This makes it easy to form these metal layers. In this embodiment, the configuration of the second metal layer 12 may be different from the configuration of the first metal layer 11.

Thickness t11 of the first metal layer 11 is, for example, equal to or larger than 30 μm and equal to or smaller than 100 μm and, for example, equal to or larger than 40 μm and equal to or smaller than 60 μm. Thickness t12 of the second metal layer 12 is, for example, equal to or larger than 30 μm and equal to or smaller than 100 μm and, for example, equal to or larger than 40 μm and equal to or smaller than 60 μm.

The copper layer 13a of the first metal layer 11 and the copper layer 14a of the second metal layer 12 can be formed by, for example, electrolytic plating. Each of the thickness of the copper layer 13a and the thickness of the copper layer 14a is, for example, equal to or larger than 30 μm and equal to or smaller than 100 μm and is, for example, about 50 μm.

The nickel layer 13b, the palladium layer 13c, and the gold layer 13d are formed by, for example, electroless plating. The nickel layer 14b, the palladium layer 14c, and the gold layer 14d are formed by, for example, electrolytic plating.

Each of the thickness of the nickel layer 13b and the thickness of the nickel layer 14b is, for example, equal to or larger than 2 μm and equal to or smaller than 8 μm and is, for example, about 4.5 μm. Each of the thickness of the palladium layer 13c and the thickness of the palladium layer 14c is, for example, equal to or larger than 0.075 μm and equal to or smaller than 0.2 μm and is, for example, about 1 μm. Each of the thickness of the gold layer 13d and the thickness of the gold layer 14d is, for example, equal to or larger than 0.05 μm and equal to or smaller than 0.2 μm and is, for example, about 0.1 μm.

Since at least a part of the first metal layer 11 and at least a part of the second metal layer 12 are formed by electroless plating, it is possible to substantially vertically form the side surfaces of the first metal layer 11 and the side surfaces of the second metal layer 12.

For example, a side surface 11s of the first metal layer 11 cut along a plane (e.g., a second plane such as a Y-Z plane) perpendicular to the first principal plane 10a can be formed substantially parallel to the superimposing direction (the Z-axis direction). An angle θ between the side surface 11s of the first metal layer 11 and the first principal plane 10a is, for example, equal to or larger than 80 degrees and equal to or smaller than 95 degrees. The angle θ is more preferably, for example, equal to or larger than 85 degrees.

If the angle θ is small, the area of the lower surface of the mounting pattern 11p is excessively large with respect to an area (e.g., the area of the upper surface) for mounting the mounting pattern 11p, which is a part of the first metal layer 11. Therefore, a ratio of a portion covered by the mounting pattern 11p in the upper surface (the first principal plane 10a) of the substrate 10 is high. Therefore, it is difficult to increase the reflectance of the entire mounting region 16.

Since the angle θ between the side surface 11a of the first metal layer 11 and the first principal plane 10a is set to be equal to or larger than 80 degrees and equal to or smaller than 95 degrees, it is possible to reduce the ratio of the portion covered by the mounting pattern 11p in the upper surface (the first principal plane 10a) of the substrate 10. Consequently, it is possible to sufficiently increase the reflectance of the entire mounting region 16. As a result, it is possible to improve the luminous exitance.

The curvature of a corner portion of the cross section of the first metal layer 11 is relatively high. That is, the curvature radius of the corner portion is small. The cross section of the first metal layer 11 is close to a rectangle, i.e., the side surface 11s is close to a vertical. For example, the first metal layer 11 further includes an upper surface 11u parallel to the X-Y plane (the first plane). The curvature radius of a corner portion 11su connecting the upper surface 11u of the first metal layer 11 and the side surface 11s of the first metal layer 11 is equal to or smaller than 10 μm. Consequently, the area of the lower surface of the mounting pattern 11p can be reduced with respect to the area (e.g., the area of the upper surface 11u of the mounting pattern 11p) for mounting the mounting pattern 11p. As a result, it is possible to increase the reflectance of the entire mounting region 16 and improve the luminous exitance.

In this example, a part of the wavelength conversion layer 31 is arranged in a position 11g (a space) between any one of the plurality of semiconductor light-emitting elements 20 and the substrate 10. The position 11g is a position between any one of the mounting patterns 11p (e.g., the first mounting pattern 11pa) and another mounting pattern 11p (e.g., the second mounting pattern 11pb). Since a part of the wavelength conversion layer 31 is arranged in the position 11g (the space) as well, it is possible to efficiently convert the first light emitted from the semiconductor light-emitting element 20 into the second light in the wavelength conversion layer 31. In the position 11g (the space), a wavelength conversion member including transparent resin or another phosphor material may be separately arranged.

In order to arrange a part of the wavelength conversion layer 31 in the position 11g (the space), a vacancy including the position 11g may be increased. For example, a gap between the semiconductor light-emitting element 20 and the substrate 10 is increased. For example, a distance tg between any one of the plurality of semiconductor light-emitting elements 20 and the substrate 10 extending along the Z-axis direction (the superimposing direction extending from the thermal radiation member 51 to the light-emitting section 40) is set relatively long. For example, the distance tg is equal to or larger than 1/10 of thickness t20 (height) of the plurality of semiconductor light-emitting elements 20 extending along the Z-axis direction.

For example, the height (the thickness t20 extending along the Z-axis direction) of the semiconductor light-emitting layer 20 is, for example, equal to or larger than 50 μm and equal to or smaller than 500 μm and is, for example, 300 μm. The distance tg is, for example, equal to or larger than 40 μm and equal to or smaller than 110 μm and is, for example, 60 μm. It is possible to increase the distance tg by increasing the thickness t11 of the first metal layer 11.

In this embodiment, thickness t10 of the substrate 10 is, for example, equal to or larger than 0.3 mm and equal to or smaller than 2 mm and is, for example, 0.635 mm. When the thickness t10 of the substrate 10 is smaller than 0.3 mm, for example, the mechanical strength of the substrate 10 decreases. When the thickness t10 of the substrate 10 exceeds 2 mm, for example, efficiency of conduction of heat generated by the semiconductor light-emitting elements 20 (the light-emitting element section 35) to the thermal radiation member 51 falls.

As illustrated in FIG. 5, the wavelength conversion layer 31 includes a plurality of wavelength conversion particles 31a such as phosphors and light transmissive resin 31b in which the plurality of wavelength conversion particles 31a are dispersed. The wavelength conversion particles 31a absorb at least a part of the first light emitted from the plurality of semiconductor light-emitting elements 20 and emits the second light having wavelength different from the wavelength of the first light.

Figure 6:
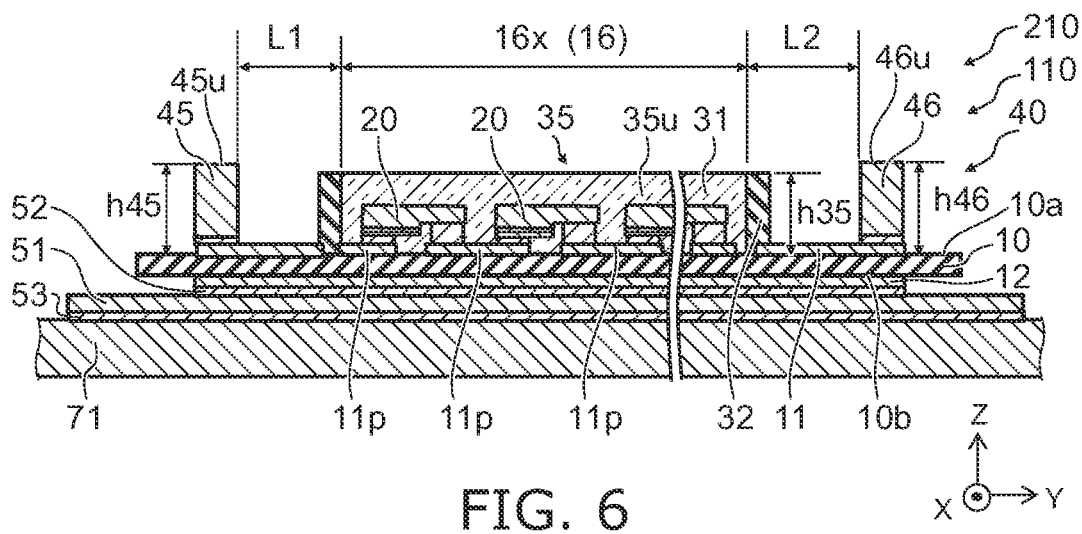
FIG. 6 is a schematic sectional view illustrating the light-emitting device.

FIG. 6 is a schematic sectional view illustrating the light-emitting device according to the first embodiment.

FIG. 6 is a sectional view equivalent to a cross section taken along line A1-A2 in FIG. 1A.

As illustrated in FIG. 6, the height of the connectors is preferably set to be equal to or smaller than the height of the light-emitting element section 35. For example, a distance h45 (height) between the first principal plane 10a of the substrate 10 and an upper surface 45u of the first connector 45 is equal to or smaller than 1.2 times a distance h35 (height) between the first principal plane 10a of the substrate 10 and the upper surface 35u of the light-emitting element section 35. For example, the distance h45 is preferably equal to or smaller than 1.1 times the distance h35. The distance h45 is more preferably equal to or smaller than the distance h35.

If the distance h45 is excessively large compared with the distance h35 and the upper surface 45u of the first connector 45 is located excessively above the upper surface 35u of the light-emitting element section 35, light (oblique light) emitted from the light-emitting element section 35 is made incident on the first connector 45. The light is absorbed by the first connector 45 and lost. Further, deterioration of the first connector 45 is accelerated by the light. A reduction in the distance h45 and a reduction in the height of the upper surface of the first connector 45 make it easy to suppress the loss of the light and the deterioration of the first connector 45.

The same applies to the height of the second connector 46. For example, a distance h46 (height) between the first principal surface 10a of the substrate 10 and an upper surface 46u of the second connector 46 is equal to or smaller than 1.2 times the distance h35 (height) between the first principal surface 10a of the substrate 10 and the upper surface 35u of the light-emitting element section 35. For example, the distance h46 is preferably equal to or smaller than 1.1 times the distance h35. The distance h46 is more preferably equal to or smaller than the distance h35. This makes it easy to suppress a loss of light and deterioration of the second connector 46.

In this embodiment, the connectors are arranged apart from the mounting region 16. For example, a distance L1 (a shortest distance parallel to the X-Y plane) between the first connector 45 and the mounting region 16 is equal to or larger than ½ of the width 16x of the mounting region 16. For example, a distance L2 (a shortest distance parallel to the X-Y plane) between the second connector 46 and the mounting region 16 is equal to or larger than ½ of the width 16x of the mounting region 16. Consequently, a degree of light (oblique light), which is emitted from the light-emitting element section 35, made incident on the first connector 45 and the second connector 46 can be reduced. This makes it easy to suppress a loss of light and deterioration of the connectors.

In the light-emitting device 110, laser printing is sometimes applied to the substrate 10. For example, a two-dimensional barcode is printed by the laser printing. In this case, the width of a region of the laser printing is preferably set to be equal to or smaller than ⅕ of the thickness t10 of the substrate 10.

Figure 7:
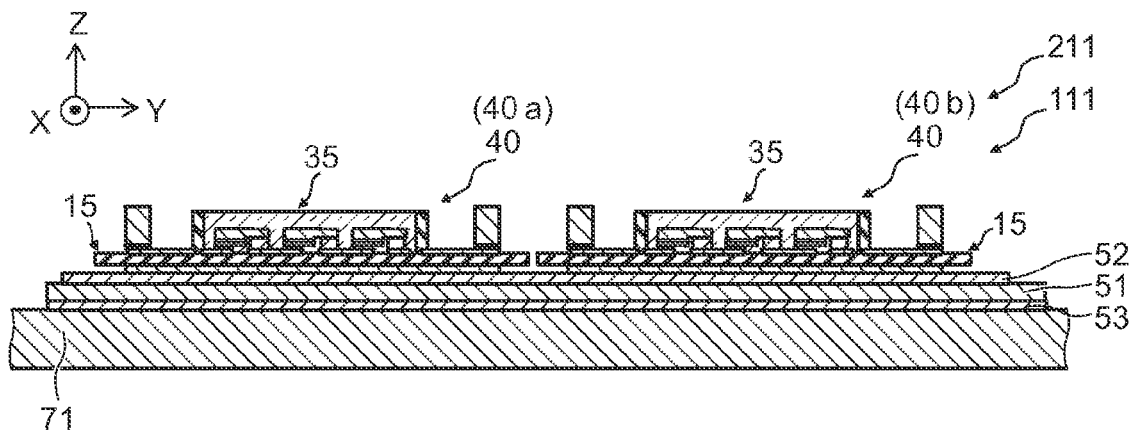
FIG. 7 is a schematic sectional view illustrating another light-emitting device according to the first embodiment.

FIG. 7 is a schematic sectional view illustrating another light-emitting device according to the first embodiment.

As illustrated in FIG. 7, another light-emitting device 111 according to this embodiment includes the thermal radiation member 51, the heat conduction layer 52, and the plurality of light-emitting sections 40 (e.g., a first light-emitting section 40a and a second light-emitting section 40b). The configurations explained above can be applied to each of the plurality of light-emitting sections 40, the thermal radiation member 51, and the heat conduction layer 52. FIG. 7 illustrates the configuration of a luminaire 211 according to this embodiment as well. The luminaire 211 includes the luminaire member 71 and the light-emitting device 111 provided on the luminaire member 71.

In the way, the plurality of light-emitting section 40 may be provided for one thermal radiation member 51. The heat conduction layer 52 is arranged between the plurality of light-emitting sections 40 and the thermal radiation member 51. The heat conduction layer 52 can be divided for each of the plurality of light-emitting sections 40 or one heat conduction layer 52 may be provided for the plurality of light-emitting sections 40. When the heat conduction layer 52 is divided, it can be considered that the heat conduction layer 52 has a plurality of patterns and a plurality of the heat conduction layers 52 are provided.

Second Embodiment

A second embodiment relates to the mounting substrate section 15. The mounting substrate section 15 includes, for example, the substrate 10 and a conductive layer (e.g., the first metal layer 11) provided on the substrate 10. For example, as illustrated in FIG. 5, the conductive layer (e.g., the first metal layer 11) includes a superimposed film including the nickel layer 13b, the palladium layer 13c, and the gold layer 13d. For example, as explained above, the nickel layer 13b, the palladium layer 13c, and the gold layer 13d are provided on the copper layer 13a in this order.

A resist layer may be provided around the conductive layer provided on the substrate 10. For example, a silicon material is used as the resist layer. A ceramic substrate having high reflectance is used as the substrate 10.

In this embodiment, a plated layer of Ni/Pd/Au is formed on a reflection surface of the substrate 10. Consequently, for example, discoloration is suppressed. As a result, a fall in reflectance can be suppressed. Further, since the silicon material is used as the resist and the ceramic substrate having high reflectance is used, efficiency can be improved.

For example, when a plated layer of Ni/Ag is used as a reflection surface of a mounting substrate, discoloration occurs and a luminous flux tends to fall according to the discoloration. The discoloration is mainly affected by a sulfurous gas contained in the air. On the other hand, when a plated layer of Ni/Au is used, compared with the plated layer of Ni/Ag, total ray reflectance falls.

In this embodiment, it is possible to improve resistance to sulfur corrosion and maintain high reflectance. Consequently, it is possible to suppress discoloration and obtain high efficiency.

In this embodiment, a ceramic substrate of $Al_2O_3$ or the like can be used as the substrate. A metal substrate of Al or the like may be used as the substrate.

For example, a plated layer of copper (the copper layer 13a) is provided on a principal surface (either the upper surface or the lower surface) of the substrate. A superimposed film of Ni/Pd/Au is provided on the plated layer of copper. The superimposed film is formed by, for example, an electrolytic plating method or an electroless plating method.

In this embodiment, the total ray reflectance at a wavelength of 460 nm of the surface of the superimposed layer of Ni/Pd/Au (the surface of the gold layer 13d) is equal to or higher than 35% and equal to or lower than 50%. The total ray reflectance is, for example, a ratio of a total reflection luminous flux to a parallel incident luminous flux of a test piece. The total ray reflectance is ray reflectance including a diffusion component.

In this embodiment, the total ray reflectance at a wavelength of 460 nm on the surface of the superimposed film of Ni/Pd/Au (the surface of the gold layer 13d) is equal to or higher than 60% and equal to or lower than 70%.

In this embodiment, the thickness of the Ni layer is equal to or larger than 3 µm and equal to or smaller than 6 µm. The thickness of the Pd layer is equal to or larger than 0.05 µm and equal to or smaller than 0.1 µm. The thickness of the Au layer is equal to or larger than 0.05 µm and equal to or smaller than 3 µm.

In this embodiment, the total ray reflectance at a wavelength of 460 nm of the substrate is equal to or higher than 85% and equal to or lower than 93%. The total ray reflectance at a wavelength of 560 nm of the substrate is equal to or higher than 85% and equal to or lower than 93%.

The mounting substrate section according to this embodiment can be used for, for example, an LED module. The LED module can be used for, for example, a luminaire.

Third Embodiment

A third embodiment relates to a COB module (e.g., the light-emitting element section 35). The COB module includes, for example, the semiconductor light-emitting element 20 and the wavelength conversion layer 31. The semiconductor light-emitting element 20 emits blue light. The wavelength conversion layer 31 generates, for example, white visible light using the blue light as excitation light. The luminous existence in the COB module is equal to or higher than 10 lm/mm$^2$. The power consumption of the COB module is equal to or larger than 50 W.

In this embodiment, a connector for feeding electricity to the COB module is formed of metal. The connector has a unipolar structure. In one COB module, two or more connectors (e.g., the first connector 45 and the second connector 46) are provided.

In the COB module, connectors containing resin is often used. On the other hand, in a high-power COB module used for a floodlight or the like, to satisfy a luminous intensity distribution characteristic, a light emission area (e.g., the area of the mounting region 16) is desirably small. When the light emission area is reduced and light emission density increases, deterioration due to light of the connectors arranged around the mounting region 16 is intensified. Discoloration or the like sometimes occurs in the connectors.

According to an experiment, when the luminous existence is equal to or higher than 10 lm/mm$^2$ and the module power is equal to or larger than 50 W, discoloration conspicuously occurs in the connectors containing resin. The discoloration occurs in the resin used for the connectors.

In this embodiment, resin that causes discoloration is not used for the connectors. The connectors are formed of only metal. Consequently, it is possible to suppress discoloration of the connectors.

In this embodiment, a plurality of connectors are provided, one of the connectors is used as a positive electrode, and another connector is used as a negative electrode.

In this embodiment, for example, the first connector 45 and the second connector 46 are arranged to hold the light-emitting element section 35 therebetween. Consequently, the heat of the semiconductor light-emitting element 20, which is a heat source on the first principal plane 10a of the substrate 10, can be spread via the first metal layer 11 in advance. Therefore, the thermal radiation properties are further improved.

Fourth Embodiment

A fourth embodiment relates to the wavelength conversion layer 31. As illustrated in FIG. 5, the wavelength conversion layer 31 includes, for example, the plurality of wavelength conversion particles 31a and the light transmissive resin 31b (e.g., a sealing material). The plurality of wavelength conversion particles 31a are dispersed in the light transmissive resin 31b. In this embodiment, the light transmissive resin 31b contains dimethyl silicone as a main component. The light-transmittance of the light transmissive resin 31b is equal to or higher than 86%. The hardness (Shore A) of the light transmissive resin 31b is equal to or higher than 15 and equal to or lower than 50.

The Shore A is, for example, a standard in measuring the hardness of general rubber. A penetrator (a pressing needle or an indenter) is pushed into the surface of an object to be measured and deformed. A deformation amount (press-in depth) of the penetrator is measured and converted into a numerical value. For the measurement of the Shore A, for example, a durometer (a spring-type rubber hardness meter) is used.

In a COB module of a light-emitting device, in order to obtain high luminous exitance, semiconductor light-emitting elements are mounted on a substrate at high density. Therefore, thermal dissipation is poor. Further, an amount of light made incident on the wavelength conversion layer 31 increases. Therefore, the temperature of the wavelength conversion layer 31 tends to rise. When silicone is used as light transmissive resin of the wavelength conversion layer 31, the heat conductivity of the silicone is about 0.1° C.·W. Therefore, in a high-power COB module, compared with a small-power COB module, the temperature of the wavelength conversion layer 31 is extremely high. The hardness of the silicone rises according to the temperature.

Further, according to the temperature rise, heat stress is applied to the COB module. Therefore, a crack or peeling sometimes occurs between a wire (e.g., the first metal layer 11) used in the COB module and the wavelength conversion layer 31.

In this embodiment, the hardness (the Shore A) of the light transmissive resin 31b is set to be equal to or higher than 15 and equal to or lower than 50. Consequently, a crack and peeling can be suppressed.

This embodiment can include, for example, the light-emitting element section 35 including the semiconductor light-emitting elements 20 configured to emit light having a wavelength equal to or larger than 400 nm and equal to or smaller than 480 nm and the wavelength conversion layer 31 configured to cover the semiconductor light-emitting elements 20. The luminous existence in the light-emitting element section 35 (the COB module) is equal to or higher than 10 lm/mm$^2$ and the power consumption of the light-emitting element section 35 is equal to or higher than 50 W.

When the thickness of the light transmissive resin 31b of the wavelength conversion layer 31 is 2 mm, the total light transmittance for a wavelength of 400 nm of the light transmissive resin 31b is equal to or higher than 85%.

According to this embodiment, it is possible to provide a light-emitting device having luminous exitance adaptable to a narrow angle of a floodlight or the like. Even when temperature rises during lighting, it is possible to reduce stress due to temperature stress and suppress a crack and peeling.

An example of a result of an experiment concerning the light-emitting device according to this embodiment is explained.

For example, the light-emitting element section 35 is arranged on the mounting substrate section 15. The light-emitting section 35 includes the plurality of semiconductor light-emitting elements 20. Each of the plurality of semiconductor light-emitting elements 20 is a square 1 mm on each side. The dominant wavelength of the semiconductor light-emitting elements 20 is 455 nm. In the arrangement of the plurality of semiconductor light-emitting elements 20, a pitch is 1.6 mm. The number of semiconductor light-emitting elements 20 is ninety-six.

In a first sample, dimethyl silicone having Shore A of 70 and elongation of 70% is used as the light transmissive resin 31b of the wavelength conversion layer 31 of the light-emitting element 35. In a second sample, dimethyl silicone having Shore A of 43 and elongation of 150% is used as the light transmissive resin 31b. In a third sample, dimethyl silicone having Shore A of 32 and elongation of 200% is used as the light transmissive resin 31b.

Concerning these samples, a lighting test is performed at an electric current of 440 mA, a voltage of 144 V, and junction temperature of 1.30° C. During the lighting test, the temperature on the upper surface of the wavelength conversion layer 31 is equal to or higher than 120° C. and equal to or lower than 150° C.

In the first sample, a crack occurs when about 100 hours elapse in the lighting test. In the second sample and the third sample, a crack does not occur when 2000 hours to 3000 hours elapse. Therefore, the Shore A is preferably equal to or lower than 50.

On the other hand, when the shore A is lower than 15 and excessively low, workability is low. Therefore, in this embodiment, the Shore A is set to be equal to or higher than 15 and equal to or lower than 50. Consequently, a crack and peeling can be suppressed and workability is high.

It is possible to suppress deterioration due to light by reducing absorption of light in a visible light region in the light transmissive resin 31b. When the thickness of the light transmissive resin 31b is 2 mm, the total light transmittance for a wavelength of 400 nm of the light transmissive resin 31b is set to be equal to or higher than 85%, whereby high light extraction efficiency is obtained. The total light reflectance is more preferably equal to or higher than 90%.

Fifth Embodiment

Figure 8:
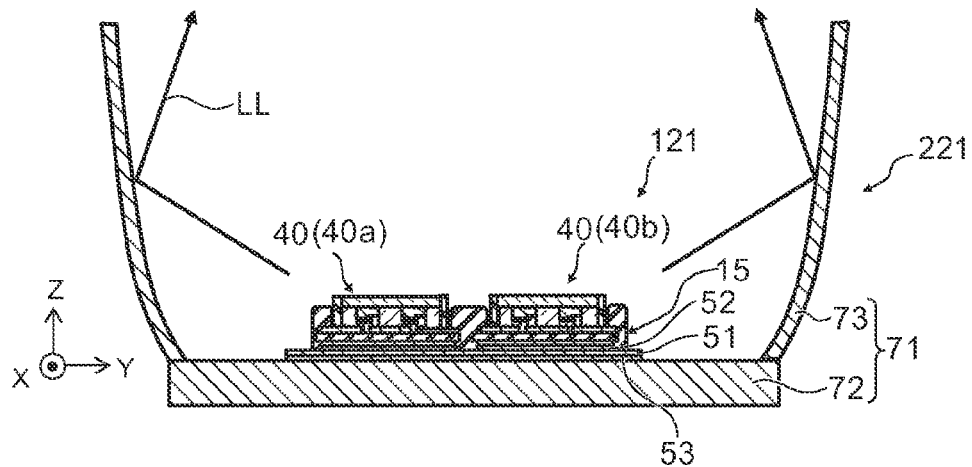
FIG. 8 is a schematic sectional view illustrating a light-emitting device and a luminaire according to a fifth embodiment.

FIG. 8 is a schematic sectional view illustrating a light-emitting device and a luminaire according to a fifth embodiment. As illustrated in FIG. 8, a luminaire 221 according to this embodiment includes a light-emitting device 121 and the luminaire member 71. The luminaire member 71 includes, for example, a base section 72 and a reflecting section 73. In this example, the base section 72 is tabular. The reflecting section 73 is provided along an edge of the base section 72. The light-emitting device 121 is provided on the base section 72. The reflecting section 73 reflects light LL emitted from the light-emitting device 121. The light LL can be efficiently irradiated in a desired direction by the reflecting section 73. The base section 72 efficiently radiates heat generated in the light-emitting device 121 while holding the light-emitting device 121.

In this example, the light-emitting device 121 includes the thermal radiation member 51, the heat conduction layer 52, and the plurality of light-emitting sections 40 (e.g., the first light-emitting section 40a and the second light-emitting section 40b).

An interval among the plurality of light-emitting sections 40 is preferably short. Consequently, the light LL having high intensity is emitted from a narrow region. If the light LL is emitted from a wide region, proper reflection is less easily obtained in the reflecting section 73. It is difficult to perform highly efficient reflection in a desired direction. Therefore, it is preferable to bring a light emission characteristic closer to a point light source such that the light LL is emitted from the narrow region. Consequently, highly efficient reflection in the reflecting section 73 is obtained.

In this embodiment, as in the embodiments explained above, by setting the ratio Rs to be equal to or higher than 5, even when the luminous existence is as high as equal to or higher than 10 lm/mm$^2$ and equal to or lower than 100 lm/mm$^2$, it is possible to provide a light-emitting device with improved thermal radiation properties.

With a configuration explained below, for example, it is possible to practically reduce the interval among the plurality of light-emitting sections 40.

Figure 9A:
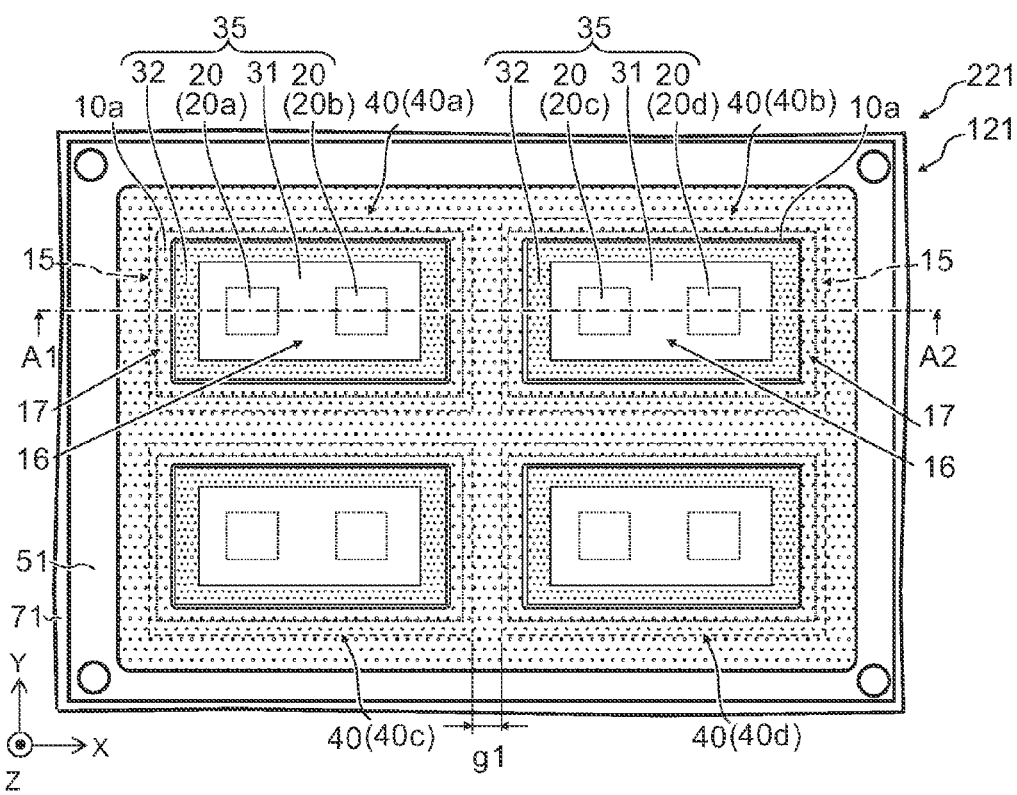
FIGS. 9A and 9B are schematic diagrams illustrating the light-emitting device and the luminaire.
Figure 9B:
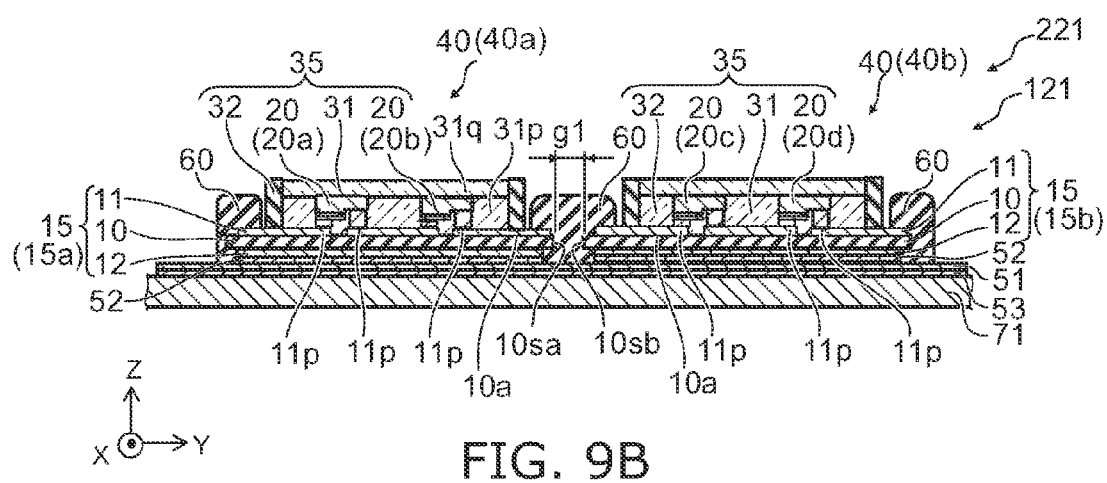
Figure 10A:
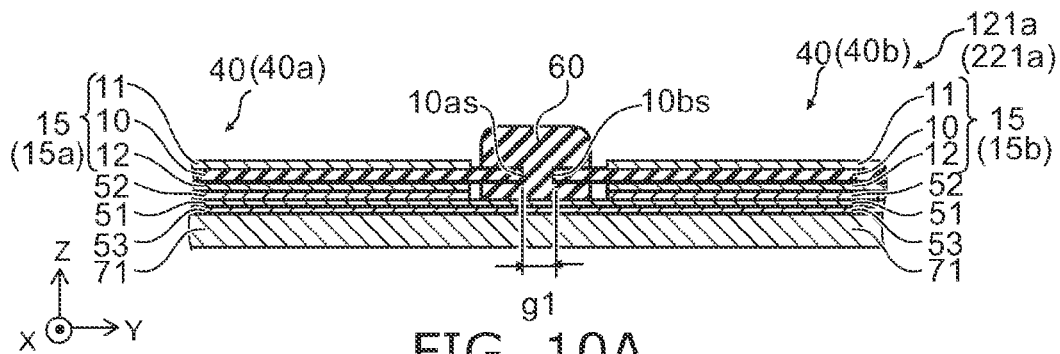
FIGS. 10A to 10D are schematic sectional views illustrating other light-emitting devices and other luminaires according to the fifth embodiment.
Figure 10B:
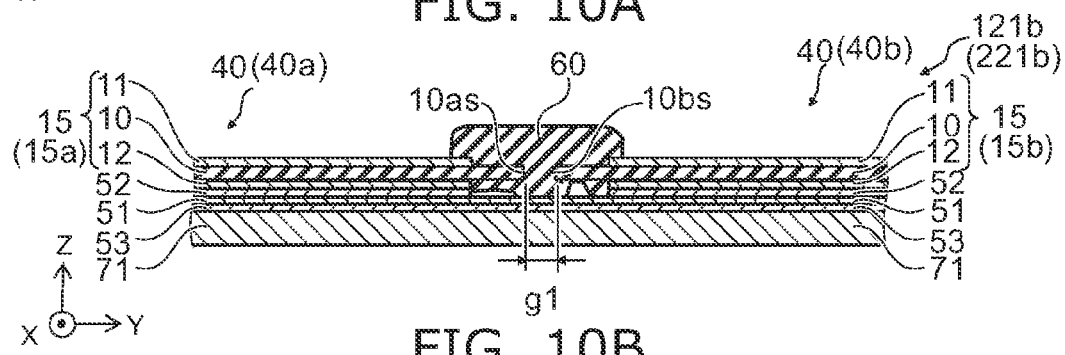
Figure 10C:
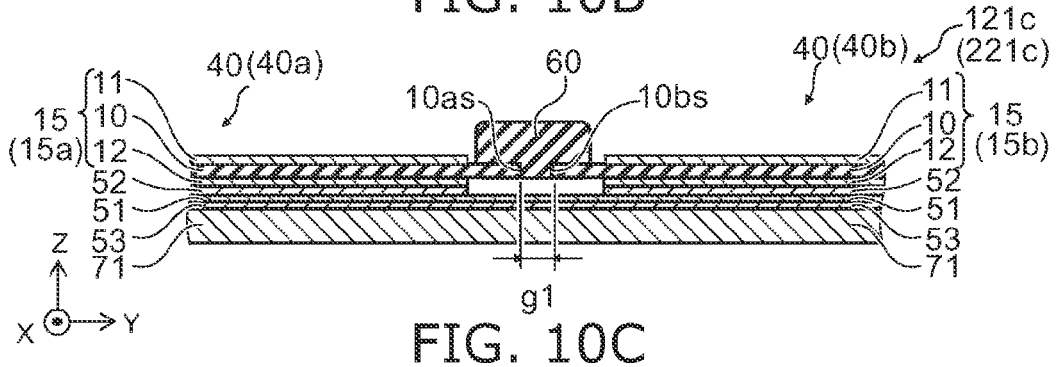
Figure 10D:
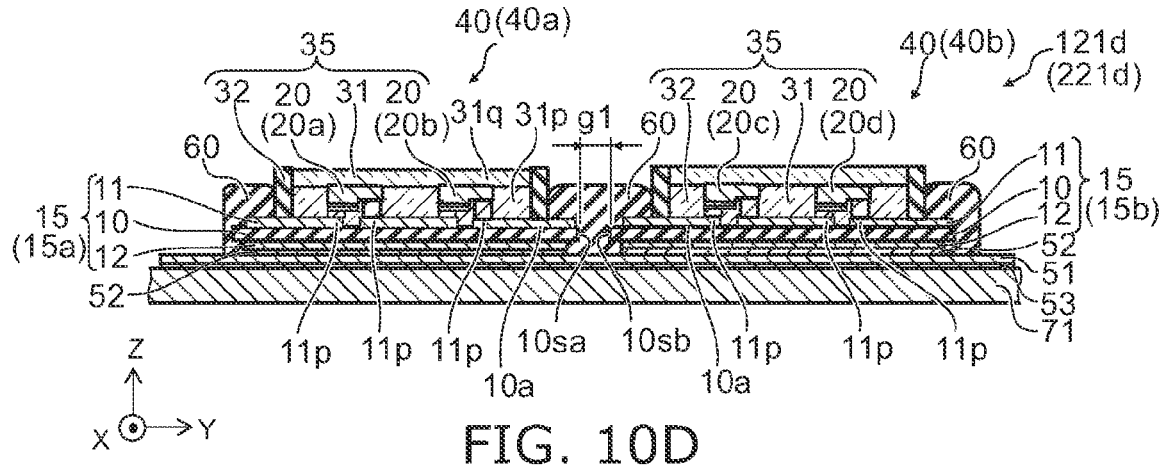

FIGS. 9A and 9B are schematic diagrams illustrating the light-emitting device and the luminaire according to the fifth embodiment.

FIG. 9A is a plan view, FIG. 9B is a sectional view illustrating an A1-A2 line cross section of FIG. 9A.

As illustrated in FIGS. 9A and 9B, the light-emitting device 121 according to this embodiment includes the thermal radiation member 51, the heat conduction layer 52, and the plurality of light-emitting sections 40 (e.g., the first light-emitting section 40a, the second light-emitting section 40b, the third light-emitting section 40c, and the fourth light-emitting section 40d). The configurations explained in the first embodiment can be applied to each of the plurality of light-emitting sections 40, the thermal radiation member 51, and the heat conduction layer 52. In this example, the heat conduction layer 52 is divided for each of the plurality of light-emitting sections 40. The second light-emitting section 40b is arranged side by side with the first light-emitting section 40a in a surface parallel to the first principal plane 10a.

For example, the thermal radiation member 51 includes a substrate of copper and a nickel layer provided on the surface of the substrate. The nickel layer is formed by, for example, plating. For example, SnAg solder is used as the heat conduction layer 52.

FIGS. 9A and 9B illustrate the configuration of the luminaire 221 according to this embodiment as well. The luminaire 221 includes the luminaire member 71 (e.g., the base section 72) and the light-emitting device 121 provided on the luminaire member 71.

The first light-emitting section 40a includes the plurality of semiconductor light-emitting elements 20 (the first semiconductor light-emitting element 20a, the second semiconductor light-emitting element 20b, etc.). The second light-emitting section 40b includes the plurality of semiconductor light-emitting elements 20 (a third semiconductor light-emitting element 20c, a fourth semiconductor light-emitting element 20d, etc.).

For example, the first light-emitting section 40a includes a first mounting substrate section 15a. The second light-emitting section 40b includes a second mounting substrate section 15b. The configuration of the mounting substrate section 15 explained in the first embodiment can be applied to each of the first mounting substrate section 15a and the second mounting substrate section 15b.

The substrate 10 of one light-emitting section 40 (the first light-emitting section 40a) among the plurality of light-emitting sections 40 includes a first side surface 10sa. The first side surface 10sa crosses the first principal plane 10a.

The substrate 10 of another light-emitting section 40 (the second light-emitting section 40b) among the plurality of light-emitting sections 40 includes a second side surface 10sb. The second side surface 10sb crosses the first principal plane 10a and is opposed to the first side surface 10sa.

The light-emitting device 121 further includes a light reflecting resin layer 60. The light reflecting resin layer 60 is light-reflective and insulative. The light reflecting resin layer 60 covers at least a part of the first side surface 10sa and covers at least a part of the second side surface 10sb.

The light reflecting resin layer 60 includes, for example, insulative resin and a plurality of particles dispersed in the insulative resin. For example, at least one of $TiO_2$ and $Al_2O_3$ is used as the plurality of particles. For example, at least any one of silicon resin, epoxy resin, acrylic resin, and polyimide resin is used as the insulative resin. The reflectance of the light reflecting resin layer 60 is, for example, equal to or higher than 70%. Consequently, high insulation properties and high reflectance are obtained and light use efficiency is improved.

As explained above, it is sometimes preferable to reduce the interval among the light-emitting sections 40. In order to reduce the interval among the plurality of light-emitting sections 40, for example, the area of the substrate 10 included in each of the plurality of light-emitting sections 40 is reduced. On the other hand, in the first metal layer 11 provided on the first principal plane 10a and the second metal layer 12 provided on the second principal plane 10b of the substrate 10, areas suitable therefor are necessary.

When the area of the substrate 10 is reduced while the area of each of the first metal layer 11 and the second metal layer 12 is set proper, the distance between the end of the substrate 10 and the end of the first metal layer 11 is reduced and the distance between the end of the substrate 10 and the end of the second metal layer 12 is reduced. As a result, a creepage distance of insulation in these metal layers is reduced.

When the interval among the plurality of light-emitting sections 40 is reduced in this way, a creepage distance of insulation in the mounting substrate section 15 is reduced. As a result, insulation properties tend to be deteriorated.

In this embodiment, the light reflective resin layer 60 is provided among the mounting substrate sections 15 of the plurality of light-emitting sections 40 adjacent to one another. The light reflecting resin layer 60 covers at least a part of the first side surface 10sa. Consequently, even when the creepage distance of insulation in the first light-emitting section 40a is reduced, satisfactory insulation properties can be maintained in the first mounting substrate section 15a. Similarly, the light reflecting resin layer 60 covers at least a part of the second side surface 10sb. Consequently, even when the creepage distance of insulation in the second light-emitting section 40b is reduced, satisfactory insulation properties can be maintained in the second mounting substrate section 15b.

In this example, as illustrated in FIG. 9B, the light reflecting resin layer 60 covers the first side surface 10sa and the second side surface 10sb and covers parts of the first principal plane 10a of the substrate 10 of the one light-emitting section 40 (the first light-emitting section 40a) and parts of the first principal plane 10a of the substrate 10 of the other light-emitting section 40 (the second light-emitting section 40b). For example, the light reflecting resin layer 60 covers parts of the first metal layer 11 of the first light-emitting section 40a and parts of the first metal layer 11 of the second light-emitting section 40b. Consequently, deterioration in the insulation properties is further suppressed.

For example, the light reflecting resin layer 60 covers the side surfaces of the first metal layer 11 of the first light-emitting section 40a and the side surfaces of the first metal layer 11 of the second light-emitting section 40b. Consequently, insulation properties between the side surfaces of the first metal layer 11 of the first light-emitting section 40a and the side surfaces of the first metal layer 11 of the second light-emitting section 40b can be improved.

In this example, the light reflecting resin layer 60 covers the side surfaces of the second metal layer 12 of the first light-emitting section 40a and the side surfaces of the second metal layer 12 of the second light-emitting section 40b. Consequently, insulation properties between the side surfaces of the second metal layer 12 of the first light-emitting section 40a and the side surfaces of the second metal layer 12 of the second light-emitting section 40b can be improved.

For example, when the interval among the plurality of light-emitting sections 40 is reduced, insulation properties tend to be deteriorated among the metal layers included in each of the plurality of light-emitting sections 40. Since the light reflecting resin layer 60 covers the side surfaces of the metal layers included in each of the plurality of light-emitting sections 40, the insulation properties between the side surfaces can be improved.

As illustrated in FIG. 9B, in this example, parts of the light reflecting resin layer 60 is arranged between the substrate 10 of the first mounting substrate section 15a of the first light-emitting section 40a and the thermal radiation member 51. Further, parts of the light reflecting resin layer 60 is arranged between the substrate 10 of the second mounting substrate section 15b of the second light-emitting section 40b and the thermal radiation member 51. The light reflecting resin layer 60 is filled in a space between the first mounting substrate section 15a and the second mounting substrate section 15b. Consequently, the insulation properties can be further improved.

Further, as illustrated in FIG. 9A, in this example, the light reflecting resin layer 60 covers the outer edges of the substrates 10 included in the plurality of light-emitting sections 40. Consequently, the light use efficiency can be improved.

Since the light reflecting resin layer 60 is provided, an interval between the first light-emitting section 40a and the second light-emitting section 40b can be reduced. For example, a distance g1 between the first side surface 10sa of the substrate 10 of the first light-emitting section 40a and the second side surface 10sb of the substrate 10 of the second light-emitting section 40b is equal to or larger than 0.5 millimeter (mm) and equal to or smaller than 5 millimeters (mm). The distance g1 is preferably equal to or smaller than 1 mm.

In this example, the wavelength conversion layer 31 includes a first wavelength conversion film 31p and a second wavelength conversion film 31q. The first wavelength conversion film 31p covers the side surfaces of the semiconductor light-emitting elements 20. The second wavelength conversion film 31q covers the upper surfaces of the semiconductor light-emitting elements 20 and is provided on the first wavelength conversion film 31p. The first wavelength conversion film 31p emits, for example, red light. The second wavelength conversion film 31q emits, for example, yellow light.

FIGS. 10A to 10D are schematic sectional views illustrating other light-emitting devices and other luminaires according to the fifth embodiment.

In the figures, the luminaire member 71 is omitted. The configuration explained concerning the first embodiment or the configuration explained concerning the luminaire 221 can be applied to the luminaire member 71 in these examples.

As illustrated in FIGS. 10A to 10D, in light-emitting devices 121a to 121d (and luminaires 221a to 221d) according to this embodiment, the light reflecting resin layer 60 covers the first side surface 10sa and the second side surface 10sb. Further, the light reflecting resin layer 60 covers parts of the principal plane 10a of the substrate 10 of the first light-emitting section 40a and parts of the first principal plane 10a of the substrate 10 of the second light-emitting section 40b.

In the light-emitting device 121a (and the luminaire 221a), the light reflecting resin layer 60 is separated from the first metal layer 11 and separated from the second metal layer 12. A part of the light reflecting resin layer 60 is arranged between the substrate 10 of the first mounting substrate section 15a and the thermal radiation member 51. Further, a part of the light reflecting resin layer 60 is arranged between the substrate 10 of the second mounting substrate section 15b and the thermal radiation member 51.

In the light-emitting device 121b (and the luminaire 221b), the light reflecting resin layer 60 covers a part of the first metal layer 11 and is in contact with a part of the second metal layer 12. A part of the light reflecting resin layer 60 is arranged between the substrate 10 of the first mounting substrate section 15a and the thermal radiation member 51. A part of the light reflecting resin layer 60 is arranged between the substrate 10 of the second mounting substrate section 15b and the thermal radiation member 51.

In the light-emitting device 121c (and the luminaire 221c), the light reflecting resin layer 60 is separated from the first metal layer 11 and separated from the second metal layer 12. The light reflecting resin layer 60 is not arranged between the substrate 10 of the first mounting substrate section 15a and the thermal radiation member 51 and between the substrate 10 of the second mounting substrate section 15b and the thermal radiation member 51.

In the light-emitting device 121d (and the luminaire 221d), the light reflecting resin layer 60 covers a part of the first metal layer 11 and covers a part of the second metal layer 12. The light reflecting resin layer 60 is in contact with the reflecting layer 32. A part of the light reflecting resin layer 60 is arranged between the substrate 10 of the first mounting substrate section 15a and the thermal radiation member 51. Further, a part of the light reflecting resin layer 60 is arranged between the substrate 10 of the second mounting substrate section 15b and the thermal radiation member 51. The light reflecting resin layer 60 is filled in the space between the first mounting substrate section 15a and the second mounting substrate section 15b. Consequently, higher insulation properties and higher reflectance can be obtained.

Figure 11A:
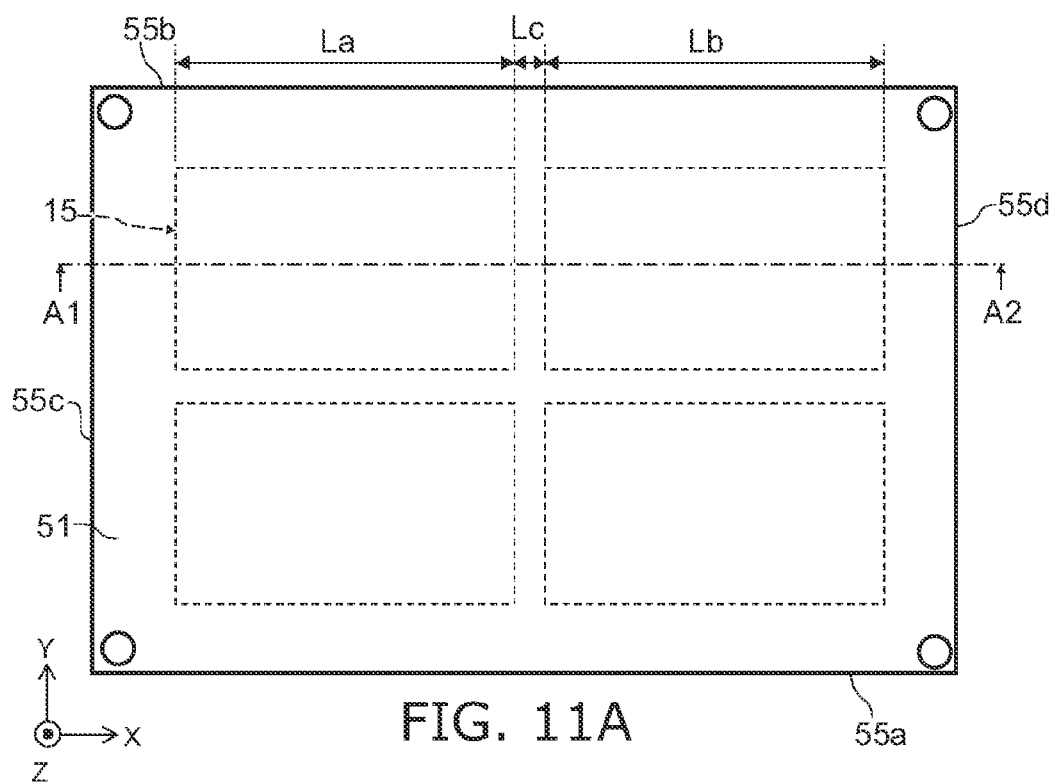
FIGS. 11A and 11B are schematic diagrams illustrating the light-emitting device and the luminaire.
Figure 11B:
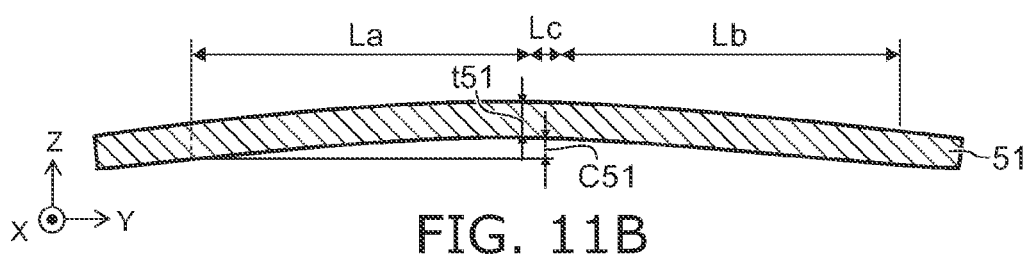

FIGS. 11A and 11B are schematic diagrams illustrating the light-emitting device and the luminaire according to the fifth embodiment.

The figures illustrate the shape of the thermal radiation member 51 according to this embodiment. FIG. 11A are plan view. FIG. 11B is an A1-A2 line sectional view of FIG. 11A.

As illustrated in FIG. 11A, the thermal radiation member 51 has first to fourth sides 55a to 55d. For example, the first side 55a extends along the X-axis direction. The second side 55b is separated from the first side 55a and extends along the X-axis direction. The third side 55c connects one end of the first side 55a and one end of the second side 55b. The fourth side 55d is separated from the third side 55c and connects the other end of the first side 55a and the other end of the second side 55b. In this example, each of the length of the first side 55a and the length of the second side 55b is larger than each of the length of the third side 55c and the length of the fourth side 55d.

As illustrated in FIG. 11B, the thermal radiation member 51 may be warped. For example, the thermal radiation member 51 and the light-emitting section 40 are joined at high temperature. The thermal radiation member 51 is sometimes warped according to a difference in a coefficient of thermal expansion.

Attention is directed to the warp of the region where the mounting substrate section 15 is provided in the thermal radiation member 51. As illustrated in FIG. 11A, the length of the region where the mounting substrate section 15 is provided is length L01 (mm) of a sum of length La (mm) of one mounting substrate section 15, length Lb (mm) of another mounting substrate section 15, and length Lc (mm) of a space between the mounting substrate sections 15. The length L01 is La+Lb+Lc. Warp C51 of the thermal radiation member 51 is a difference between positions in the Z-axis direction of the ends of the region of the thermal radiation member 51. For example, the warp C51 (mm) of the thermal radiation member 51 is a distance in the Z-axis direction between the end of the region on the lower surface of the thermal radiation member 51 and the center of the lower surface of the thermal radiation member 51. For example, the warp C51 of the thermal radiation member 51 may be a distance in the Z-axis direction between the end of the region on the upper surface of the thermal radiation member 51 and the center of the upper surface of the thermal radiation member 51. The warp C51 of the thermal radiation member 51 depends on the size of the region where the mounting substrate section 15 is provided. Relative warp RC1 is represented as C51/L01.

On the other hand, the thermal radiation member 51 has thickness t51 (mm). The warp of the thermal radiation member 51 depends on the thickness t51 of the thermal radiation member 51. Relative thickness RT1 is represented as t51/L01.

Figure 12:
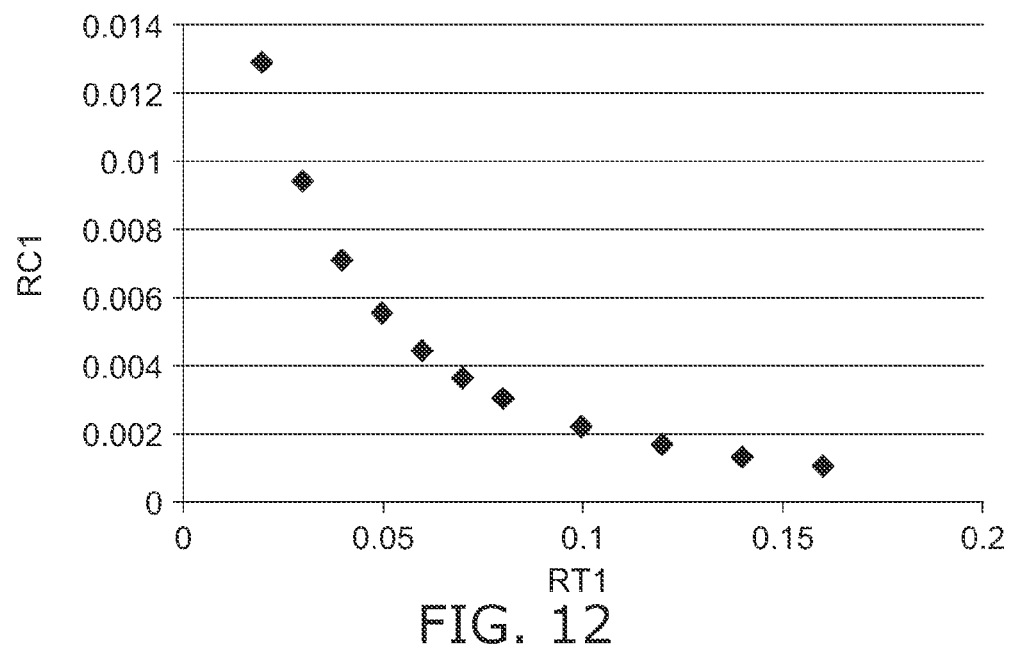
FIG. 12 is a graph illustrating characteristics of the light-emitting device and the luminaire.

FIG. 12 is a graph illustrating a characteristic of the light-emitting device and the luminaire according to the fifth embodiment.

FIG. 12 illustrates a simulation result of warp at 25° C. obtained after the thermal radiation member 51 and the light-emitting section 40 are joined at 217° C. The thermal radiation member 51 and the light-emitting section 40 are joined by the heat conduction layer 52 (e.g., solder). The abscissa of FIG. 12 indicates the relative thickness RT1 of the thermal radiation member 51 (a heat spreader) and the ordinate indicates the relative warp RC1.

For example, the length L01 of the region where the mounting substrate section 15 is provided in the thermal radiation member 51 is 50 mm. For example, when the relative thickness RT1 is 0.06, the thickness t51 of the thermal radiation member 51 is 3 mm. When the relative thickness RT1 is 0.12, the thickness t51 of the thermal radiation member 51 is 6 mm. When the relative warp RC1 is 0.004, the warp C51 is 0.2 mm. For example, when the length L01 of the region where the mounting substrate section 15 is provided in the thermal radiation member 51 is 50 mm, the warp C51 is preferably set to be equal to or smaller than 0.2 mm. Consequently, for example, highly efficient reflection in the reflecting section 73 can be obtained. If the warp is excessively large, reflection in a proper direction of the light LL by the reflecting section 73 is difficult. The thermal radiation properties could be worsened. Practically, the relative warp RC1 is preferably equal to or smaller than 0.004. Consequently, high efficiency by high reflection can be obtained.

From FIG. 12, the relative thickness RT1 is preferably 0.06. When the relative thickness RT1 increases, a change in the relative warp RC1 decreases. The relative thickness RT1 may be equal to or smaller than 0.12. When the relative thickness RT1 exceeds 0.12, a material use amount of the thermal radiation member 51 excessively increases.

Therefore, in this embodiment, the relative thickness RT1 is preferably equal to or larger than 0.06 and equal to or smaller than 0.12. That is, the thickness of the thermal radiation member 51 is preferably equal to or larger than 0.6 times and equal to smaller than 0.12 times the length L01 of the region where the mounting substrate section 15 is provided in the thermal radiation member 51.

In general, in an LED module, when a plurality of COB modules are mounted on a heat spreader, to limit the mounting, an interval among the COB modules is set to be equal to or larger than a fixed interval. Therefore, the size of the LED module increases and the size of a reflecting mirror and an external size increase. In gaps formed among the COB modules, reflectance is low. Therefore, a reflection loss occurs.

On the other hand, in a high-power COB module used for a floodlight or the like, it is preferable that the area of a light-emitting region is small and light emission density is high in order to satisfy a luminous intensity distribution characteristic. However, when the light emission density increases, the temperature in the center of the light-emitting region further rises. In a configuration in which a heat spreader is connected to each of a plurality of COB modules, fluctuation in temperature sometimes occurs in each of the plurality of COB modules.

In this embodiment, a heat spreader and a plurality of COB modules are combined and, for example, white insulating resin (the light reflecting resin layer 60) is provided in regions among the plurality of COB modules. Consequently, for example, a creepage distance of insulation of a wiring substrate can be reduced. As a result, the size of the light-emitting device can be reduced.

It is possible to reduce a light reflection loss by setting the reflectance of the white insulating resin to be equal to or higher than 70%.

Since one heat spreader and the plurality of COB modules are combined, for example, a maximum temperature of the COB modules can be suppressed. Temperatures in the plurality of COB modules can be equalized. The light-emitting device can be reduced in size.

In this embodiment, for example, solder is used as the heat conduction layer 52. Consequently, for example, the thermal radiation properties can be improved.

In this embodiment, for example, it is possible to increase a heat spreader effect by setting the relative thickness RT1 to be equal to or larger than 0.015 and equal to or smaller than 0.03. Warp in the light-emitting device can be reduced.

Sixth Embodiment

FIGS. 13A to 13F are schematic sectional views illustrating a light-emitting device and a luminaire according to a sixth embodiment.

Figure 13A:
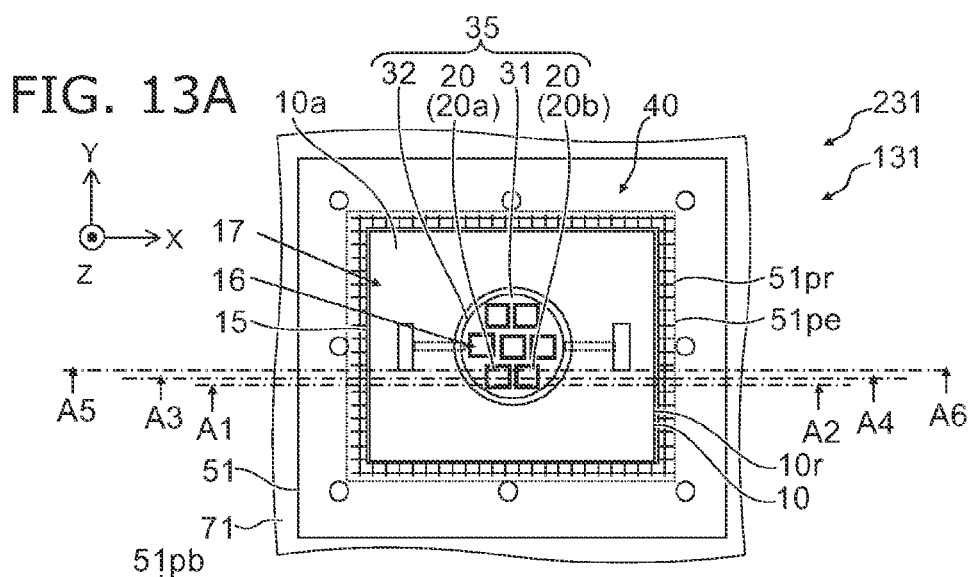
FIGS. 13A to 13F are schematic sectional views illustrating a light-emitting device and a luminaire according to a sixth embodiment.
Figure 13B:
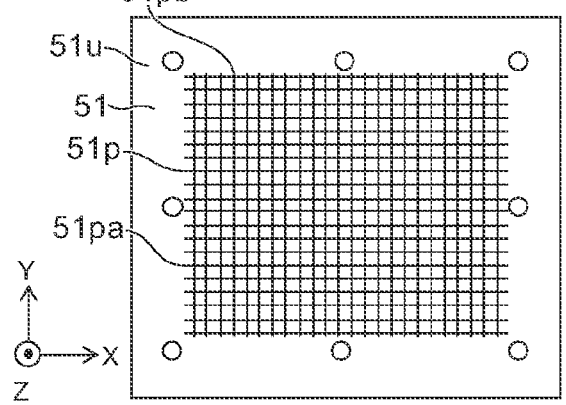
Figure 13C:
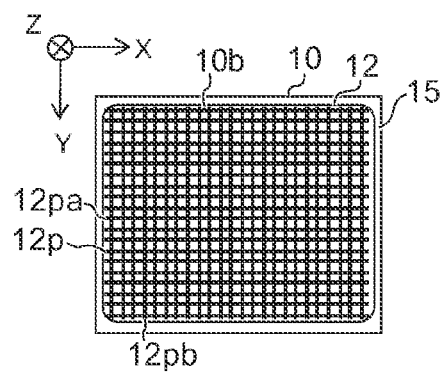
Figure 13D:
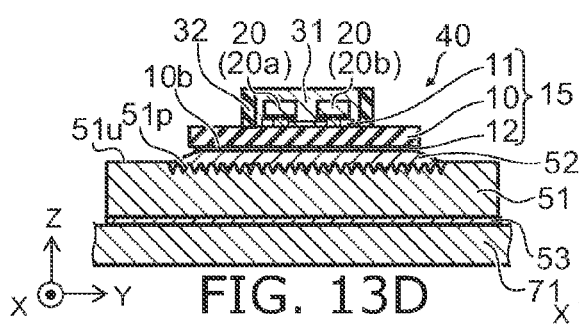
Figure 13E:
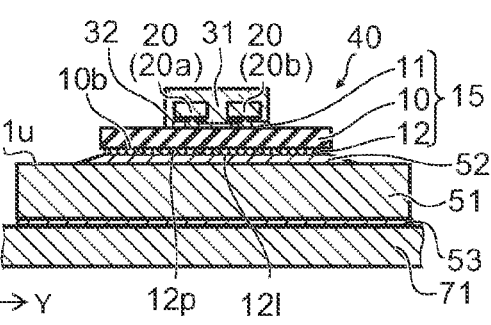
Figure 13F:
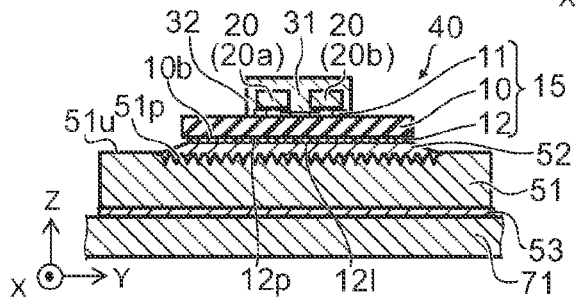

FIG. 13A is a plan view of a light-emitting device 131 and a luminaire 231 according to this embodiment. FIG. 13B is a plan view of the thermal radiation member 51 included in the light-emitting device 131. FIG. 13C is a plan view of the mounting substrate section 15 included in the light-emitting device 131. FIGS. 13D, 13E, and 13F are respectively an A1-A2 line sectional view, an A3-A4 line sectional view, and an A5-A6 line sectional view of FIG. 13A.

As illustrated in FIG. 13A, the luminaire 231 according to this embodiment includes the light-emitting device 131 and the luminaire member 71. In this example, as in the example explained above, the light-emitting device 131 includes the thermal radiation member 51, the heat conduction layer 52, and the light-emitting section 40. In this example, as in the example explained above, since the ratio Rs is set to be equal to or higher than 5, even when the luminous existence is as high as equal to or higher than 10 lm/mm$^2$ and equal to or lower than 100 lm/mm$^2$, it is possible to provide a light-emitting device with improved thermal radiation properties.

As illustrated in FIGS. 13B, 13D, and 13F, a first surface (an upper surface 51u) of the thermal radiation member 51 opposed to the second principal plane 10b has irregularities 51p.

As illustrated in FIG. 13B, for example, the irregularities 51p of the first surface (the upper surface 51u) include a plurality of first groves 51pa. The plurality of first grooves 51pa extend, for example, in the X-axis direction (e.g., a first direction parallel to the second principal plane 10b). In this example, the irregularities 51p of the first surface (the upper surface 51u) further include a plurality of second grooves 51pb. The plurality of second grooves 51pb extend, for example, in the Y-axis direction (e.g., parallel to the second principal plane 10b and crossing the first direction). In this example, the second direction is perpendicular to the first direction. In this embodiment, an angle between the first direction and the second direction is arbitrary.

As illustrated in FIG. 13A, in this example, an outer edge 51pe formed when a region 51pr, where the irregularities 51p are provided, in the first surface (the upper surface 51u) is projected on the second principal plane 10b is located on the outer side of an outer edge formed when the substrate 10 is projected on the second principal plane 10b (e.g., the outer edge 10r of the first principal plane 10a).

As illustrated in FIGS. 13C, 13D, and 13F, in this example, a second surface (a lower surface 12l) of the second metal layer 12 opposed to the thermal radiation member 51 has irregularities 12p.

The irregularities 12p of the second surface (the lower surface 12l) include a plurality of third grooves 12pa. The plurality of third grooves 12pa extend, for example, in the X-axis direction (e.g., a third direction parallel to the second principal plane 10b). In this embodiment, the irregularities 12p of the second surface (the lower surface 12l) further includes a plurality of fourth grooves 12pb. The plurality of fourth grooves 12pb extend, for example, in the Y-axis direction (e.g., a fourth direction parallel to the second principal plane 10b and crossing the third direction). In this example, the fourth direction is perpendicular to the third direction. In this embodiment, an angle between the third direction and the fourth direction is arbitrary. An angle between the third direction and the first direction, an angle between the third direction and the second direction, an angle between the fourth direction and the first direction, and an angle between the fourth direction and the second direction are arbitrary.

This embodiment is not limited to the above. The irregularities 51p may include, for example, a plurality of independent convex portions and concave portions. The irregularities 51p may include, for example, a plurality of independent concave portions and convex portions. The irregularities 12p may include, for example, a plurality of independent convex portions and concave portions. The irregularities 12p may include, for example, a plurality of independent concave portions and convex portions.

In this embodiment, at least one of the irregularities 51p of the thermal radiation member 51 and the irregularities 12p of the second metal layer 12 may be provided.

The heat conduction layer 52 (e.g., solder) is filled in the concave portions of the irregularities 51p and the concave portions of the irregularities 12p. Since the irregularities are provided, stress is further reduced.

For example, heat is generated in the light-emitting section 40. For example, light emission efficiency (lm/W) in the semiconductor light-emitting elements 20 is reduced by the generated heat. When input power is increased, the temperature of the light-emitting device (e.g., the temperature of the semiconductor light-emitting elements 20) sometimes rises to be higher than a specification value of an environmental temperature of the light-emitting device.

For improvement of the thermal radiation properties, for example, there is a structure in which the rear surface of a COB and a thermal radiation plate (the thermal radiation member 51) are joined by solder (the heat conduction layer 52). In this structure, stress is applied to solder according to a difference in a coefficient of thermal expansion among the COB, the thermal radiation plate, and the solder. As a result, in some case, a crack occurs in the solder and reliability falls. There is a method of joining the COB and the thermal radiation plate via a material having small deformation resistance. However, satisfactory solder joining is less easily obtained. Further, in this method, a strain that occurs in a joined portion remains large. Therefore, when the COB or the thermal radiation plate warps, the strain concentrates and a crack tends to occur from a portion on which the strain concentrates.

On the other hand, in this embodiment, at least one of the irregularities 51p of the thermal radiation member 51 and the irregularities 12p of the second metal layer 12 are provided. Therefore, stress that occurs in the solder (the heat conduction layer 52) is reduced and a strain can be reduced. For example, stress in the X-Y plane is reduced by at least one of the irregularities 51p and the irregularities 12p. Consequently, the reliability can be improved.

Further, since the irregularities 51p are provided, a contact area of the thermal radiation member 51 and the heat conduction layer 52 (e.g., the solder) expands. Since the irregularities 12p are provided, a contact area of the second metal layer 12 and the heat conduction layer 52 (e.g., the solder) expands. Consequently, the thermal radiation properties are improved.

In this way, since the irregularities are provided in at least one of the surface of the COB and the surface of the thermal radiation plate, stress can be reduced. Further, in the joining by the solder, a joining area can be increased and the thermal radiation properties are improved.

FIGS. 14A to 14G are schematic sectional views illustrating the light-emitting device according to the sixth embodiment.

The figures are sectional views of the thermal radiation member 51 according to this embodiment taken along a plane including the Z-axis direction.

In examples illustrated in FIGS. 14A and 14B, the irregularities 51p provided on the upper surface 51u of the thermal radiation member 51 include a concave portion 51pd. The concave portion 51pd includes a bottom surface portion (a thermal radiation member bottom surface portion 51qb) and a side surface portion (a thermal radiation member side surface portion 51qa). The side surface portion (the thermal radiation member side surface portion 51qa) crosses the second principal plane 10b (i.e., the X-Y plane). In these examples, the cross section of the thermal radiation member 51 includes two thermal radiation member side surface portions 51qa. The cross section of a portion where the two thermal radiation member side surface portions 51qa cross (a thermal radiation member bottom surface portion 51qb) has a triangular shape.

In the example illustrated in FIG. 14A, a convex portion 51pp of the upper surface 51u of the thermal radiation member 51 has a planar shape substantially parallel to the upper surface 51u of the thermal radiation member 51. In the example illustrated in FIG. 14B, the cross section of the convex portion 51pp of the upper surface 51u of the thermal radiation member 51 has a triangular shape.

In examples illustrated in FIGS. 14C and 14D, as in the examples illustrated in FIGS. 14A and 14B, the concave portion 51pd of the thermal radiation member 51 includes the bottom surface portion (the thermal radiation member bottom surface portion 51qb) and the side surface portion (the thermal radiation member side surface portion 51qa). In the examples, the thermal radiation member bottom surface portion 51qb has a planar shape substantially parallel to the X-Y plane.

In the example illustrated in FIG. 14C, the convex portion 51pp of the upper surface 51u of the thermal radiation member 51 has a planar shape substantially parallel to the X-Y plane. In the example illustrated in FIG. 14D, the cross section of the convex portion 51pp of the upper surface 51u of the thermal radiation member 51 has a triangular shape.

In examples illustrated in FIGS. 14E, 14F, and 14G, the concave portion 51pd of the thermal radiation member 51 includes a corner portion (a thermal radiation member corner portion 51*qc*) in addition to the bottom surface portion (the thermal radiation member bottom surface portion 51*qc*) and the side surface portion (the thermal radiation member side surface portion 51*qa*). The thermal radiation member corner portion 51*qc* connects the thermal radiation member bottom portion 51*qb* and the thermal radiation member side surface portion 51*qa* and has a curved surface shape.

In the example illustrated in FIG. 14E, the convex portion 51*pp* of the upper surface 51*u* of the thermal radiation member 51 has a planar shape substantially parallel to the X-Y plane. In the example illustrated in FIG. 14F, the convex portion 51*pp* of the upper surface 51*u* of the thermal radiation member 51 has a curved surface shape. In the example illustrated in FIG. 14(*g*), the convex portion 55*pp* of the upper surface 51*u* of the thermal radiation member 51 has a planar shape substantially parallel to the X-Y plane. The thermal radiation member bottom surface section 51*qb* has a planar shape substantially parallel to the X-Y plane.

In this embodiment, it is preferable to provide a thermal radiation member corner portion 51*qc* having a curved surface shape. In this way, an edge portion (a corner portion) of the concave portion 51*pd* (e.g., a groove) is formed in a curved surface shape. Consequently, it is possible to suppress stress from concentrating on the edge portion of the concave portion 51*pd* of the thermal radiation member 51. When the edge portion has a non-curved surface shape, a crack starts from the edge portion and a crack tends to occur. Since the edge portion is formed in a curved surface shape, it is possible to further suppress occurrence of a crack.

FIGS. 15A to 15G are schematic sectional views illustrating the light-emitting device according to the sixth embodiment.

These figures are sectional views in which the second metal layer 12 according to this embodiment is cut along a plane including the Z-axis direction.

In examples illustrated in FIGS. 15A and 15B, the irregularities 12*p* provided on the lower surface 121 of the second metal layer 12 includes the concave portion 12*pd*. The concave portion 12*pd* includes the bottom surface portion (the second metal layer bottom surface portion 12*qb*) and the side surface portion (the second metal layer side portion 12*qa*). The side surface portion (the second metal layer side surface portion 12*qa*) crosses the second principal plane 10*b* (i.e., the X-Y plane). In these examples, the cross section of the second metal layer 12 includes two second metal layer side surface portions 12*qa*. A portion where the two second metal layer side surface portions 12*qa* cross (the second metal layer bottom surface portion 12*qb*) has a triangular shape.

In the example illustrated in FIG. 15A, the convex portion 12*pp* of the lower surface 121 of the second metal layer 12 has a planar shape substantially parallel to the X-Y plane. In the example illustrated in FIG. 15B, the cross section of the convex portion 12*pp* of the lower surface 121 of the second metal layer 12 has a triangular shape.

In examples illustrated in FIGS. 15C and 15D, as in the examples explained above, the concave portion 12*pd* of the second metal layer 12 includes the bottom surface portion (the second metal layer bottom surface portion 12*qb*) and the side surface portion (the second metal layer side surface portion 12*qa*). In these examples, the second metal layer bottom surface portion 12*qb* has a planar shape substantially parallel to the X-Y plane.

In the example illustrated in FIG. 15C, the convex portion 12*pp* of the lower surface 121 of the second metal layer 12 has a planar shape substantially parallel to the X-Y plane. In the example illustrated in FIG. 15D, the cross section of the convex portion 12*pp* of the lower surface 121 of the second metal layer 12 has a triangular shape.

In examples illustrated in FIGS. 15E, 15F, and 15G, the concave portion 12*pd* of the second metal layer 12 includes a corner portion (a second metal layer corner portion 12*qc*) in addition to the bottom surface portion (the second metal layer bottom surface portion 12*qb*) and the side surface portion (the second metal layer side surface portion 12*qa*). The second metal layer corner portion 12*qc* connects the second metal layer bottom surface portion 12*qb* and the second metal layer side surface portion 12*qa* and has a curved surface shape.

In the example illustrated in FIG. 15E, the convex portion 12*pp* of the lower surface 121 of the second metal layer 12 has a planar shape substantially parallel to the X-Y plane. In the example illustrated in FIG. 15F, the convex portion 12*pp* of the bottom surface 121 of the second metal layer 12 has a curved surface shape, in the example illustrated in FIG. 15G, the convex portion 12*pp* of the bottom surface 121 of the second metal layer 12 has a planar shape substantially parallel to the X-Y plane and the second metal layer bottom surface portion 12*qb* has a planar shape substantially parallel to the X-Y plane.

In this embodiment, it is preferable to provide the second metal layer corner portion 12*qc* having a curved surface shape. In this way, an edge portion (a corner portion) of the concave portion 12*pd* (e.g., a groove) is formed in a curved surface shape. Consequently, it is possible to suppress stress from concentrating on the edge portion of the concave portion 12*pd* of the second metal layer 12. As a result, it is possible to further suppress occurrence of a crack.

In this embodiment, the shape of the concave portion (e.g., the groove) (a sectional shape of the concave portion cut along the plane including the Z-axis direction) can be, for example, a triangular shape, a trapezoidal shape, or a circular shape (an elliptical shape). When the shape is the triangular shape or the trapezoidal shape, it is preferable to form the corner portion in a curved surface shape.

Depth d51 of the irregularities 51*p* provided on the first surface (the upper surface 51*u*) of the thermal radiation member 51 is preferably equal to or smaller than 1/10 times the thickness t51 of the thermal radiation member 51 (see FIG. 14G). Since the depth d51 is set to be equal to or smaller than 1/10 times the thickness t51, for example, it is possible to suppress generation of a void in the solder (the heat conduction layer 52). Further, it is possible to suppress an amount of use of the solder and an increase in costs. When a higher effect is demanded, the depth d51 is desirably equal to or smaller than 1/20 times the thickness t51. The depth d51 is preferably equal to or larger than 1/1000 times the thickness t51 of the thermal radiation member 51. Consequently, it is possible to effectively suppress stress. Improvement of the thermal radiation properties through an increase in the contact area can be effectively obtained.

On the other hand, depth d12 of the irregularities 12*p* provided on the second surface (the lower surface 121) of the second metal layer 12 is preferably equal to or smaller than 1/2 times the thickness t12 of the second metal layer 12 (see FIG. 15G). Since the depth d12 is set to be equal to or smaller than 1/2 times the thickness t12, for example, it is possible to suppress generation of a void in the solder (the heat conduction layer 52). Further, it is possible to suppress an amount of use of the solder and suppress an increase in costs. The depth d12 is preferably equal to or larger than 1/100 times the thickness t12 of the second metal layer 12. Consequently, it is possible to effectively suppress stress. Improvement of the thermal radiation properties through an increase in the contact area can be effectively obtained.

For example, a groove pitch is preferably equal to or larger than two times a groove depth.

For example, a pitch of a plurality of the concave portions 51pd of the thermal radiation member 51 is preferably equal to or larger than two times the depth of the concave portion 51pd. For example, the distance between bottom surface portions (the thermal radiation member bottom surface portions 51qb) of the plurality of concave portions 51pd adjacent to each other is preferably equal to or larger than two times the distance along the Z-axis direction between the convex portion 51pp of the concave portion 52pd and the bottom surface portion (the thermal radiation member bottom surface portion 51pd). Consequently, the shape of the concave portion 51pd (the shape of the groove) is easily stabilized. The pitch is more preferably equal to or larger than ten times the depth. Consequently, the shape of the concave portion (the groove) is easily equalized.

For example, a pitch of a plurality of the concave portions 12pd of the second metal layer 12 is preferably equal to or larger than two times the depth of the concave portion 12pd. For example, the distance between bottom surface portions (the second metal layer bottom surface portions 12qb) of the plurality of concave portions 12pd adjacent to each other is preferably equal to or larger than two times the distance along the Z-axis direction between the convex portion 12pp of the concave portion 12pd and the bottom surface portion (the second metal layer bottom surface portion 12pb). Consequently, the shape of the concave portion 12pd (the shape of the groove) is easily stabilized. The pitch is more preferably equal to or larger than ten times the depth. Consequently, the shape of the concave portion (the groove) is easily equalized.

In this embodiment, the distance between the grooves is preferably equal to or larger than the depth of the groove.

For example, the distance between the plurality of concave portions 51pd of the thermal radiation member 51 is preferably equal to or larger than two times the depth of the concave portion 51pd. For example, the width (the distance in the direction perpendicular to the Z-axis direction) of the convex portions 51pp of the plurality of concave portions 51pd adjacent to each other is preferably equal to or larger than the distance along the Z-axis direction between the convex portion 51pp of the concave portion 52pd and the bottom surface portion (the thermal radiation member bottom surface portion 51pb). Consequently, a void in the concave portion 51pd (a void generated in the solder) is suppressed. When the distance between the grooves is excessively small, a void tends to remain.

For example, the distance between the plurality of concave portions 12pd of the second metal layer 12 is preferably equal to or larger than the depth of the concave portion 12pd. For example, the width (the distance in the direction perpendicular to the Z-axis direction) of the convex portions 12pp of the plurality of concave portions 12pd adjacent to each other is preferably equal to or larger than the distance along the Z-axis direction between the convex portion 12pp of the concave portion 12pd and the bottom surface portion (the second metal layer bottom surface portion 12pb). Consequently, a void in the concave portion 12pd is suppressed. When the distance between the grooves is excessively small, a void tends to remain.

In this embodiment, for example, a ceramic substrate is used as the substrate 10. Consequently, high heat conductivity and high insulation properties are obtained. Solder is used as the heat conduction layer 52. Consequently, high heat conductively is obtained.

When the ceramic substrate is used as the substrate 10 and metal is used as the heat conduction layer 52, a large difference occurs in a coefficient of thermal expansion. In this embodiment, since the irregularities are provided, stress can be effectively reduced.

For example, a copper layer is used as the second metal layer 12. Consequently, even when the solder is used as the heat conduction layer 52, satisfactory joining is obtained. A selection range for a material of the solder is widened and a condition range for a joining process is expanded. For example, aluminum may be used as the second metal layer 12. In this case, the material of the solder tends to be limited and the condition for the joining process tends to be limited. The heat conductivity of copper is higher than the heat conductivity of aluminum. Since the copper layer is used as the second metal layer 12, higher thermal radiation properties can be obtained.

As explained above, the outer edge 51pe formed when the region 51pr, where the irregularities 51p are provided, in the first surface (the upper surface 51u) is projected on the second principal plane 10b is preferably located on the outer side of an outer edge formed when the light-emitting region is projected on the second principal plane 10b. Consequently, an effect of stress reduction can be obtained. The region 51pr is more desirably located on the outer side of an outer edge formed when the substrate 10 is projected on the second principal plane 10b (e.g., the outer edge 10r of the first principal plane 10a). Since the area where the irregularities are provided is widened, it is possible to more effectively suppress occurrence of a crack.

Seventh Embodiment

Figure 16:
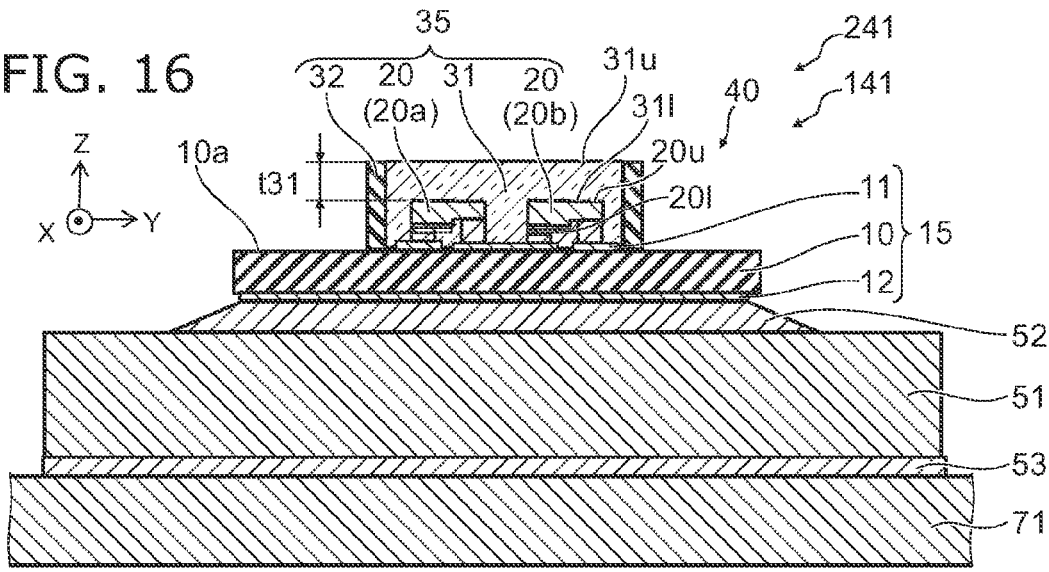
FIG. 16 is a schematic sectional view illustrating a light-emitting device and a luminaire according to a seventh embodiment.

FIG. 16 is a schematic sectional view illustrating a light-emitting device and a luminaire according to a seventh embodiment.

As illustrated in FIG. 16, a luminaire 241 according to this embodiment includes a light-emitting device 141 and the luminaire member 71. The light-emitting device 141 includes the thermal radiation member 51, the heat conduction layer 52, and the light-emitting section 40. In this example, as in the examples explained above, by setting the ratio Rs to be equal to or higher than 5, even when the luminous existence is as high as equal to or higher than 10 lm/mm$^2$ and equal to or lower than 100 lm/mm$^2$, it is possible to provide a light-emitting device with improved thermal radiation properties.

In this example, as in the examples explained above, the light-emitting element section 35 of the light-emitting section 40 includes the plurality of semiconductor light-emitting elements 20 and the wavelength conversion layer 31. In this example, the reflection layer 32 is further provided.

Each of the plurality of semiconductor light-emitting elements 20 (e.g., the first semiconductor light-emitting element 20a and the second semiconductor light-emitting element 20b) includes a semiconductor light-emitting element lower surface 20l opposed to the first principal plane 10a and a semiconductor light-emitting element upper surface 20u on the opposite side of the semiconductor light-emitting element lower surface 20l. The semiconductor light-emitting element upper surface 20u is the upper surface of the semiconductor light-emitting element 20.

On the other hand, the wavelength conversion layer 31 includes a wavelength conversion layer lower surface 31l set in contact with the semiconductor light-emitting element upper surface 20u and a wavelength conversion layer upper surface 31u on the opposite side of the wavelength conversion layer lower surface 31l. The wavelength conversion layer upper surface 31u is the upper surface of the wavelength conversion layer 31.

In this embodiment, a distance t31 in the Z-axis direction (the direction perpendicular to the first principal plane 10a) between the upper surface (the semiconductor light-emitting element upper surface 20u) of any one of the plurality of semiconductor light-emitting elements 20 and the upper surface (the wavelength conversion layer upper surface 31u) of the wavelength conversion layer 31 is equal to or larger than 100 μm and equal to or smaller than 300 μm.

Consequently, high efficiency can be obtained, high heat conductivity is obtained in the wavelength conversion layer 31, and a temperature rise can be suppressed. As a result, the life of the wavelength conversion layer 31 can be extended.

For example, as specification values of the light-emitting device according to this embodiment, for example, a correlated color temperature is 5000 K (Kelvin), a color rendering index is 70, and light emission efficiency at a package temperature of 90° C. is, for example, 100 lm/W. That is, the luminous exitance is high. In the light-emitting device, a large number of LED chips are mounted. The wavelength conversion layer 31 is provided around the LED chips. Light including a blue color is emitted from the LED chips. In the wavelength conversion layer 31, excitation is caused by the blue light, for example, yellow light is emitted, and white light is obtained. The wavelength conversion layer 31 is designed such that the white light is appropriately obtained when the light is combined with the blue light.

The wavelength conversion layer 31 includes resin (the light transmissive resin 31b) and a plurality of phosphor particles (the wavelength conversion particles 31a) dispersed in the resin (see FIG. 5). When the thickness of the wavelength conversion layer 31 (e.g., the distance t31) is large, the concentration of the phosphor particles is set low such that a proper light conversion characteristic can be obtained. Conversely, when the thickness of the wavelength conversion layer 31 (e.g., the distance t31) is thin, the concentration of the phosphor particles is set high.

The heat conductivity of the resin is lower than the heat conductivity of the phosphor particles. Therefore, when the concentration of the phosphor particles is low, the heat conductivity of the wavelength conversion layer 31 is low. When the concentration of the phosphor particles is high, the heat conductivity of the wavelength conversion layer 31 is high.

When the distance t31 is excessively large and exceeds, for example, 500 μm, the concentration of the phosphor particles is set excessively low. Therefore, the heat conductivity in the wavelength conversion layer 31 is low and the temperature of the wavelength conversion layer 31 excessively rises with the heat generated by the semiconductor light-emitting elements 20 and the heat generated by the wavelength conversion layer 31. Consequently, the life of the wavelength conversion layer 31 decreases.

In this embodiment, the distance t31 is set to be equal to or smaller than 300 μm. Consequently, the concentration of the phosphor particles changes to a proper value and the heat conductivity in the wavelength conversion layer 31 can be reduced. As a result, the rise in temperature can be suppressed. For example, the life of the wavelength conversion layer 31 can be extended.

For example, since the distance t31 is set to be equal to or smaller than 300 μm, it is possible to form a state in which a part of the phosphor particles come into contact with one another. The number of phosphor particles that come into contact with the substrate 10 and the LED chips (the semiconductor light-emitting elements 20) increases. Consequently, heat generated in the phosphor particles when a wavelength changes are easily transmitted to the substrate 10 and the LED chips.

On the other hand, when the thickness of the wavelength conversion layer 31 (e.g., the distance t31) is excessively small, the concentration of the phosphor particles in the wavelength conversion layer 31 increases. That is, the distance among the plurality of phosphor particles decreases. Therefore, for example, probability that light emitted from one phosphor particle is absorbed (re-absorbed) by another phosphor particles located near the phosphor particles increases. That is, when the concentration of the phosphor particles is excessively high, the light emission efficiency falls.

In this embodiment, since the distance t31 is set to be equal to or larger than 100 μm, the concentration of the phosphor particles in the wavelength conversion layer 31 becomes proper. Consequently, the re-absorption is suppressed and high light emission efficiency can be obtained.

In this embodiment, the LED chips (the semiconductor light-emitting elements 20) have, for example, a flip-chip structure. The substrate 10 includes ceramic. In the case of the flip-chip structure, heat involved in light emission due to joining of carriers is mainly transmitted to the substrate 10 side. Consequently, in the substrate 10 of ceramic, heat can be effectively radiated and a temperature rise of the LED chip is suppressed.

A COB module is connected to the thermal discharge member 51 (a heat spreader) by the heat conduction layer 52 such as conductive grease or solder. Consequently, it is possible to efficiently conduct and disperse the heat from the LED chips. As a result, an output can be increased. Further, for example, since a heat conduction route to the thermal discharge member 51 can be formed, the temperature of the wavelength conversion layer 31 can be maintained low.

Consequently, for example, in a COB module having high light emission efficiency equal to or higher than 25 lm/W, the temperature of the wavelength conversion layer 31 can be maintained low. Consequently, the life of the wavelength conversion layer 31 can be extended.

For example, as the semiconductor light-emitting element 20, an LED chip, the length in the X-axis direction of which is 1 mm, the length in the Y-axis direction of which is 1 mm, and thickness (the length in the Z-axis direction) of which is 0.4 mm, is used. The plurality of semiconductor light-emitting elements 20 are arranged on the first metal layer 11 of the mounting substrate section 15. The reflecting layer 32 is formed around the plurality of semiconductor light-emitting elements 20. The width (the inner diameter) of the reflecting layer 32 is about 19 mm. In a region surrounded by the reflecting layer 32, the wavelength conversion layer 31 is formed to cover the semiconductor light-emitting elements 20. For example, dimethyl silicone is used as resin of the wavelength conversion layer 31. A plurality of phosphor particles are dispersed in the resin. The concentration of the phosphor particles is about 17 weight percent. The height of the wavelength conversion layer 31 (the distance along the Z-axis direction between the first principal plane 10a of the substrate 10 and the upper surface (the wavelength conversion layer upper surface 31u) of the wavelength conversion layer 31) is about 650 μm. The correlated color temperature of combined light of blue light emitted from the LED chips and light emitted from the wavelength conversion layer 31 is about 5000 K. That is, the wavelength conversion layer 31 is adjusted such that white light is obtained. The distance t31 is set to 150 μm. Such a light-emitting device is adopted as a fourth sample.

On the other hand, a light-emitting device in which the concentration of phosphor particles is set to about 8 weight percent is adopted as a fifth sample. In the fifth sample, the distance t31 is set to 500 μm. In the fifth sample, as in the fourth sample, the correlated color temperature of combined light of blue light emitted from the LED chips and light emitted from the wavelength conversion layer 31 is about 5000 K. Conditions other than the concentration of the phosphor particles and the distance t31 are the same as the conditions in the forth sample.

In the fourth sample and the fifth sample, the light-emitting section 40 is joined to the thermal radiation member 51 via the heat conduction layer 52 of solder.

The fourth sample and the fifth sample are lit and the temperature of the wavelength conversion layer 31 is measured. In the fifth sample, the temperature of the surface (the wavelength conversion layer upper surface 31u) of the wavelength conversion layer 31 is 130° C. On the other hand, in the fourth sample, the temperature of the surface (the wavelength conversion layer upper surface 31u) of the wavelength conversion layer 31 is 110° C. Since the distance t31 is properly set in this way, a temperature rise of the wavelength conversion layer 31 can be suppressed.

Figure 17A:
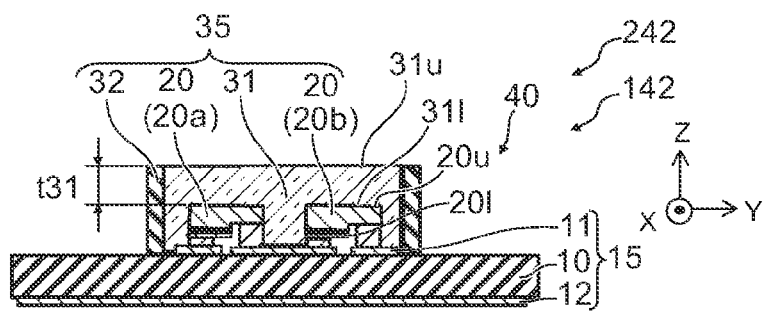
FIGS. 17A to 17C are schematic sectional views illustrating other light-emitting devices and other luminaires according to the seventh embodiment.
Figure 17B:
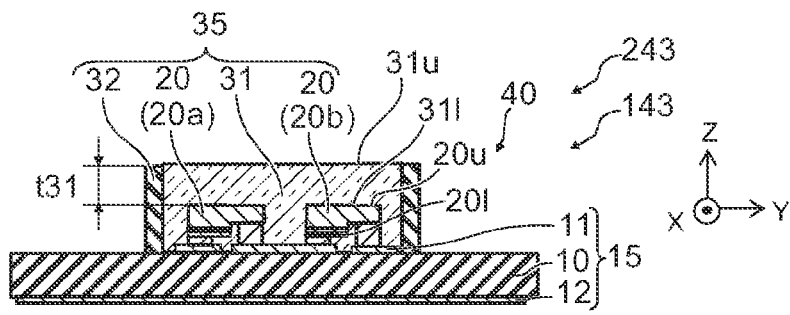
Figure 17C:
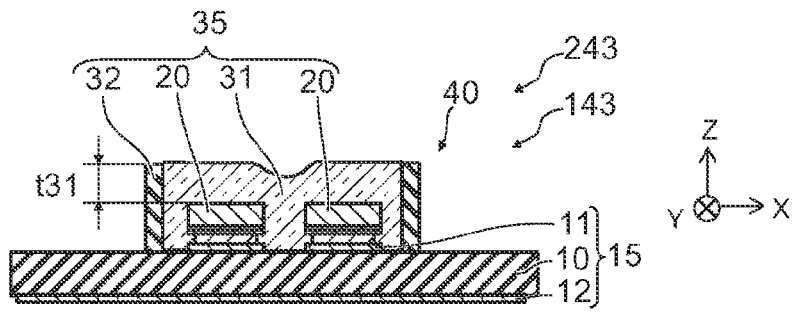

FIGS. 17A to 17C are schematic sectional views illustrating other light-emitting devices and other luminaires according to the seventh embodiment.

As illustrated in FIG. 17A, in another light-emitting device 142 (and another luminaire 242) according to this embodiment, the wavelength conversion layer 31 is not provided between the semiconductor light-emitting elements 20 and the substrate 10. On the other hand, in the light-emitting device 141 (and the luminaire 241), the wavelength conversion layer 31 is provided between the semiconductor light-emitting elements 20 and the substrate 10 as well. Since the wavelength conversion layer 31 is filled in a space between the semiconductor light-emitting elements 20 and the substrate 10, for example, heat conductivity can be improved.

As illustrated in FIGS. 17B and 17C, in another light-emitting device 143 (and another luminaire 243) according to this embodiment, the upper surface (the wavelength conversion layer upper surface 31u) of the wavelength conversion layer 31 is concaves in regions among the plurality of semiconductor light-emitting elements 20. The shape of the concaves is formed, for example, when the wavelength conversion layer 31 flows into a space between the semiconductor light-emitting elements 20 and the mounting substrate section 15. When parts of the upper surface of the wavelength conversion layer 31 are the concaves in this way, the distance to the flat surface of the wavelength conversion layer 31 is the distance t31.

Figure 18A:
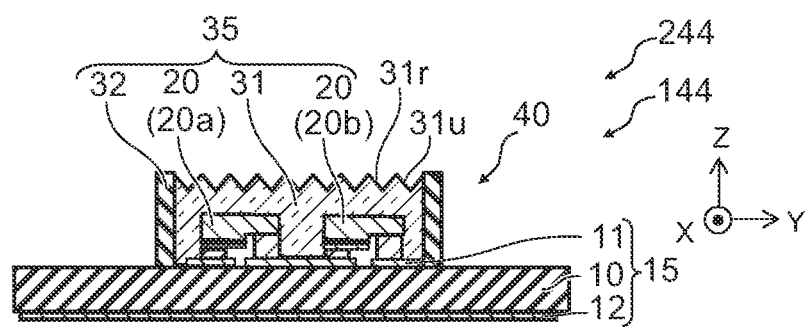
FIGS. 18A to 18C are schematic sectional views illustrating other light-emitting devices and other luminaires according to the seventh embodiment.
Figure 18B:
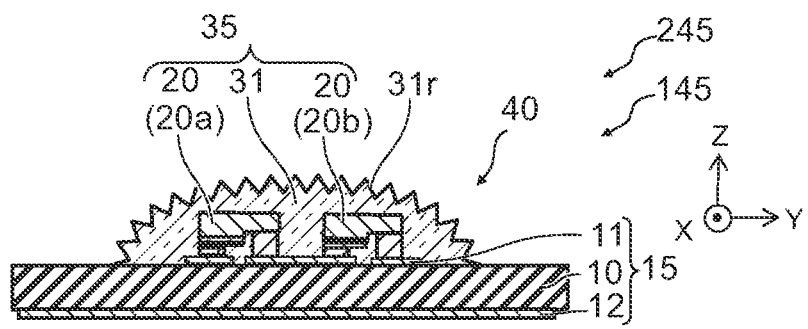
Figure 18C:
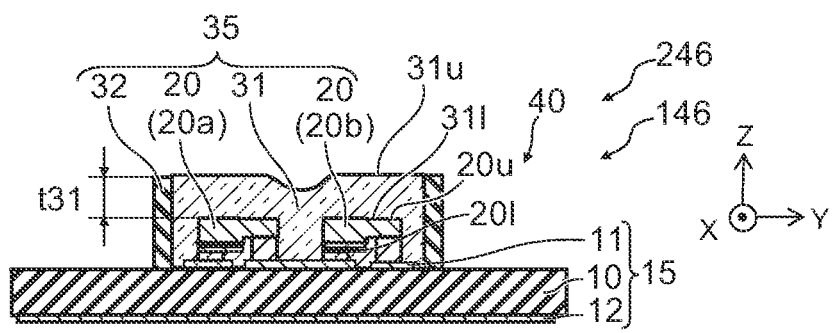

FIGS. 18A to 18C are schematic sectional views illustrating other light-emitting devices and other luminaires according to the seventh embodiment.

As illustrated in FIG. 18A, in another light-emitting device 144 (and another luminaire 244) according to this embodiment, irregularities 31r are provided on the surface (in this example, the wavelength conversion layer upper surface 31u) of the wavelength conversion layer 31. The depth of the irregularities 31r is, for example, equal to or larger than 0.5 times and equal to or smaller than 5 times the wavelength of light emitted from the wavelength conversion layer 31. Light extraction efficiency from the wavelength conversion layer 31 can be improved by the irregularities 31r.

As illustrated in FIG. 18B, in another light-emitting device 145 (and another luminaire 245) according to this embodiment, the surface of the wavelength conversion layer 31 is a semispherical shape that covers the semiconductor light-emitting elements 20. The irregularities 31r are provided on the surface of the wavelength conversion layer 31. Light extraction efficiency from the wavelength conversion layer 31 can be improved by the irregularities 31r.

As illustrated in FIG. 18C, in another light-emitting device 146 (and another luminaire 246) according to this embodiment, the surface (the upper surface) of the wavelength conversion layer 31 is concaves in parts among the plurality of semiconductor light-emitting elements 20. The irregularities 31r are formed by the portions of the concaves. Light extraction efficiency from the wavelength conversion layer 31 can be improved by the irregularities 31r.

The light-emitting devices according to the embodiments explained above can be used as, for example, a luminaire such as a floodlight.

Eighth Embodiment

A light-emitting device is a light source in which light-emitting elements are used. The light-emitting device is used for, for example, lighting and display. Since the light-emitting elements are point light sources, it is known that the light-emitting device has high heat generation density compared with a liner light source of a fluorescent lamp or the like. In recent years, there is a demand for a light-emitting device that emits high-intensity light in a narrow light emission area. Therefore, it is necessary to secure a structure for efficiently allowing heat generated in the light-emitting elements to escape.

As an example for securing the thermal radiation properties, a thermal radiation plate made of metal is sometimes provided on the surface of a substrate on the opposite side of a surface on which the light-emitting elements are mounted. For connection of the substrate and the thermal radiation plate, a metal layer is formed on the rear surface of the substrate and the metal layer and the thermal radiation plate are joined by solder. Consequently, a thermal radiation path capable of transmitting the heat from the light-emitting elements to the thermal radiation plate is formed.

However, when the substrate is ceramic, because of a difference in a coefficient of thermal expansion from the thermal radiation plate made of metal, large stress is applied to the solder and a crack occurs. When the stress is continuously applied, the crack expands and reliability is deteriorated. In an eighth embodiment, a light-emitting device with high reliability is provided.

The eighth embodiment is explained with reference to FIGS. 19, 20, and 21. FIG. 19 is a diagram for explaining a light-emitting device according to the eighth embodiment. FIG. 20 is a diagram for explaining the cross section of the light-emitting device. FIG. 20 is a diagram for explaining the cross section of the light-emitting device. FIG. 21 is a diagram for explaining a state in which members such as light-emitting elements and connectors are removed in the light-emitting device according to the eighth embodiment.

A light-emitting device 380 according to this embodiment is a light-emitting device used for lighting and display. The light-emitting device 380 includes, as a main component, a ceramic substrate 301 formed of a ceramic material such as alumina or alumina nitride, the ceramic material and a composite ceramic material, or the like. The ceramic substrate 301 includes a first surface 311, which is the front surface, and a second surface 312, which is the rear surface. The ceramic substrate 301 includes a pair of first end sides 313 and 314 and second end sides 315 and 316 orthogonal to the first end side 313 and shorter than the first end sides 313 and 314. That is, the ceramic substrate 301 in this embodiment is a thin plate, the shape of the first surface 311 and the second surface 312 of which is a rectangular shape and the thickness of which is equal to or smaller than 1 mm.

The ceramic substrate 301 is configured as a DPC (Direct Plated Copper) substrate. That is, in the ceramic substrate 301, at least a first metal layer 302 and a second metal layer 303 are formed on the first surface 311 and a third metal layer 304 is formed on the second surface 312. The first metal layer 302, the second metal layer 303, and the third metal layer 304 can be formed of the same material. For example, the first metal layer 302, the second metal layer 303, and the third metal layer 304 are formed by superimposing a first plated layer made of copper and having thickness equal to or smaller than 0.1 mm on a titanium oxide layer formed by sputtering. A second plated layer formed of nickel/gold or nickel/palladium/gold may be superimposed on the first plated layer. A total volume of the metal layers formed on the first surface 311 is desirably smaller than a total volume of the metal layer formed on the second surface 312. By adopting such a relation, it is possible to widen a forming region of a solder layer 364 interposed between the ceramic substrate 301 and a thermal radiation plate 310 explained below. Therefore, it is possible to secure a wide thermal radiation route for transmitting heat from light-emitting elements 352, which form a heat generating section, to the thermal radiation plate 310. Therefore, it is possible to improve thermal radiation properties.

A wiring pattern on the first surface 311 of the ceramic substrate 301 is explained in detail with reference to FIG. 21. A first axis passing a center Cc of the ceramic substrate 301 and extending along the first end sides 313 and 314 is represented as X axis. A second axis passing the center Cc and extending along the second end sides 315 and 316 is represented as Y axis. The first metal layer 302 is formed near the second end side 315 on the ceramic substrate 301 to coincide with the X axis. An end of the first metal layer 302 does not reach the second end side 315. In the first metal layer 302, a metal layer for power feed 321 extending along the Y axis and projecting in the direction of the first end side 313 is formed at an end on the second end side 315 side. In the first metal layer 302, a metal layer for inspection 322 projecting in the direction of the first end side 314 along the Y axis is formed between an end on a light-emitting section 305 side and the metal layer for power feed 321. Further, a metal layer for component mounting 323 projecting in the direction of the first end side 313 along the Y axis is formed between the end on the light-emitting section 305 side and the metal layer for inspection 322.

On the other hand, the second metal layer 303 is formed near the second end side 316 on the ceramic substrate 301 to coincide with the X-axis. An end of the first metal layer 302 does not reach the second end side 315. In the second metal layer 303, a metal layer for power feed 331 projecting in the direction of the first end side 313 along the Y axis is formed at an end on the second end side 316 side. In the second metal layer 303, a metal layer for inspection 332 projecting in the direction of the first end side 314 along the Y axis is formed between an end on the light-emitting section 305 side and the metal layer for power feed 331.

The light-emitting section 305 is provided on the first surface 311 of the ceramic substrate 301. The light-emitting section 305 is columnar. The light-emitting section 305 includes a light-emitting surface 351 from which light is emitted. The light-emitting section 305 is arranged such that a center CI thereof substantially coincides with the center Cc of the ceramic substrate 301. That is, in the light-emitting section 305, distances from the corners of the ceramic substrate 301 to the center Cc are substantially the same. Note that "substantially" in this embodiment means that, for example, distances are optimally the same but a difference in a degree of a measurement error, for example, a difference of about 3 mm is permitted.

The light-emitting section 305 includes the light-emitting element 352. The light-emitting element 352 is a light-emitting element of the flip-chip type that generate, for example, blue light. Specifically, a transparent sapphire layer, an n-type semiconductor layer, a light-emitting layer, and a p-type semiconductor layer are superimposed from one side to the other side in order. Electrodes are respectively formed in the n-type semiconductor layer and the p-type semiconductor layer. Electric power is supplied to the n-type semiconductor layer and the p-type semiconductor layer via a pair of electrodes, whereby light is generated in a light-emitting layer located on the lower side of the element. The light is emitted from the sapphire layer. In the light-emitting element 352, one electrode is electrically connected to one end side of the first metal layer 302 and the other electrode is electrically connected to the other end side of the second metal layer 203 by a solder layer 361.

In this embodiment, the light-emitting section 305 includes a plurality of the light-emitting elements 352. For example, ninety-six light-emitting elements 352 are provided. The plurality of light-emitting elements 352 are arranged to be divided into a first section 353 and a second section 354. The first section 353 includes a half number of (e.g., forty-eight) light-emitting elements 352. In the first section 353, the plurality of light-emitting elements 352 are connected in series by a metal layer for element mounting 355 (an inter-element metal layer). In the plurality of light-emitting elements 352, one end of the metal layer for element mounting 355 is connected to the first metal layer 302 and the other end is connected to the second metal layer 303. On a connection side of the first section 353 to the second metal layer 303, a metal layer for component mounting 356 branching from the metal layer for element mounting 355 halfway extends in the direction of the first metal layer 302. For example, two capacitors 371 and 372 are connected between the metal layer for component mounting 356 and the metal layer for component mounting 323 via a metal layer for component mounting 373. The capacitors 371 and 372 are, for example, capacitors for prevention of dark lighting. The plurality of capacitors are provided because, if only one capacitor is provided, the capacitor is large in size, in particular, in height and is likely to block the light generated in the light-emitting section 305. Similarly, the second section 354 includes a half number of (e.g., forty-eight) light-emitting elements 352. In the second section 354, the plurality of light-emitting elements 352 are connected in series by the metal layer for element mounting 355 (the inter-element metal layer). In the plurality of light-emitting elements 352, one end is connected to the first metal layer 302 and the other end is connected to the second metal layer 303.

The light-emitting section 305 includes, for example, a cylindrical wall section 357. The wall section 357 is higher than the light-emitting elements 352 and is formed on the first surface 311 of the ceramic substrate 301 to surround the light-emitting elements 352 in a cylinder of the wall section 357. A part of the light-emitting section 305 is formed to be located on the metal layers (the first metal layer 302 and the second metal layer 303). Since the wall section 357 covers the light-emitting elements 352, the wall section 357 is desired to be formed of a material having high light reflectance. The wall section 357 may include a bank inclining toward the front surface side.

In a space formed by the wall section 357, the ceramic substrate 301, and the like, sealing resin 358 formed of resin such as silicone is filled to cover the light-emitting elements 352. The sealing resin 358 includes a yellowish phosphor material. That is, a part of blue light generated by the light-emitting elements 352 is excited by the phosphor material included in the sealing resin 358 and changes to yellow light. Another part of the blue light generated by the light-emitting elements 352 is directly transmitted through the sealing resin 358. White light formed as a result of mixing of the blue light and the yellow light is emitted from the light-emitting surface 351 of the light-emitting section 305. A total luminous flux with respect to the area of the light-emitting surface 351, a so-called luminous existence is 10 lm/mm$^2$ to 100 lm/mm$^2$. A total luminous flux with respect to total input power is 50 lm/W to 150 lm/W. In this way, the light-emitting device emits high-intensity light in a small light-emission area.

On the other end side of the first metal layer 302, i.e., on the metal layer for power feed 321, a first connector 308 is provided. The first connector 308 is a member for supplying electric power to the light-emitting elements 352. The first connector 308 is connected to a power feed line extended from a lighting device. The first connector 308 includes a metal terminal. The first connector 308 (the metal terminal) is connected to the first metal layer 302 via a solder layer 362. On the other end side of the second metal layer 303, i.e., on the metal layer for power feed 331, a second connector 309 is provided. Like the first connector 308, the second connector 309 includes a metal terminal. The second connector 309 (the metal terminal) is connected to the second metal layer 303 via a solder layer 363. The first connector 308 and the second connector 309 are arranged in positions symmetrical with respect to the Y axis. That is, a distance L31 between the light-emitting section 305 and the first connector 308 and a distance L32 between the light-emitting section 302 and the first connector 308 are substantially the same. The first connector 308 and the second connector 309 are, for example, members that are likely to be heated when heat is transmitted thereto from the light-emitting elements 352, which are heat generation sources, via the first metal layer 302 and the second metal layer 303. Therefore, in order to suppress the heat from inclining to the center Cc of the ceramic substrate 301, the distances L31 and L32 are desirably equal to or larger than 2 mm. On the other hand, in order to prevent the member, which could be heated, from approaching near a start point of a crack to expand the crack, the distance (a shortest distance L33) between an end of the ceramic substrate 301 and the connectors (the first connector 308 and the second connector 309) is desirably equal to or larger than 5 mm. The metal terminals may be covered by an insulating case of resin or the like.

The thermal radiation plate 310 is arranged on the second surface 312 of the ceramic substrate 301. The thermal radiation plate 310 functions as, for example, a heat spreader. The thermal radiation plate 310 is, for example, a metal plate, the thickness of which is equal to or smaller than 5 mm. The thermal radiation plate 310 is connected to the third metal layer 304 to face the second surface 312 of the ceramic substrate 301 via, for example, the solder layer 364.

As explained above, in this embodiment, the light-emitting section 305 is arranged such that the center CI of the light-emitting section 305 substantially coincides with the center Cc of the ceramic substrate 1. The first connector 308 and the second connector 309, which are unipolar connectors, are arranged at both the ends of the light-emitting section 305 to be separated from the light-emitting section 305. Therefore, it is possible to provide a light-emitting device with high reliability. That is, in the light-emitting device in which the ceramic substrate 301 and the thermal radiation plate 310 are connected by the solder layer 364 and that emits high-intensity light in a narrow light emission area, large stress is applied to the solder layer 364 according to a difference in thermal expansion between lighting time and extinguishing time. Therefore, for example, a crack occurs in the solder layer 364. It is likely that the crack selectively expands and leads to deterioration in reliability. In this embodiment, it is possible to suppress the deterioration in reliability.

Figure 22:
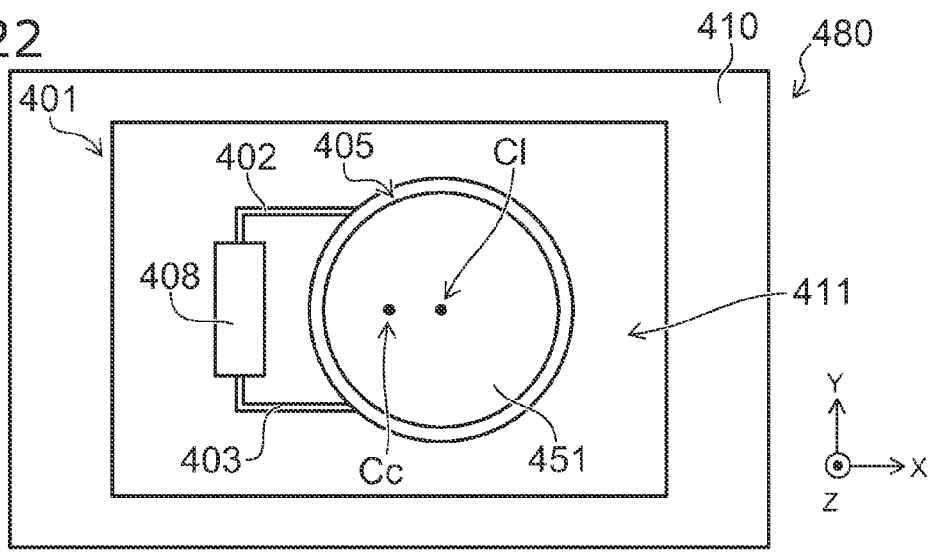
FIG. 22 is a diagram for explaining a light-emitting device in the past.

This is more specifically explained with reference to a light-emitting device in the past. As illustrated in FIG. 22, in a light-emitting device 480, a light-emitting section 405 is arranged in a position deviated from the center on a first surface 411 of a ceramic substrate 401. In the light-emitting device 480, a bipolar connector 408 is arranged. In the light-emitting device 480, it is particularly highly likely that deterioration in reliability occurs. Portions to be heated in the light-emitting device 480 are the light-emitting section 405 including light-emitting elements 452 (not illustrated in the figure), which are heat generation sources, and the connector 408 including an anode connector and a cathode connector to which the heat of the light-emitting section 405 is transmitted via first and second metal layers 402 and 403. When the members that could be heated are arranged to be deviated from the center on the ceramic substrate 401 as illustrated in FIG. 22, a heat distribution becomes uneven. Therefore, a crack occurs, for example, in a solder layer 464 (not illustrated in the figure) near a corner of the ceramic substrate 401. When projected on the X-Y plane, the crack gradually expands in the center direction of the ceramic substrate 401 in the solder layer 464. The expansion of the crack is more conspicuous in a portion where temperature is higher. Therefore, the uneven heat distribution leads to local expansion of the crack. If the crack of the solder layer 464 expands to the rear side of the light-emitting section 405 even partially, in some case, a thermal radiation route from the light-emitting elements 452 to a thermal radiation plate 410 is cut and the light-emitting elements 452 are broken.

Therefore, in the light-emitting device 380 according to the eighth embodiment, the light-emitting section 305 is arranged in the center Cc of the ceramic substrate 301. The unipolar connectors (the first connector 308 and the second connector 309) are arranged at both the ends of the light-emitting section 305 to be separated from the light-emitting section 305. Therefore, the heat generation sources are dispersed and the uneven heat distribution on the ceramic substrate 301 is solved. Local occurrence of a crack can be suppressed. Expansion of a crack can be delayed. Further, the light-emitting section 305 is arranged to be separated from the corner of the ceramic substrate 301, which could be a start point of a crack. Therefore, it is possible to sufficiently delay time when the crack reaches the rear side of the light-emitting section 305. Accordingly, it is possible to provide a light-emitting device with high reliability. The capacitors 371 and 372 are arranged only near the first connector 308. Since heat generation of the capacitors 371 and 372 are not large, such an arrangement of the capacitors is not a major cause of the uneven heat distribution.

The first connector 308 and the second connector 309 are provided to be symmetrical to each other with respect to the Y axis. Therefore, the heat distribution is equalized and the reliability is further improved. The plurality of light-emitting elements 352 are provided to be symmetrical to one another with respect to the X axis and the Y axis. Therefore, the heat distribution is equalized and the reliability is further improved. Further, the first connector 308 and the second connector 309 are connected to the first metal layer 302 and the second metal layer 303 such that the longitudinal direction of the first connector 308 and the second connector 309 extends along the Y axis. Therefore, the reliability is further improved.

Ninth Embodiment

Figure 23:
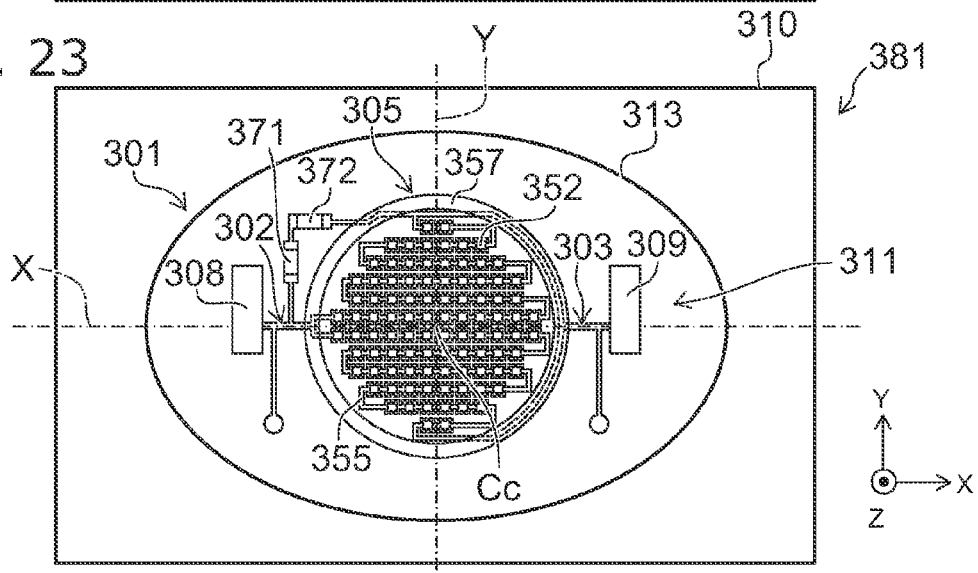
FIG. 23 is a diagram for explaining a light-emitting device according to a ninth embodiment.

FIG. 23 is a diagram for explaining a light-emitting device according to a ninth embodiment. Sections in the ninth embodiment same as the sections in the eighth embodiment are denoted by the same reference numerals and signs and explanation of the sections is omitted.

In a light-emitting device 381 according to this embodiment, the shape of the first surface 311 of the ceramic substrate 301 is an elliptical shape. The center CI of the light-emitting section 305, the first connector 308, and the second connector 309 are arranged on the X axis passing the center Cc of the ceramic substrate 301, extending along the end sides of the thermal radiation plate 310, and passing a portion where the width of the ceramic substrate 301 is the largest.

In the ninth embodiment, as in the eighth embodiment, an uneven heat distribution is equalized. Therefore, it is possible to provide a light-emitting device with high reliability.

Tenth Embodiment

Figure 24:
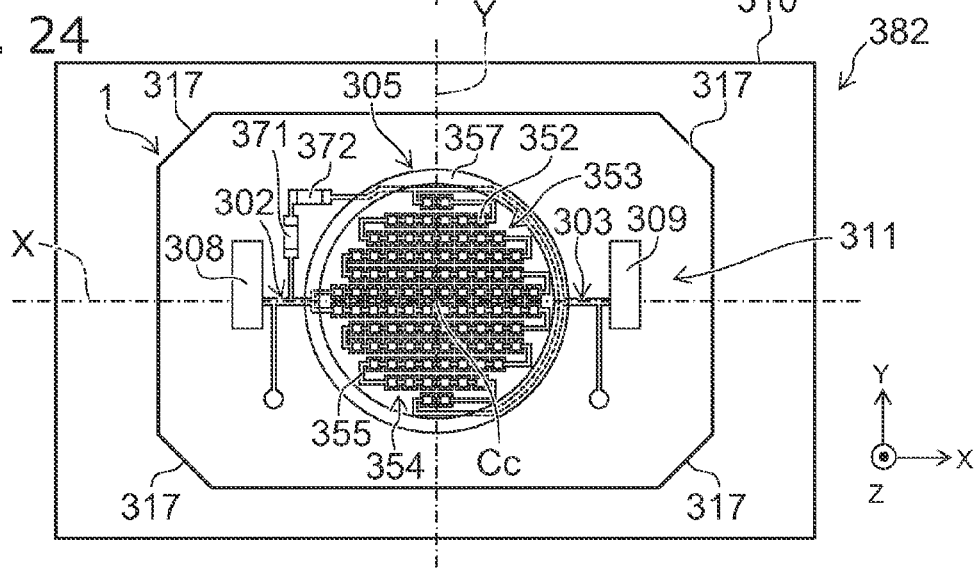
FIG. 24 is a diagram for explaining a light-emitting device according to a tenth embodiment.

FIG. 24 is a diagram for explaining a light-emitting device according to a tenth embodiment.

In a light-emitting device 382 according to this embodiment, the shape of the first surface 311 of the ceramic substrate 301 is a polygonal shape. The ceramic substrate 301 is formed in a polygonal shape by, for example, providing cut-out sections 317 obliquely at the four corners of the rectangular ceramic substrate 301. The center CI of the light-emitting section 305, the first connector 308, and the second connector 309 are arranged on the X axis passing the center Cc of the ceramic substrate 301, extending along the end sides of the thermal radiation plate 310, and passing a portion where the width of the ceramic substrate 301 is the largest.

In the tenth embodiment, as in the eighth embodiment, an uneven heat distribution is equalized. Therefore, it is possible to provide a light-emitting device with high reliability.

The present invention is not limited to the embodiments explained above. Various modifications are possible.

For example, the light-emitting section 305 is not limited to the columnar shape and may be an elliptic columnar shape or a polygonal columnar shape.

The light-emitting element 352 is not limited to the light-emitting element of the flip-chip type and may be a light-emitting element of a face-up type electrically connected using a boning wire.

Figure 25:
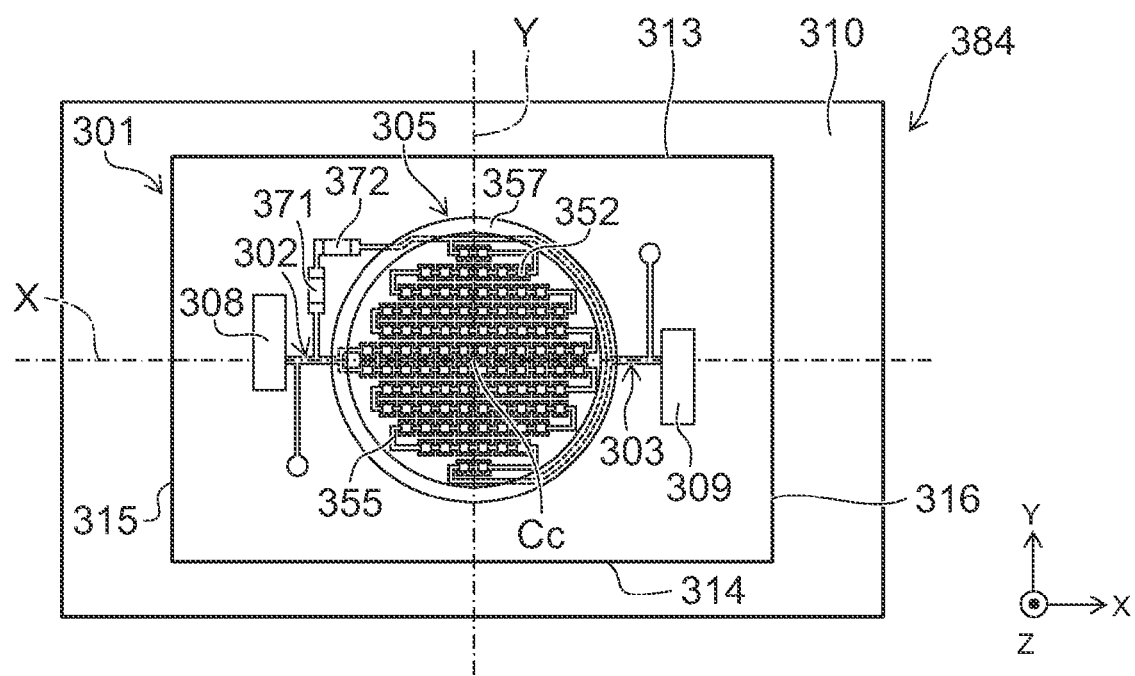
FIG. 25 is a diagram for explaining a light-emitting device according to another embodiment.

As in the light-emitting device 384 illustrated in FIG. 25, the first connector 308 and the second connector 309 may be arranged to be symmetrical to each other with respect to the center Cc of the ceramic substrate 301. The same applies to patterns in parts of the first metal layer 302 and the second metal layer 303.

According to another embodiment, there is provided a light-emitting device including a ceramic substrate, a first metal layer, a second metal layer, a third metal layer, a light-emitting section, a first connector, a second connector, and a thermal radiation plate. The ceramic substrate includes a first surface and a second surface. The ceramic substrate is circular or polygonal. The first metal layer and the second metal layer are formed on the first surface. The third metal layer is formed on the second surface. The light-emitting section includes a light-emitting element, one end of which is electrically connected to one end side of the first metal layer and the other end of which is electrically connected to one end side of the second metal layer. The first connector is provided on the other end side of the first metal layer. The second connector is provided on the other end side of the second metal layer. The thermal radiation plate is made of metal. The thermal radiation plate is connected to the third metal layer to be opposed to the ceramic substrate via a solder layer. When an axis passing the center of the ceramic substrate and passing a portion having largest width of the ceramic substrate is represented as first axis and an axis passing the center of the ceramic substrate and orthogonal to the first axis is represented as second axis, the light-emitting section is arranged such that the center of the light-emitting section substantially coincides with the center of the ceramic substrate. The center of the light-emitting section, the first connector, and the second connector are arranged on the first axis. The first connector and the second connector are arranged to hold the light-emitting section therebetween.

According to the embodiments, a light-emitting device and a luminaire with improved thermal radiation properties are provided.

In this specification, "vertical" and "parallel" do not always mean "strictly vertical" and "strictly parallel" and allow, for example, fluctuation in a manufacturing process. "Substantially vertical" and "substantially parallel" are sufficient.

The embodiments are explained above with reference to the specific examples. However, the embodiments are not limited to the specific examples. For example, specific configurations of the components such as the light-emitting section, the mounting substrate section, the light-emitting element section, the substrate, the first metal layer, the second metal layer, the semiconductor light-emitting element, the wavelength conversion layer, the reflecting layer, the thermal radiation member, the heat conduction layer, the light reflecting resin layer, the ceramic substrate, the first metal layer, the second metal layer, the third metal layer, the first connector, the second connector, the thermal radiation plate, the wall section, the inter-element metal layer, and the sealing resin included in the light-emitting device and the luminaire member, the luminaire connecting member, the base section, and the reflecting section included in the luminaire are included in the scope of the invention as long as those skilled in the art can carry out the invention in the same manner and obtain the same effects by selecting the configurations as appropriate from the publicly-known range.

Components obtained by combining any two or more components among the components in the specific examples in a technically possible range are also included in the scope of the invention as long as the components imply the gist of the invention.

Besides, all light-emitting devices and luminaires that those skilled in the art can carry out by changing designs as appropriate on the basis of the light-emitting devices and the luminaires explained above as the embodiments also belong to the scope of the invention as long as the light-emitting devices and the luminaires imply the gist of the invention.

Further, in the category of the idea of the invention, those skilled in the art can arrive at various alternations and modifications. It is understood that the alternations and the modifications also belong to the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light-emitting device comprising:
a light-emitting section including:
an insulative substrate including a first principal plane and a second principal plane on an opposite side of the first principal plane, the first principal plane including a mounting region and a peripheral region provided around the mounting region;
a first metal layer provided on the first principal plane and including a plurality of mounting patterns provided in the mounting region; and
a second metal layer provided on the second principal plane and electrically insulated from the first metal layer, at least a part of the second metal layer overlapping the mounting region when projected on a first plane parallel to the first principal plane;
a light-emitting element section including:
a plurality of semiconductor light-emitting elements provided on the mounting region, each of the plurality of semiconductor light-emitting elements being electrically connected to any one mounting pattern among the plurality of mounting patterns and another one mounting pattern adjacent to the mounting pattern among the plurality of mounting patterns; and
a wavelength conversion layer provided on the mounting region and on at least parts of the plurality of semiconductor light-emitting elements, the wavelength conversion layer being not provided on the peripheral region, the wavelength conversion layer absorbing at least a part of first light emitted from the plurality of semiconductor light-emitting elements, and emitting second light having a wavelength different from a wavelength of the first light,
a ratio of a luminous flux of light emitted from the light-emitting element section to a light emission area of the mounting region being equal to or higher than 10 lm/mm$^2$ and equal to or lower than 100 lm/mm$^2$;
a thermal radiation member opposed to the second principal plane and having an area equal to or larger than five times an area of the mounting region when projected on the first plane; and
a heat conduction layer provided between the thermal radiation member and the second metal layer.

2. The device according to claim 1, wherein
an area of the peripheral region is equal to or larger than four times the area of the mounting region.

3. The device according to claim 1, wherein a distance between an end of the first principal plane and the mounting region extending along a direction parallel to the first principal plane and passing a center of the mounting region is equal to or larger than ½ of width of the mounting region extending along the direction passing the center.

4. The device according to claim 1, wherein:
the first metal layer further includes:
an electrode section for first connector connected to one of the plurality of mounting patterns; and
an electrode section for second connector connected to another one of the plurality of mounting patterns different from the one mounting pattern,
the light-emitting section further includes:
a first connector provided on the first principal plane and electrically connected to the electrode section for first connector; and
a second connector provided on the first principal plane and electrically connected to the electrode section for second connector, and
the light-emitting element section is arranged between the first connector and the second connector.

5. The device according to claim 1, wherein:
the wavelength conversion layer includes:
a plurality of wavelength conversion particles configured to absorb at least a part of the first light and emit the second light; and
light transmissive resin in which the plurality of wavelength conversion particles are dispersed, and
Shore A of the light transmissive resin is equal to or higher than 15 and equal to or lower than 50.

6. The device according to claim 1, wherein:
each of the plurality of semiconductor light-emitting elements includes:
a first semiconductor layer of a first conduction type including a first semiconductor portion and a second semiconductor portion arranged side by side with the first semiconductor portion in a direction crossing a superimposing direction extending from the thermal radiation member to the light-emitting section;
a second semiconductor layer of a second conduction type provided between the second semiconductor portion and the mounting substrate section; and
a light-emitting layer provided between the second semiconductor portion and the second semiconductor layer, and
the light-emitting element section further includes:
a first joining metal member provided between the first semiconductor portion and any one of the mounting patterns; and
a second joining metal member provided between the second semiconductor layer and another one of the mounting patterns.

7. The device according to claim 1, wherein an area of the second metal layer projected on the first plane is larger than 80% of the area of the mounting region.

8. The device according to claim 1, wherein an area of the second metal layer projected on the first plane is equal to or larger than 95% of an area of the second principal plane.

9. The device according to claim 1, wherein:
a plurality of the light-emitting sections are provided, and
the heat conduction layer is arranged between the plurality of the light-emitting sections and the thermal radiation member.

10. The device according to claim 1, further comprising a light reflective and insulative light reflecting resin layer, wherein:
a plurality of the light-emitting sections are provided,
a substrate of one light-emitting section among the plurality of light-emitting sections includes a first side surface crossing the first principal plane,
a substrate of another light-emitting section arranged side by side with the one light-emitting section among the plurality of light-emitting sections in a surface parallel to the first principal plane includes a second side surface crossing the first principal plane and opposed to the first side surface, and
the light reflecting resin layer covers at least a part of the first side surface and covers at least a part of the second side surface.

11. The device according to claim 10, wherein a thickness of the thermal radiation member is equal to or larger than 0.06 times and equal to or smaller than 0.12 times a length, in a direction parallel to the first principal plane, of a region of the thermal radiation member where the mounting substrate section is provided.

12. The device according to claim 1, wherein a first surface of the thermal radiation member opposed to the second principal plane has irregularities.

13. The device according to claim 12, wherein a concave portion of the irregularities of the first surface includes a thermal radiation member bottom surface portion, a thermal radiation member side surface portion crossing the second principal plane, and a curved surface-shaped thermal radiation member corner portion that connects the thermal radiation member bottom surface portion and the thermal radiation member side surface portion.

14. The device according to claim 1, wherein a distance in a direction perpendicular to the first principal plane between an upper surface of any one of the plurality of semiconductor light-emitting elements and an upper surface of the wavelength conversion layer is equal to or larger than 100 micrometers and equal to or smaller than 300 micrometers.

15. The device according to claim 1, wherein:
a center of the mounting region is provided to substantially coincide with a center of the substrate,
an area of the second metal layer projected on the first plane is equal to or larger than 95% of an area of the second principal plane, and
the heat conduction layer includes a solder.

16. The device according to claim 1, wherein:
each of the mounting patterns includes:
a first mounting portion having a first width along a traverse direction,
a second mounting portion having a second width along a traverse direction, and
a third mounting portion provided between the first mounting portion and the second mounting portion, the third mounting portion connecting the first mounting portion and the second mounting portion, the third mounting portion having a third width along a traverse direction, the third width being smaller than the second width and smaller than the second width,
the traverse direction is perpendicular to a direction extending from the first mounting portion to the second mounting portion,
a width of one of the semiconductor light-emitting elements is wider than the first width and wider than the second width, and
the one of the semiconductor light-emitting elements covers one of the first mounting portion of one of the mounting patterns and covers one of the second mounting portion of another one of the mounting patterns.

* * * * *